United States Patent [19]
Okamoto et al.

[11] Patent Number: 5,691,115
[45] Date of Patent: *Nov. 25, 1997

[54] EXPOSURE METHOD, ALIGNER, AND METHOD OF MANUFACTURING SEMICONDUCTOR INTEGRATED CIRCUIT DEVICES

[75] Inventors: Yoshihiko Okamoto, Kodaira; Tsuneo Terasawa, Ome; Akira Imai, Hachioji; Norio Hasegawa, Hinode-machi; Shinji Okazaki, Urawa, all of Japan

[73] Assignee: Hitachi, Ltd., Tokyo, Japan

[*] Notice: The term of this patent shall not extend beyond the expiration date of Pat. No. 5,521,033.

[21] Appl. No.: 546,313

[22] Filed: Oct. 20, 1995

Related U.S. Application Data

[63] Continuation-in-part of Ser. No. 397,355, Mar. 2, 1995, Pat. No. 5,521,033, which is a continuation of Ser. No. 897,455, Jun. 10, 1992, Pat. No. 5,418,092.

[30] Foreign Application Priority Data

| | | | |
|---|---|---|---|
| Oct. 26, 1994 | [JP] | Japan | 6-262938 |
| Mar. 3, 1995 | [JP] | Japan | 7-43861 |
| Aug. 31, 1995 | [JP] | Japan | 7-223727 |

[51] Int. Cl.$^6$ .................................. G03C 5/00
[52] U.S. Cl. .............................. 430/311; 430/315
[58] Field of Search ............... 430/311, 312, 430/315, 394, 397

[56] References Cited

U.S. PATENT DOCUMENTS

| | | | |
|---|---|---|---|
| 5,045,417 | 9/1991 | Okamoto | 430/5 |
| 5,248,575 | 9/1993 | Ogoshi | 430/5 |

FOREIGN PATENT DOCUMENTS

| | | |
|---|---|---|
| 58-173744 | 12/1983 | Japan . |
| 62-67513 | 3/1987 | Japan . |
| 62-67514 | 3/1987 | Japan . |
| 62-50811 | 10/1987 | Japan . |
| 62-59296 | 12/1987 | Japan . |
| 2-140743 | 5/1990 | Japan . |
| 2-247647 | 10/1990 | Japan . |
| 3-156458 | 7/1991 | Japan . |
| 3-270213 | 12/1991 | Japan . |

*Primary Examiner*—S. Rosasco
*Attorney, Agent, or Firm*—Antonelli, Terry, Stout & Kraus, LLP.

[57] ABSTRACT

To prevent positional shifts of the image forming plane during the exposure process using the two-layer phase shift mask, the height position of the semiconductor wafer 14 is moved in the optical axis direction according to the mask substrate thickness of the second component mask 12b, prior to performing the exposure process which uses the stacked-layer mask 12 that comprises a first component mask 12a formed with a pattern of light-shielding areas and light-transmitting areas and a second component mask 12b formed with a phase shift pattern to produce a phase shift in the transmitted light.

15 Claims, 33 Drawing Sheets

EXPOSURE METHOD, ALIGNER, AND METHOD OF MANUFACTURING SEMICONDUCTOR INTEGRATED CIRCUIT DEVICES

This application is a continuation-in-part application of Ser. No. 08/397,355, filed Mar. 2, 1995, the contents of which are incorporated herein by reference in their entirety, which application Ser. No. 08/397,355, now U.S. Pat. No. 5,521,033 is a continuation of application Ser. No. 07/897, 455, filed Jun. 10, 1992, now U.S. Pat. No. 5,418,092, issued May 23, 1995, the contents of which are incorporated herein by reference in their entirety.

BACKGROUND OF THE INVENTION

The present invention relates to a photolithography to transfer a microfine pattern onto a specimen substrate to form semiconductor integrated circuits and liquid crystal display panels, and more particularly to an exposure method, an aligner and a method of manufacturing semiconductor integrated circuits, which use a mask to control the phase of light for exposure.

Pattern forming for the semiconductor integrated circuits and liquid crystal display panels commonly uses a lithography technology, a method of transferring a pattern formed on a mask onto a substrate by exposure. This pattern transfer is generally performed by a reduction projection type projection aligner that reduces and transfers the pattern formed on the mask.

As the patterns have become increasingly fine in recent years, the design rules of circuit devices and wiring have been decreasing rapidly, for example, down to less than 0.5 μm. The projection aligner are thus required of a higher resolution than ever.

When, as a result of enhanced integration of semiconductor integrated circuits, the design rules of circuit devices and wiring are of the order of submicrons, however, the photolithography process, that uses light such as g and i beams to transfer a semiconductor integrated circuit pattern onto the semiconductor wafer, poses a serious problem of deteriorated precision of circuit pattern transfer.

Consider a case where a light-shielding area is adjoined by light-transmissive areas on both sides thereof. Because the beams of light that pass these light-transmissive areas are in phase, these light beams that have passed through the light-transmissive areas interfere with and intensify each other at the transfer position of the light-shielding area, with the result that the contrast of a projected image on the semiconductor wafer decreases and the focus depth becomes shallow. This in turn reduces the pattern transfer precision significantly, making the transfer of microfine circuit patterns difficult.

To cope with this situation, a technology is available which increases the numerical aperture (NA) of an optical system of an aligner while leaving the wavelength of light as is to improve the resolution. Generally, the greater the numerical aperture of the projection lens or the shorter the wavelength of light used for exposure, the better the resolving power. The method of increasing the NA, however, Gives rise to a problem of lowering the focus depth during pattern transfer.

Efforts have been made to shorten the wavelength of exposure light, from g and i beams generated from a mercury lamp to an excimer laser beam. Shortening the wavelength further below the excimer laser, however, poses a problem of raising various restrictions in terms of light source, optical system material or resist material.

Because of these restrictions, a variety of exposure technologies are being studied which use the existing projection aligner and improve the resolution while securing the focus depth. One such representative means currently proposed is a phase shift technology that manipulates the phase of light passing through the mask in the exposure process to improve the contrast of a projected image.

Japan Patent Publication No. 59296/1987, for example, discloses a phase shift technology, in which a transparent film is provided at one of paired light-transmissive areas adjoining a light-shielding area on both sides to cause a phase difference between beams of light that have passed through the two light-transmissive areas during the exposure process so that the interfering beams weaken each other at a light-shielding area on the semiconductor wafer.

Another example is Japan Patent Publication No. 50811/1987, which discloses a method in which a transparent member (phase shifter) for inverting the phase of light is provided at a particular light-transmissive area on the mask to utilize interference between beams of light. This method makes significant improvements on the resolution, particularly, for patterns that have a periodicity.

Still another method is Japan Patent Laid-Open No. 67514/1987, which discloses a method in which an auxiliary pattern, fine openings, is provided to the periphery of an isolated, fine main pattern formed in the light-shielding area of the mask to produce a phase difference between these two patterns. This mask prevents expansion of the main pattern image by the presence of the auxiliary pattern to improve the resolution of the isolated pattern.

Further, Japan Patent Laid-Open No. 140743/1990 discloses a phase shift technology, in which a phase shifter is provided at a part of the light-transmissive area of the mask to generate a phase difference between the transmitting beams and thereby emphasize the boundary of the phase shifter.

Furthermore, Japan Patent Laid-Open No. 270213/1991 discloses a method, in which two beams of light that have passed through different parts of a mask formed with a pattern of light-transmissive and light-shielding areas are made to be in reverse phase with each other immediately after they passed through the mask and in which these two beams are then synthesized and irradiated against the specimen to improve the contrast of the projected image.

SUMMARY OF THE INVENTION

This inventor, however, has found that the above-mentioned shift technologies pose the following problems.

In the conventional technology in which a transparent film is provided to a part of the light-transmissive area of the mask to produce a phase difference between a light beam passing through the transparent film and the one passing through the light-transmissive area without a transparent film, because adhesion of foreign matters and occurrence of flaws are not tolerated with the actual mask, the manufacture of a mask has many limitations and takes a great deal of time and labor.

When a mask disclosed in Japan Patent Publication No. 50811/1987 is used, the transfer of a pattern in excess of the conventional resolution limit can be easily realized, particularly with microfine patterns having periodicity. The technology that produces a phase difference between a light beam passing through the shifter and the one passing through a light-transmissive area without a shifter by providing a phase shifter to a part of the light-transmissive area of the same mask, however, requires an enormous amount of time and labor in the mask fabrication. That is, such a technology has a problem that it must form both a light-transmitting pattern and a phase shifter pattern on the same mask and avoid adhesion of foreign matters and flaws on either pattern, making inspection and correction of the mask very complicated.

The mask disclosed in Japan Patent Laid-Open No. 67514/1987 exhibits an excellent performance in the transfer of isolated microfine patterns. This publication, however, does not describe measures to deal with the mask inspections and to prevent the deterioration of projected images due to mask structure such as thickness of light-shielding film.

To eliminate such a problem, we may use a method which involves forming on separate masks an exposure light transmitting or shielding pattern and a phase shifter pattern for producing a phase difference and then putting the two masks close to each other or stacking them together in the exposure process. This method offers masks that avoid complexity experienced in forming the light-shielding pattern and the phase shifter pattern on the same mask and which facilitate the flaw inspection and correction.

Because the exposure light transmitting or shielding pattern and the phase shifter pattern are formed on separate masks, the mask fabrication including inspection and correction can be made easy. With this technology, however, it is not clear whether the ease of mask fabrication is maintained when the thickness of the light shielding film can no longer be ignored as the pattern miniaturization advances.

Another disadvantage of this method is that because a single phase shift mask is formed by physically stacking two masks of a certain thickness, the image plane position of an image to be transferred on the semiconductor wafer may shift from the originally intended position of the image plane, failing to produce a clear image. Hence, it may not be appropriate to combine the two-layer mask with the conventional ordinary mask in the semiconductor device manufacturing process.

The manufacture of ordinary semiconductor integrated circuit devices uses a phase shift mask made up of two masks or a conventional single mask according to the dimensions of a pattern to be transferred. In this case, a transparent glass, a second mask substrate, may or may not exist between the mask pattern surface formed with openings and the projection lens, with the result that a spherical aberration occurs in the projection optical system. It is considered possible to perform a highly accurate pattern transfer by correcting the spherical aberration.

This is detailed in the following by referring to the drawings.

The phase shifter has conventionally used a spin-on-glass. It is formed as shown in FIGS. 54(a) to (e). First, a conventional mask is fabricated which has an opening pattern formed in a light-shielding film 601 such as chrome (Cr) on a glass substrate 600. Next, the wafer is then applied over its entire surface with an SOG 602 that constitutes a phase shifter, and then deposited with a resist 603. A shifter pattern is exposed onto the resist 603, which is then developed. After this, areas 604-1, 604-2 of the resist 603 are removed. With this resist as a mask, the SOG is etched to form a final shifter pattern 605, 606.

This mask is used with the pattern side facing down, as shown in FIG. 55(a). To obtain a structure shown in FIG. 55(b), another method involves forming a shifter pattern 606 on the glass substrate 600, then vapor-depositing a light-shielding film (Cr) and a resist film, exposing a pattern, and etching the light-shielding film.

In either case, the light-shielding film is about 0.1 μm thick and the thickness of the phase shifter d is $d=\lambda/2(n-1)$ that gives a phase difference of 180 degrees, where $\lambda$ is a wavelength of light and n is a refractivity of the shifter. If, for example, exposure light is an i beam ($\lambda=0.365$ μm), the value of d is almost 0.4 μm.

With significant miniaturization of the pattern in recent years, the pattern dimension is already on the order of submicron even with masks five times larger, so that the thickness of the light-shielding film can no longer be ignored when compared with the dimension of the pattern openings. As a result, the change in thickness of SOG film shown in FIG. 54(e) becomes relatively large. In other words, there is a problem that, in the opening, the ratio of an area in which the SOG film thickness changes increases and that a change in opening dimension result in a change in the average film thickness, making it impossible to produce a desired phase difference.

In FIG. 54(e), for example, the thickness of the shifter pattern 605 is greater than that of the shifter pattern 606. This causes a phase error as mentioned above. On the other hand, in a mask in which the phase shifter 606 is interposed between the glass substrate and the light-shielding film as shown in FIG. 55(b), such shifter film thickness changes are not likely to occur.

Detailed calculation of projection image on the semiconductor wafer surface has found, as seen from the result of calculation of light intensity distributions 700, 701 of FIGS. 56(a) and 56(b), that in a mask having the phase shifter put between the glass substrate and the light-shielding film, reduction in light intensity occurs in areas corresponding to the openings from which the phase shifter was removed even when there is no error in the phase shifter film thickness. To prevent this light intensity reduction, it is found that the edges of the shifter pattern 606 need to be retracted from the edges of the light-shielding film 601, as shown in FIG. 56(c). A curve 703 of FIG. 57(c) is obtained by determining projected image light intensities I1, I2 at the centers of adjacent openings from the light intensity distribution 702 and by calculating the difference between the two light intensities as the function of the edge retraction d of the shifter pattern 606.

It is seen that setting the edge retraction d to almost half the shielded light width w can reduce the difference between the projected image light intensities I1, I2 to a sufficiently small value. The structure of FIG. 56(c), however, has a problem that the edge portion of the light-shielding film is not firmly supported, and thus is not practicable.

It is also found that a transfer pattern is failed by temperature changes in two stacked masks during exposure. That is, of the two stacked masks, the mask formed with the light-shielding film rises in temperature by light energy applied during the exposure process, producing a temperature difference between the mask with the light-shielding film and the mask without it. This in turn deforms the two masks, preventing the pattern on the masks from being transferred correctly.

The present invention has been accomplished under the above circumstances and its object is to provide a phase shift exposure technology that has overcome the above-mentioned problems.

In more concrete terms, a first objective is to provide a highly reliable exposure method that uses an easily manufactured phase shift mask made up of a combination of two masks.

Another objective of this invention is to provide an exposure method that uses a phase shift mask with little projected image deterioration and which is suited for exposing microfine patterns of the order of deep submicrons.

Still another objective of this invention is to provide an aligner that can mount the above-mentioned shift mask.

A further objective of this invention is to provide a technology that can prevent the positional shift of an image plane during the exposure process using a mask made up of two stacked masks.

A further objective of this invention is to provide a technology that can prevent the stacked masks from being deformed during the exposure process using a mask made up of two stacked masks.

These and other objectives and novel features of this invention will become apparent from the following descriptions and the accompanying drawings.

Representative aspects of the invention may be briefly summarized as follows.

In the exposure method of this invention, the mask written with a pattern to be transferred comprises a first mask having a recess-and-bulge pattern to give a specified phase difference to light beams passing through this pattern and a second mask having a pattern defined by light-shielding areas and opening areas. These two component masks are put together with the pattern sides facing each other in such a way that light passing through stepped portions, boundaries between the recessed and raised portions of the first mask, is blocked by the light-shielding areas of the second mask and that light passing through the second mask is the one that has passed through an area remote from the stepped portions at the boundaries between the recessed and raised portions of the first mask.

The exposure method of this invention transfers a specified pattern onto a specimen by utilizing interference of beams of light that have passed through a two-layer mask, which consists of a first component mask formed with a pattern of light-shielding areas and light-transmitting areas and a second component mask formed with a phase shift pattern to produce a phase difference in the passing light beams, with the sides of these masks formed with patterns facing each other and with these masks put close to or in contact with each other. The exposure method has a process of moving, prior to the transfer of the specified pattern, the height position of the specimen or of the two-layer mask in the direction of optical axis according to the mask substrate thickness of whichever of the first and second component masks is closer to the specimen.

The aligner of this invention comprises a mask holding means to secure at a specified position a mask written with an original pattern, a specimen substrate holding means to mount the specimen substrate, an illuminating means to radiate light from a light source onto the mask, and a projection optical system to project the pattern of the mask onto the specimen substrate. This aligner has a means to correct spherical aberration resulting from the presence of a transparent substrate at least at one location in the projection optical system from the mask pattern surface to the specimen substrate surface.

The method of manufacturing a semiconductor integrated circuit device according to this invention includes the following processes in exposing and transferring a specified semiconductor integrated circuit pattern onto the semiconductor wafer.

(a) A process of transferring a specified semiconductor integrated circuit pattern onto the semiconductor wafer by utilizing interference of beams of light that have passed through a stacked-layer mask, which comprises a first component mask formed with a pattern of light-shielding areas and light-transmitting areas and a second component mask formed with a phase shift pattern to produce a phase difference between the transmitted light beams, with the sides formed with the patterns facing each other and put close to or in contact with each other.

(b) In the exposure process using the stacked-layer mask, a process of moving, prior to the transfer of the specified semiconductor integrated circuit pattern, the height position of the semiconductor wafer or of the stacked-layer mask in a direction of optical axis according to the mask substrate thickness of the first or second component mask, whichever is closer to the semiconductor wafer.

(c) A process of transferring the specified semiconductor integrated circuit pattern onto the semiconductor wafer by using interference of light beams that have passed through an ordinary mask consisting of light-shielding areas and light-transmitting areas and formed with the same pattern as the desired transfer pattern.

(d) In the exposure process using the ordinary mask, a process of moving, prior to the transfer of the specified semiconductor integrated circuit pattern, the height position of the semiconductor wafer or of the ordinary mask to the position of an image plane for the ordinary mask.

The method of manufacturing the semiconductor integrated circuit device according to this invention uses a telecentric lens system as the projection optical system for exposure both on the mask surface side and on the semiconductor wafer—specimen substrate—side.

Further, in the process of exposure, the method of manufacturing the semiconductor integrated circuit device according to this invention uses a stacked-layer mask having an anti-reflective film—which prevents reflection of a transmitted light beam—for at least one of the first and second masks.

As detailed in the following, the exposure method of this invention uses, in exposing the specimen substrate with the mask-transmitted light, a mask which is a stack of a first component mask to give a phase difference to the exposure light beams and a second component mask having light-shielding areas and light-transmitting areas.

By positioning the stepped portions between the recessed and raised portions of the first mask to correspond to the light-shielding areas of the second mask, the edges of the phase shift portion are retracted from the edges of the openings in the light-shielding film, reducing the phase errors in individual pattern openings and in the entire mask surface. This in turn improves the performance of the pattern transfer. The presence of the second mask substrate solves the problem that the holding of the edge portions of the light-shielding film is unstable when the mask is formed of only one component mask. Further, because the pattern forming surface is sandwiched between two mask substrates, if dust or foreign matters adhere to the surface of the stacked-layer mask, their focus positions get shifted and are unlikely to be transferred.

According to the above exposure method of the invention, because, prior to the transfer of the specified pattern, the height position of the specimen or of the mask is moved in the direction of optical axis according to the mask substrate thickness of whichever of the first and second component masks is closer to the specimen, it is possible to correct the positional deviation of the image plane on the specimen onto which an image is to be transferred, allowing a clear image to be formed on the specimen.

In the aligner of this invention, because a means to correct spherical aberration resulting from the presence of a transparent substrate is provided at least at one location in the projection optical system from the mask pattern surface to the specimen substrate surface, it is possible to keep the pattern surface of the mask and the surface of the specimen substrate in a correct image forming relationship. That is, the aligner of this invention performs an optimum design of the projection lens assuming the use of a phase shift mask made up of a first and second component masks and utilizes light interference for pattern transfer. When a single mask is used as in a conventional case, a transparent parallel plate is inserted between the mask and the projection lens as a means to correct the spherical aberration caused by the absence of the second mask. That is, the transfer of microfine patterns uses a phase shift mask formed of the first and second component masks. For the transfer of patterns not so fine, the conventional mask can be used to form a pattern on the specimen substrate. It is therefore possible to manufacture optimal semiconductor integrated circuit devices.

According to the above manufacture method of the semiconductor integrated circuit devices, the image plane can be set at an optimal position according to whether the mask used is a stacked-layer mask or an ordinary mask. Hence, the manufacture of the semiconductor integrated circuit device can use both a stacked-layer mask and an ordinary mask in the exposure process.

According to the above manufacture method of the semiconductor integrated circuit devices, the projection optical system for exposure uses a telecentric lens system both on the mask surface side and on the semiconductor wafer—specimen substrate—side. This in turn prevents the positional errors of the image plane that would otherwise be caused by the in-plane distribution of the mask pattern position and the mask substrate thickness, thus ensuring good pattern transfer by using a stacked-layer mask.

Further, the above manufacture method of the semiconductor integrated circuit devices uses a stacked-layer mask that has provided in at least the first or second component mask an anti-reflective film that prevents reflection of transmitted light. This suppresses the interference phenomenon of reflected beams that occurs between the first component mask and the second component mask, and therefore reduces luminance variations on the semiconductor wafer surface caused by the interference phenomenon.

Other aspects of this invention may be briefly summarized as follows.

The exposure method of this invention transfers a specified pattern onto the specimen by utilizing interference of light beams that have passed through a stacked-layer mask, which comprises a first component mask formed with a pattern of light-shielding areas and light-transmitting areas and a second component mask formed with a phase shift pattern to produce a phase difference in the transmitted light beams, with the pattern forming surfaces of these masks facing each other and put close to or in contact with each other. This exposure method includes a process of moving, prior to the transfer of the specified pattern, the height position of the specimen or of the stacked-layer mask in the direction of optical axis according to the mask substrate thickness of whichever of the first and second component masks is closer to the specimen.

In the exposure method of this invention, the first component mask is formed with a pattern of light-transmitting areas corresponding to an object cyclic pattern to be formed on the specimen or with a light-transmitting area pattern including these, and the second component mask is formed with a phase shift pattern that inverts the phase of the transmitted light and which is located at least at odd- or even-numbered light-transmitting areas in the pattern corresponding to the cyclic object pattern. The phase of the exposure light is inverted at the cycle of the light-transmitting area pattern during the projection and exposure process.

Further, the exposure method of this invention includes a process of preparing a mask written with an original pattern, a process of preparing a specimen substrate, and a process of radiating light from a light source onto the mask to transfer the pattern of the mask onto the specimen substrate through a projection optical system. The process of preparing the mask is a process of selecting either a stacked-layer mask made up of a first and second component masks or a single-layer mask including pattern information, the first component mask having depressed and raised portions on its surface that give a predetermined phase difference to the transmitting light beams, the second component mask having a pattern defined by exposure light shielding areas and transmitting areas.

In the exposure method of this invention, which includes a process of preparing a mask written with an original pattern, a process of preparing a specimen substrate, and a process of radiating light from a light source onto the mask to transfer the pattern of the mask onto the specimen substrate through a projection optical system; the mask comprises a first mask, which is transparent to the exposure light and has depressed and raised portions on its surface that give a predetermined phase difference to the transmitting light beams, and a second component mask having a pattern defined by exposure light shielding areas and transmitting areas, wherein a light beam, that passed through the stepped portions at the boundaries between depressed and raised portions of the first component mask and was scattered, is blocked by the light-shielding areas of the second component mask and a light beam that passes through the second component mask passes through areas remote from the stepped boundary portions of the first mask and wherein the mask pattern is formed on the specimen substrate by the exposure light passing through the first component mask and then through the second component mask.

The exposure method of this invention arranges the first and second component masks so that the uneven surface of the first component mask having depressions and bulges and the surface of the second component mask formed with the pattern oppose each other and are put close to or in contact with each other. The beams of light are given a phase difference of about 180 degrees or an odd number times the 180 degrees as they pass through the first component mask, and are then made to pass through the second component mask to form, by the interference between transmitted beams, the pattern defined by the second component mask on the specimen substrate.

The aligner of this invention includes a light source to radiate light for exposing the specimen placed on a specimen mount, a mask to transform the light from the light source into a predetermined pattern, a mask mount to removably mount the mask, and a projection optical system to project onto the specimen the predetermined pattern formed by the mask irradiated by the light from the light source. This aligner has the following configuration.

(a) The mask mount is so constructed as to mount either a stacked-layer mask or an ordinary mask. The ordinary mask is formed with a pattern consisting of light-shielding areas and light-transmitting areas and having the same geometry as the desired transfer pattern. The stacked-layer mask comprises a first component mask formed with a pattern of light-shielding areas and light-transmitting areas and a second component mask formed with a phase shift pattern to produce a phase difference in the transmitted light beams, with their pattern forming surfaces facing each other and put close to or in contact with each other.

(b) The aligner has a calculation section which, in the exposure process using the stacked-layer mask, calculates an optimal value of the height position of the specimen mount or the mask mount according to the mask substrate thickness of the first or second component mask, whichever is closer to the specimen.

(c) The aligner has a moving mechanism that moves the specimen mount or the mask mount in the direction of optical axis according to the optimal value of height position calculated by the calculation section.

In the aligner of this invention, which comprises a mask holding means to fix the mask written with an original pattern in a predetermined position, a specimen substrate holding means to mount the specimen substrate, an illuminating means to radiate light from a light source against the mask, and a projection optical means to project the pattern written on the mask onto the specimen substrate; an aberration correction means is provided in an area, including an optical axis of the projection optical means, between the pattern surface of the mask held by the mask holding means and the specimen substrate holding means to correct, by detecting the presence or absence of a transparent parallel plate, an optical aberration that changes according to whether or not there is the parallel plate.

In the aligner of this invention, the aberration correction means to correct the optical aberration is a means to insert or extract a transparent parallel plate of a certain thickness.

In the aligner of this invention, the aberration correction means to correct the optical aberration is a means to change the length of optical path by moving or replacing an optical element making up the projection optical means or by changing the refractivity through a pressure control.

The method of manufacturing semiconductor integrated circuit devices according to this invention transfers a semiconductor integrated circuit pattern onto a semiconductor wafer by utilizing the optical interference between light beams that have passed through a stacked-layer mask, which consists of a first component mask formed with a pattern of light-shielding areas and light-transmitting areas and a second component mask formed with a phase shift pattern that produces a phase difference between transmitted beams, with the pattern forming surfaces of these masks facing each other and put close to or in contact with each other. This method has a process of moving, prior to the transfer of the semiconductor integrated circuit pattern, the height position of the semiconductor wafer or of the stacked-layer mask in a direction of optical axis according to the mask substrate thickness of the first or second component mask, whichever is closer to the semiconductor wafer.

The method of manufacturing semiconductor integrated circuit devices according to this invention has the following processes in exposing and transferring a specified semiconductor integrated circuit pattern onto a semiconductor wafer.

(a) A process of transferring a specified semiconductor integrated circuit pattern onto the semiconductor wafer by utilizing the interference of beams of light that have passed through a stacked-layer mask, which comprises a first component mask formed with a pattern of light-shielding areas and light-transmitting areas and a second component mask formed with a phase shift pattern to produce a phase difference between the transmitted light beams, with their pattern forming surfaces facing each other and put close to or in contact with each other.

(b) In the exposure process using the stacked-layer mask, a process of moving, prior to the transfer of the specified semiconductor integrated circuit pattern, the height position of the semiconductor wafer or of the stacked-layer mask in a direction of optical axis according to the mask substrate thickness of the first or second component mask, whichever is closer to the semiconductor wafer.

(c) A process of transferring the specified semiconductor integrated circuit pattern onto the semiconductor wafer by light beams that have passed through an ordinary mask consisting of light-shielding areas and light-transmitting areas and formed with the same pattern as the desired transfer pattern.

(d) In the exposure process using the ordinary mask, a process of moving, prior to the transfer of the specified semiconductor integrated circuit pattern, the height position of the semiconductor wafer or of the ordinary mask to the position of an image plane for the ordinary mask.

The method of manufacturing semiconductor integrated circuit devices according to this invention further includes the following processes in exposing and transferring a specified semiconductor integrated circuit pattern onto a semiconductor wafer.

(a) A process of transferring a specified semiconductor integrated circuit pattern onto the semiconductor wafer by utilizing the interference of beams of light that have passed through a stacked-layer mask, which comprises a first component mask formed with a pattern of light-shielding areas and light-transmitting areas and a second component mask formed with a phase shift pattern to produce a phase difference between the transmitted light beams, with their pattern forming surfaces facing each other and put close to or in contact with each other.

(b) A process of transferring a specified semiconductor integrated circuit pattern onto the semiconductor wafer by utilizing the interference of light beams that have passed through a stacked-layer mask, which comprises a first component mask formed with a pattern consisting of light-shielding areas and light-transmitting areas and having the same geometry as the desired transfer pattern, and a second component mask formed of a flat transparent substrate, with their pattern forming surfaces facing each other and put close to or in contact with each other.

(c) In the exposure process using the stacked-layer mask, a process of moving, prior to the transfer of the specified semiconductor integrated circuit pattern, the height position of the semiconductor wafer or of the stacked-layer mask in a direction of optical axis according to the mask substrate thickness of the first or second component mask, whichever is closer to the semiconductor wafer.

The method of manufacturing semiconductor integrated circuit devices according to this invention further includes the following processes in exposing and transferring a specified semiconductor integrated circuit pattern onto a semiconductor wafer.

(a) A process of transferring a specified semiconductor integrated circuit pattern onto the semiconductor wafer by utilizing the interference of light beams that have passed through a stacked-layer mask, which comprises a first component mask formed with a pattern consisting of light-shielding areas and light-transmitting areas and having the same geometry as the desired transfer pattern, and a second component mask formed of a flat transparent substrate, with their pattern forming surfaces facing each other and put close to or in contact with each other.

(b) In the exposure process using the stacked-layer mask, a process of moving, prior to the transfer of the specified semiconductor integrated circuit pattern, the height position of the semiconductor wafer or of the stacked-layer mask in a direction of optical axis according to the mask substrate thickness of the first or second component mask, whichever is closer to the semiconductor wafer.

The method of manufacturing semiconductor integrated circuit devices according to this invention further includes the following processes in exposing and transferring a specified semiconductor integrated circuit pattern onto a semiconductor wafer.

(a) A process of transferring a specified semiconductor integrated circuit pattern onto the semiconductor wafer by utilizing the interference of light beams that have passed through a stacked-layer mask, which comprises a first component mask formed of a flat transparent substrate and a second component mask formed with a phase shift pattern to produce a phase difference between the transmitted beams, with their pattern forming surfaces facing each other and put close to or in contact with each other.

(b) In the exposure process using the stacked-layer mask, a process of moving, prior to the transfer of the specified semiconductor integrated circuit pattern, the height position of the semiconductor wafer or of the stacked-layer mask in a direction of optical axis according to the mask substrate thickness of the first or second component mask, whichever is closer to the semiconductor wafer.

(c) A process of transferring a specified semiconductor integrated circuit pattern onto the semiconductor wafer by utilizing the interference of light beams that have passed through an ordinary mask, which is formed with a pattern consisting of light-shielding areas and light-transmitting areas and having the same Geometry as the desired transfer pattern.

(d) In the exposure process using the ordinary mask, a process of moving, prior to the transfer of the specified semiconductor integrated circuit pattern, the height position of the semiconductor wafer or of the ordinary mask to the position of an image plane for the ordinary mask.

The method of manufacturing semiconductor integrated circuit devices according to this invention further includes the following processes in exposing and transferring a specified semiconductor integrated circuit pattern onto a semiconductor wafer.

(a) A process of transferring a specified semiconductor integrated circuit pattern onto the semiconductor wafer by utilizing the interference of light beams that have passed through a stacked-layer mask, which comprises a first component mask formed of a flat transparent substrate and a second component mask formed with a phase shift pattern to produce a phase difference between the transmitted beams, with their pattern forming surfaces facing each other and put close to or in contact with each other.

(b) In the exposure process using the stacked-layer mask, a process of moving, prior to the transfer of the specified semiconductor integrated circuit pattern, the height position of the semiconductor wafer or of the stacked-layer mask in a direction of optical axis according to the mask substrate thickness of the first or second component mask, whichever is closer to the semiconductor wafer.

The method of manufacturing semiconductor integrated circuit devices according to this invention further includes a process of depositing a positive type photoresist film over the semiconductor wafer and a process of transferring a via hole forming pattern onto the positive type photoresist film by using the stacked-layer mask.

The method of manufacturing semiconductor integrated circuit devices according to this invention further includes a process of depositing a negative type photoresist film over the semiconductor wafer and a process of transferring a pattern of adjacent strips onto the negative type photoresist film by using the stacked-layer mask.

Further, the method of manufacturing semiconductor integrated circuit devices according to this invention uses a pattern of semiconductor integrated circuit devices as a pattern formed on the second component mask, and includes a process of applying a light-sensitive resist material to the specimen substrate and the above-mentioned exposure method, whereby a mask pattern image is projected onto the resist, which is then developed to form the semiconductor integrated circuit device pattern on the specimen substrate.

In the method of manufacturing semiconductor integrated circuit devices according to this invention, the pattern formed on the second component mask is densely gathered, microfine patterns of or cyclically repeated patterns of, for example, memory cell arrays of semiconductor integrated circuits.

The method of manufacturing semiconductor integrated circuit devices according to this invention includes the following processes in making a stacked-layer mask.

(a) A process of forming a pattern of light-shielding areas and light-transmitting areas on the first component mask by photolithography.

(b) A process of forming on the second component mask by photolithography a phase shift pattern for producing a phase difference between transmitted beams.

(c) A process of stacking the first component mask and the second component mask in a vacuum in such a way that, with their pattern forming surfaces facing each other, they are at least partially in contact with each other.

The method of manufacturing a mask of this invention has the following processes.

(a) A process of depositing a first electron ray resist film over a first light-shielding film coated over a first transparent substrate used to form the first component mask and then radiating an electron ray to the first electron ray resist film to transfer a pattern.

(b) A process of developing the first transparent substrate to which the pattern was transferred to form a first electron ray resist pattern, and then etching away the first light-shielding film exposed from the first electron ray resist pattern to form a specified pattern of light-shielding areas and light-transmitting areas on the first transparent substrate, thereby forming the first component mask.

(c) A process of depositing a second electron ray resist film and a conductive film successively over a second transparent substrate used to form the second component mask and then radiating an electron ray against the second electron ray resist film to transfer a pattern.

(d) A process of developing the second transparent substrate to which the pattern was transferred to form a second electron ray resist pattern and a conductive film pattern, and then etching away an upper part of the first transparent substrate exposed from the second electron ray resist pattern and conductive film pattern to form on the second transparent substrate a groove-shaped phase shift pattern of a certain depth that produces a phase difference between transmitted beams.

(e) A process of removing the second electron ray resist pattern and the conductive film pattern to form the second component mask.

Further, the mask making method of this invention includes the following processes.

(a) A process of depositing a first electron ray resist film over a first light-shielding film coated over a first transparent substrate used to form the first component mask and then radiating an electron ray to the first electron ray resist film to transfer a pattern.

(b) A process of developing the first transparent substrate to which the pattern was transferred to form a first electron ray resist pattern, and then etching away the first light-shielding film exposed from the first electron ray resist pattern to form a specified pattern of light-shielding areas and light-transmitting areas on the first transparent substrate, thereby forming the first component mask.

(c) A process of depositing a third electron ray resist film over a second light-shielding film coated over the second transparent substrate used to form the second component mask and then radiating an electron ray against the third electron ray resist film to transfer a pattern.

(d) A process of developing the second transparent substrate to which the pattern was transferred to form a third electron ray resist pattern and then etching away the second light-shielding film exposed from the third electron ray resist pattern to form a second light-shielding film pattern.

(e) A process of etching away an upper part of the first transparent substrate exposed from the second light-shielding film pattern to form on the second transparent substrate a groove-shaped phase shift pattern of a certain depth that produces a phase difference between transmitted light beams.

(f) A process of removing the second light-shielding film pattern to from the second component mask.

The mask making method of this invention forms the groove-shaped phase shift pattern with a wet etching process.

Further, the mask making method of this invention forms the groove-shaped phase shift pattern by using a dry etching process and a wet etching process successively.

The mask of this invention comprises the first component mask and the second component mask, with their main surfaces facing each other and stacked and joined together in a vacuum by a vacuum suction so that they are at least partially in contact with each other. In this process of making the stacked-layer mask, the first and second component masks are joined together by vacuum suction to enhance their adhesion, minimizing distortions of the stacked-layer mask resulting from temperature changes during the process of exposure. This in turn improves the pattern transfer precision.

In the mask of this invention, the phase shift pattern has a groove of a specified depth formed in the second component mask, and at least a part of the phase shift pattern is wider than the pattern width of a light-transmitting area in the first component mask corresponding to the phase shift pattern.

The mask of this invention comprises a first component mask which is transparent to exposure light and has depressions and bulges that give a predetermined amount of phase difference to beams of light as they pass through the first component mask, and a second component mask formed with a pattern defined by light-shielding areas that block the passage of exposure light and opening areas that transmit the light. These two component masks are arranged so that the depressed and raised surface of the first component mask and the pattern of the second component mask face each other and are brought close to or in contact with each other. The stepped portions defining the boundaries between the depressed and bulged portions of the first component mask oppose the light-shielding areas of the second component mask, and the first and second component masks are formed with markings for their alignment.

In the mask of this invention, the second component mask is smaller in size than the first component mask, and the periphery of the second component mask is secured to the first component mask.

In the mask of this invention, the stepped portions between the depressed and raised portions formed on the surface of the first component mask are so sized as to give a phase difference of about 180 degrees or an odd number times the 180 degrees to the exposure light.

In the mask of this invention, the stepped portions between the depressed and raised portions formed on the surface of the first component mask have a standard size that gives a phase difference of about 180 degrees or an odd number times the 180 degrees to the exposure light and the size of the stepped portions is changed according to the position of the pattern of the second component mask.

Further, the mask of this invention determines according to the depressions and bulges on the surface of the specimen substrate the size of the stepped portions between the depressed and raised portions formed on the surface of the first component mask in such a way that the image plane is aligned with the surface of the specimen substrate to which the pattern is to be transferred.

Furthermore, the semiconductor integrated circuit device of this invention is manufactured by using the above-mentioned mask and aligner according to the above-mentioned exposure method.

DESCRIPTION OF THE PREFERRED EMBODIMENTS

Now, embodiments of this invention will be described in detail by referring to the accompanying drawings.

(Embodiment 1)

Figure 1:
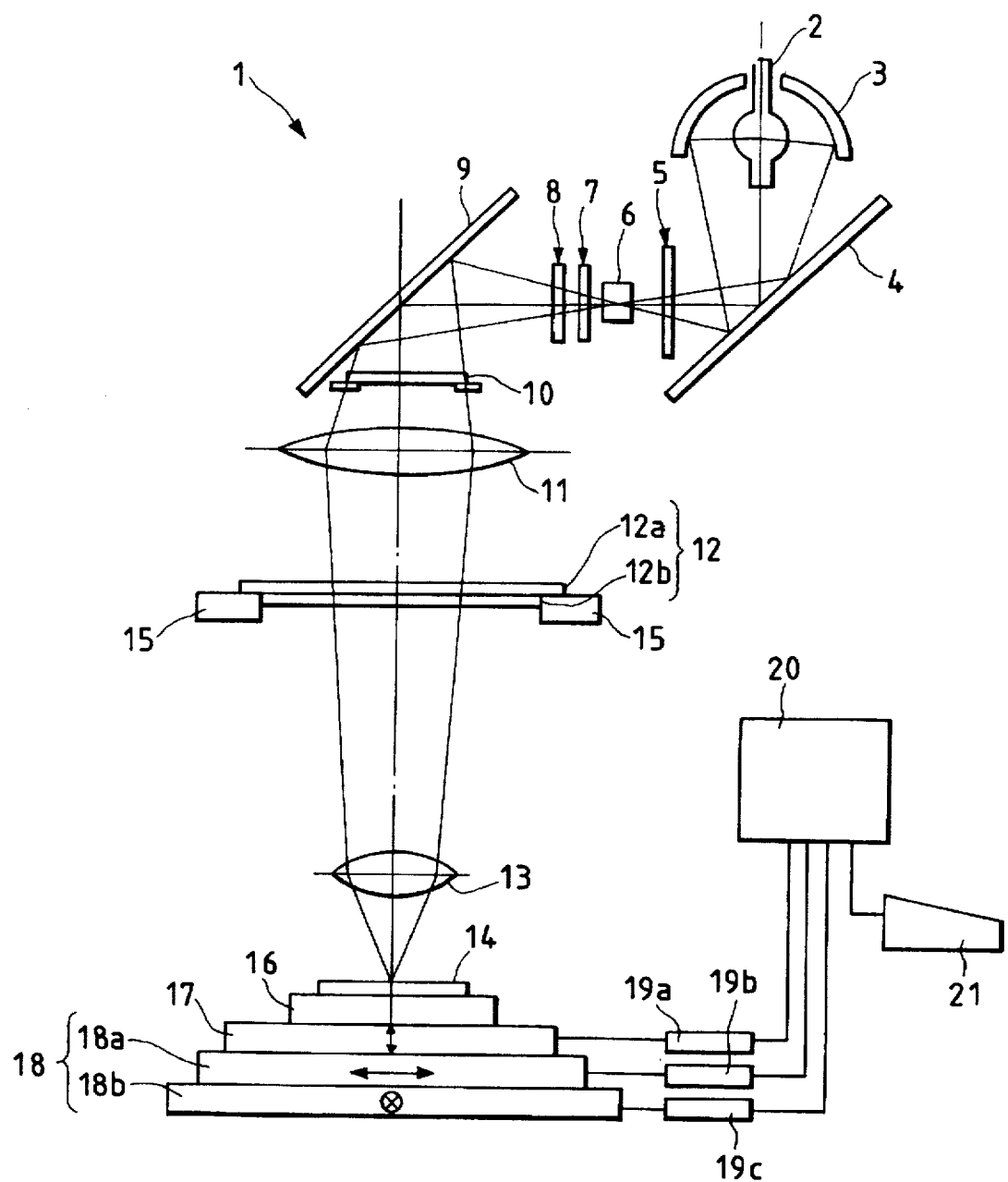
FIG. 1 is a schematic diagram showing one example embodiment of an aligner according to this invention.
Figure 2:
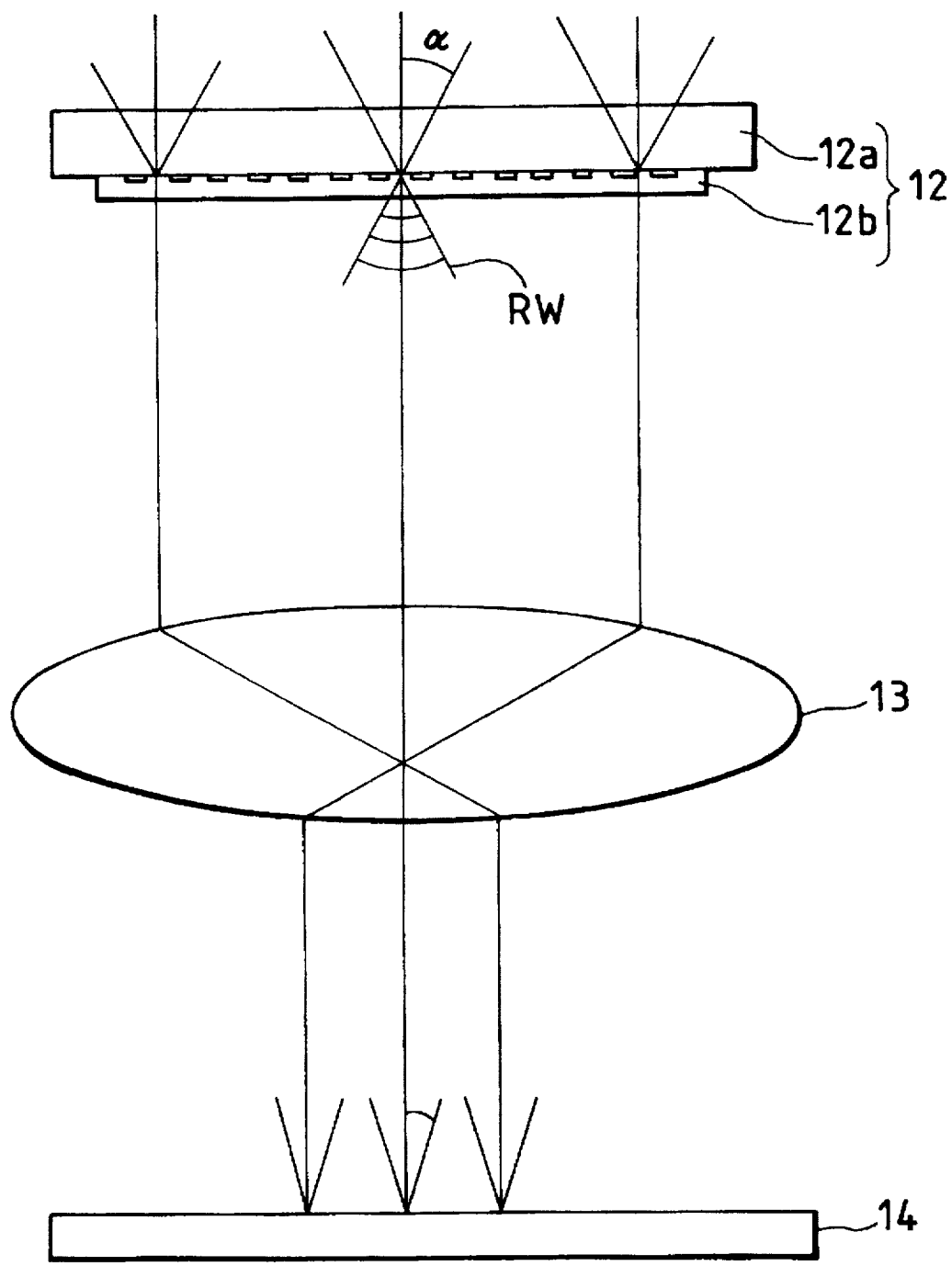
FIG. 2 is a schematic diagram showing a reduction projection lens in the aligner of FIG. 1.
Figure 3:
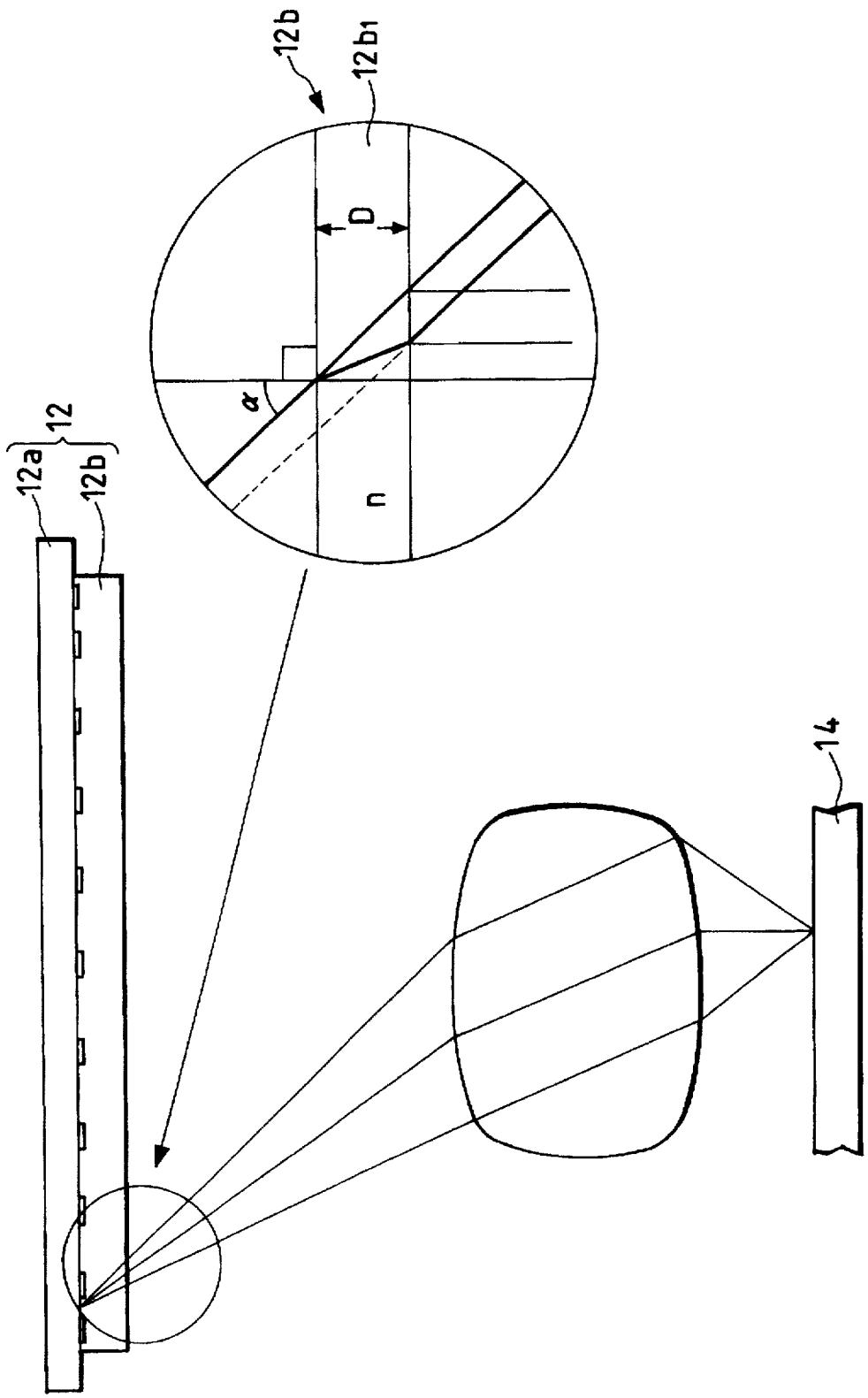
FIG. 3 is a schematic diagram illustrating a reduction projection lens not suited for use with the aligner of FIG. 1.
Figure 4:
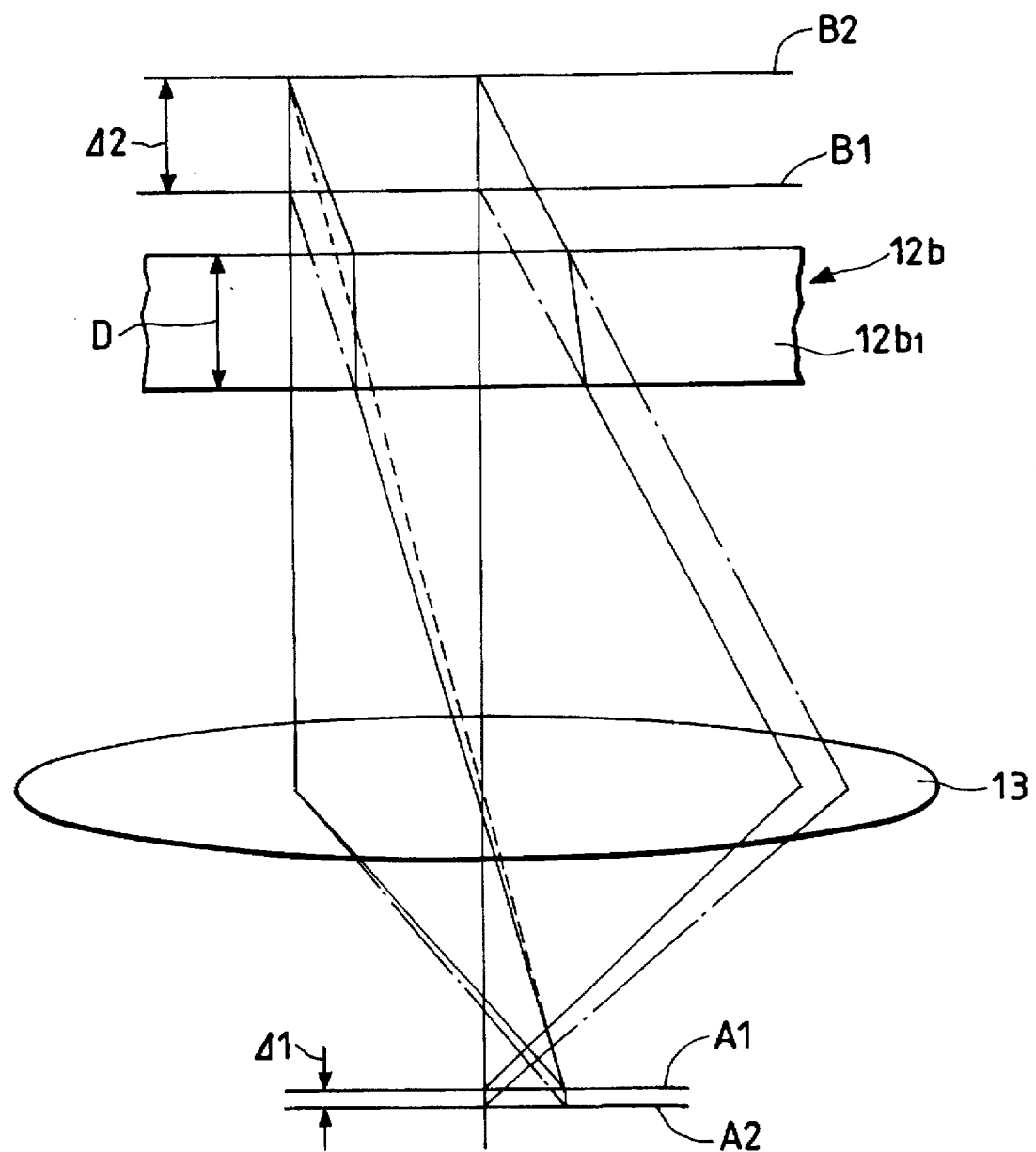
FIG. 4 is a schematic diagram showing a positional deviation of an image plane.
Figure 5:
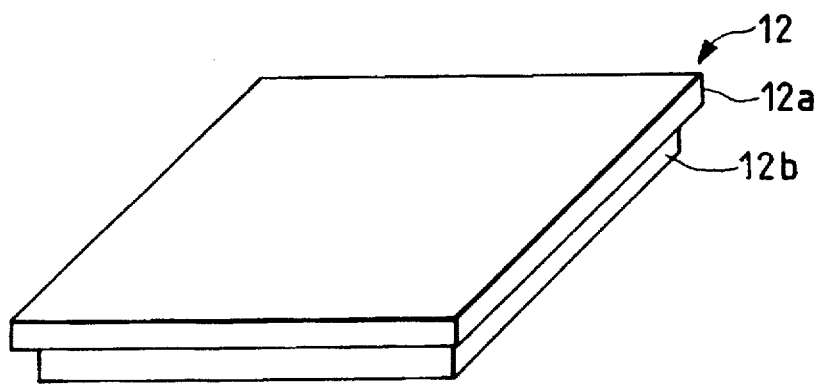
FIG. 5 is an overall perspective view of a mask of this embodiment.
Figure 6:
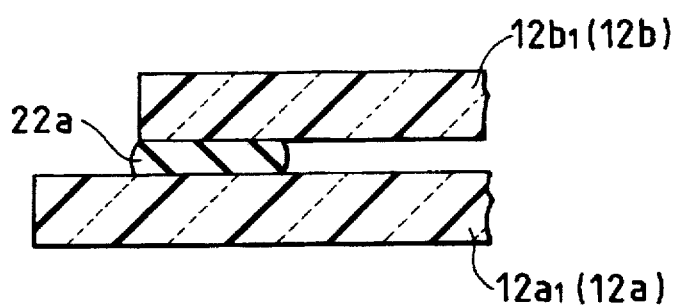
FIG. 6 is a cross section of an outer peripheral portion of the mask of FIG. 5.
Figure 7:
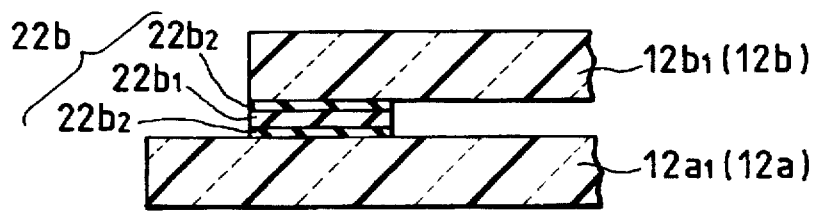
FIG. 7 is a cross section of another example of an outer peripheral portion of the mask of FIG. 5.
Figure 8:
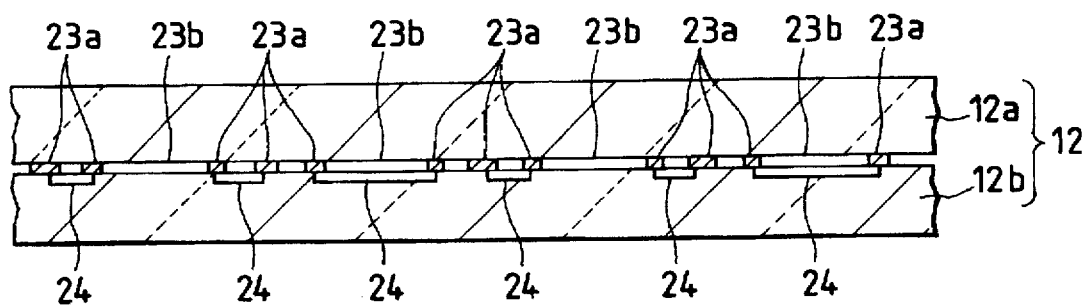
FIG. 8 is a cross section of an essential portion of the mask of FIG. 5.
Figure 9:
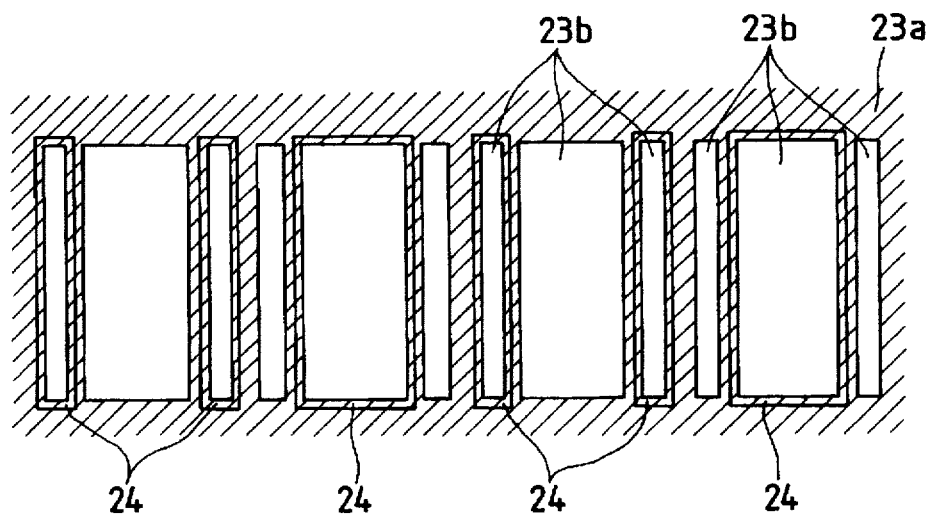
FIG. 9 is a cross section of an essential portion of the mask of FIG. 5.
Figure 10:
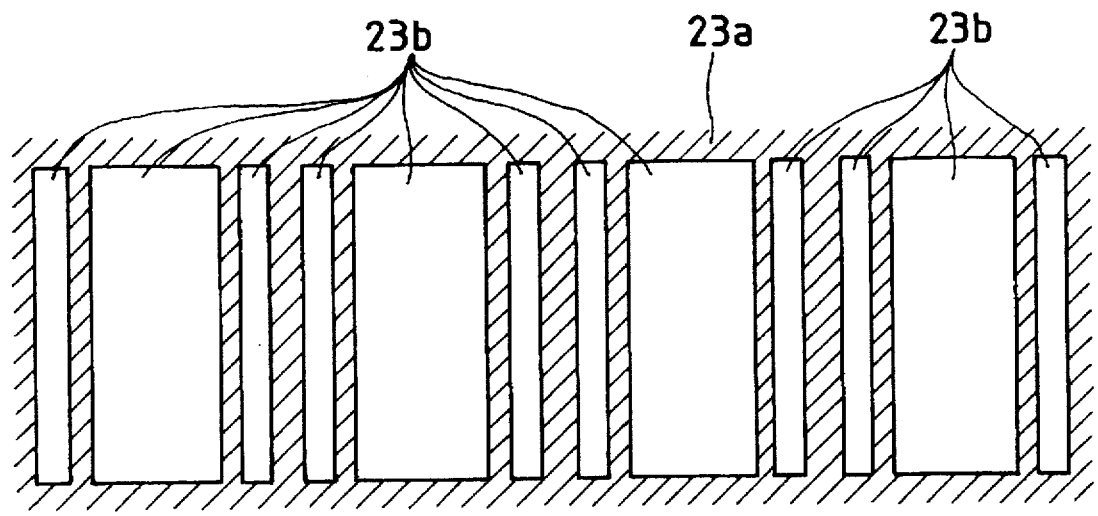
FIG. 10 is a plan view of an essential portion of a first component mask.
Figure 11:
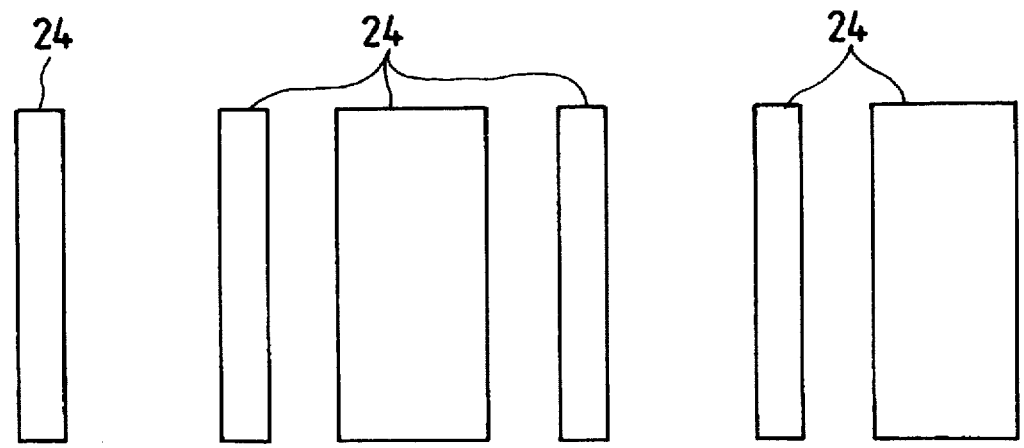
FIG. 11 is a plan view of an essential portion of a second component mask.
Figure 12:
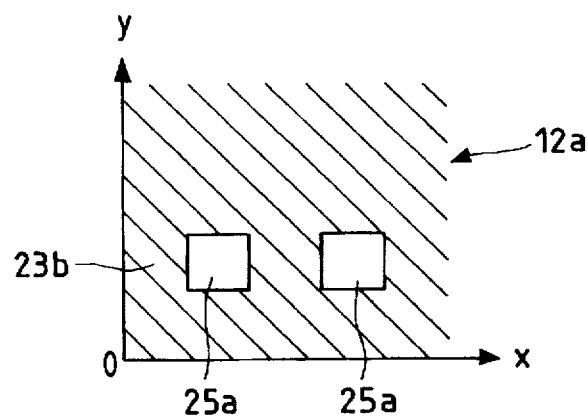
FIG. 12 is an essential cross-sectional view showing a position alignment pattern for the first and second component masks of FIG. 5.
Figure 13:
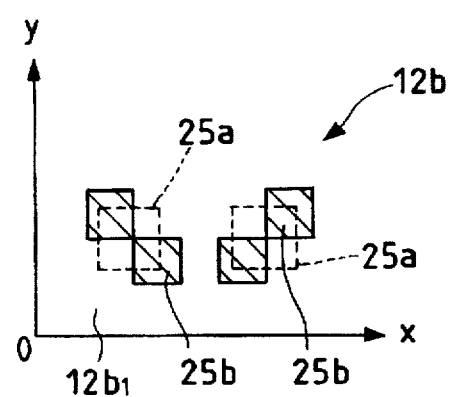
FIG. 13 is an essential cross-sectional view showing a position alignment pattern for the first and second component masks of FIG. 5.
Figure 14:
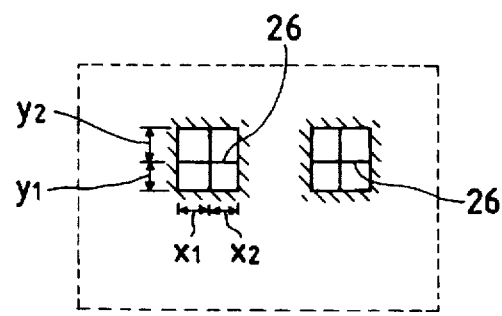
FIG. 14 is an essential cross-sectional view showing a position alignment pattern for the first and second component masks of FIG. 5.
Figure 15:
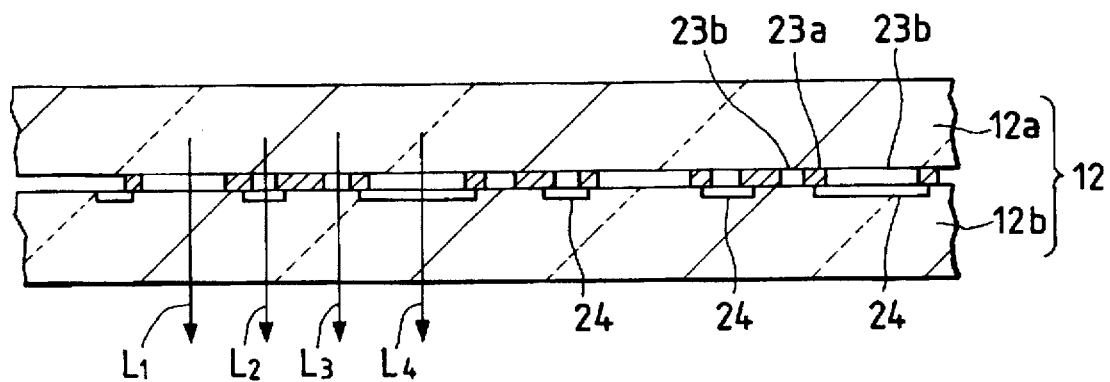
FIG. 15 is a schematic diagram showing the state of transmitted beams of light when the mask of FIG. 5 is used.
Figure 16:
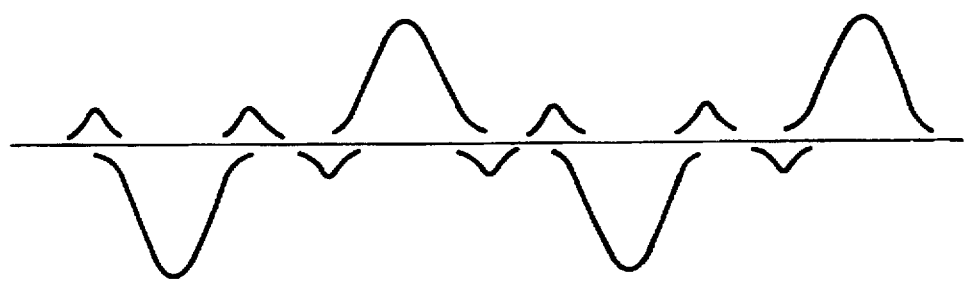
FIG. 16 is a schematic diagram showing the state of transmitted beams of light when the mask of FIG. 5 is used.
Figure 17:
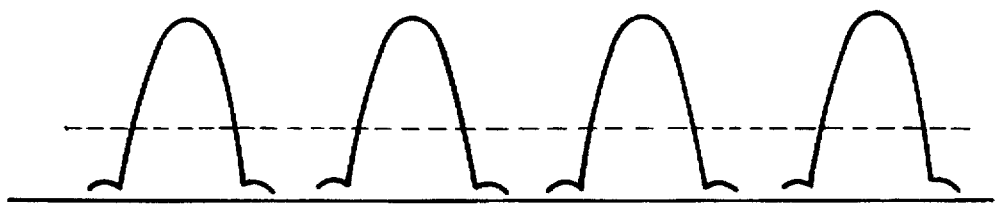
FIG. 17 is a schematic diagram showing the state of transmitted beams of light when the mask of FIG. 5 is used.
Figure 18:
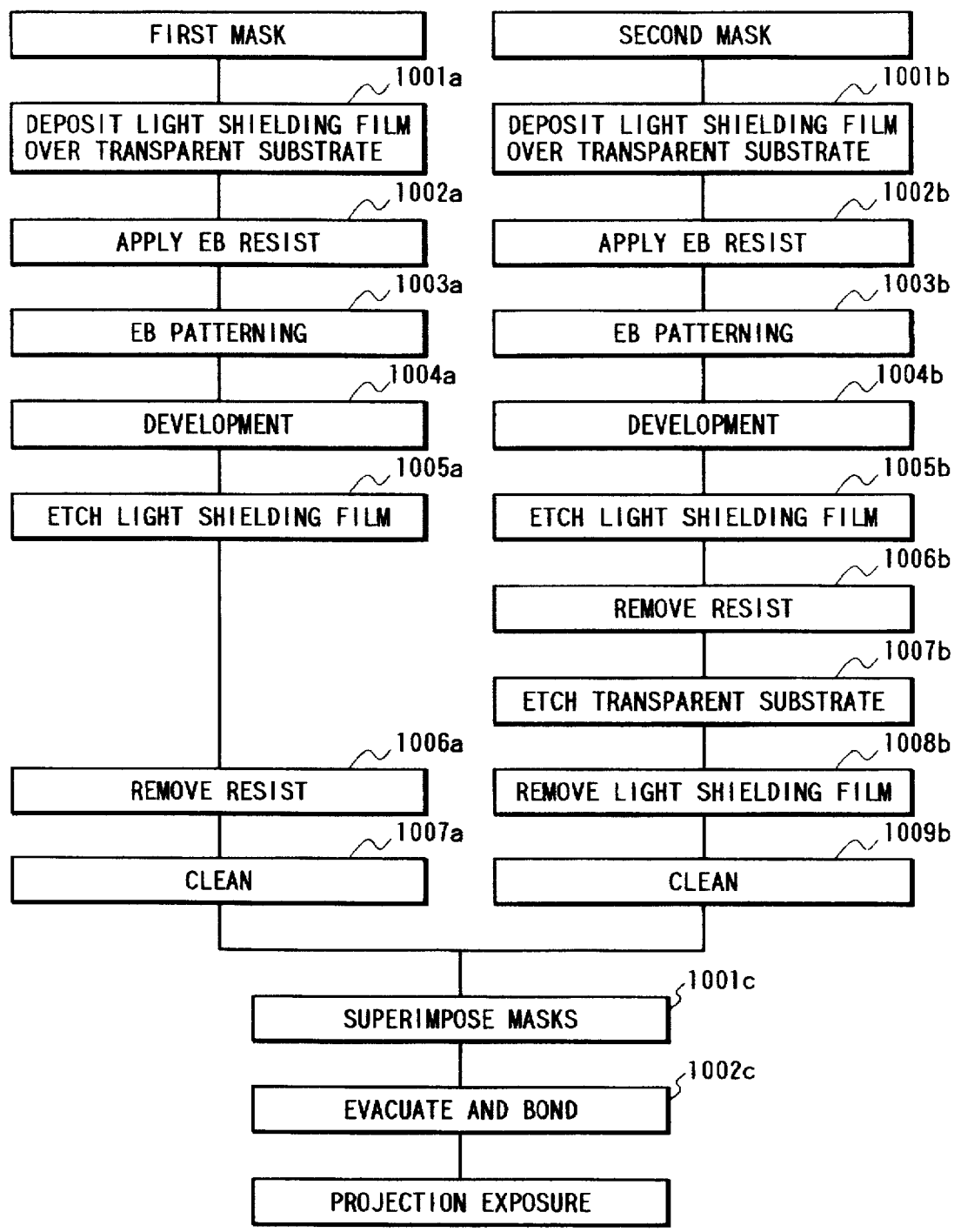
FIG. 18 is a flow diagram showing the process of manufacturing the mask of FIG. 5.
Figure 24:
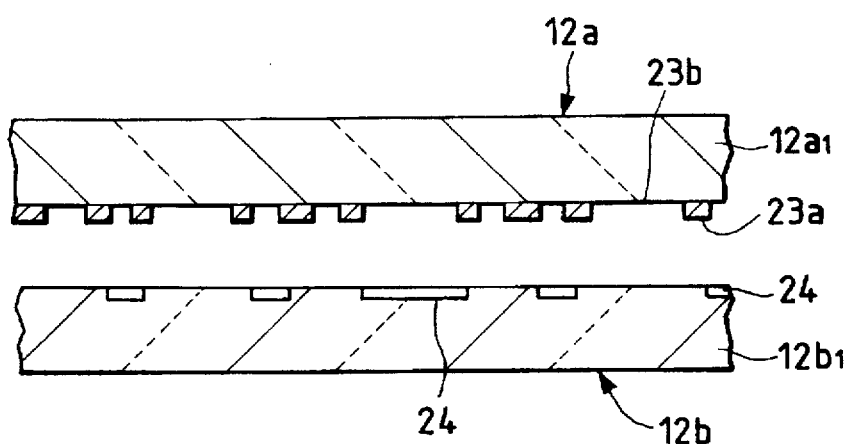
FIG. 24 is a cross-sectional view showing an essential portion of the mask of FIG. 5 during the process of manufacture.
Figure 25:
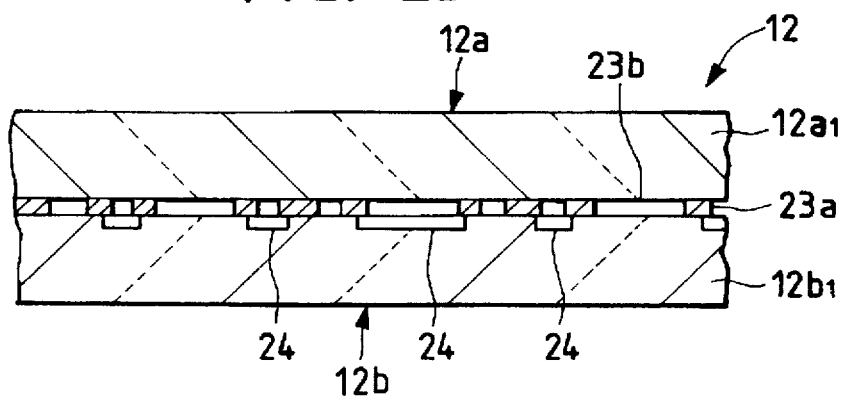
FIG. 25 is a cross-sectional view, showing an essential portion of the mask of FIG. 5 during the process of manufacture.
Figure 26:
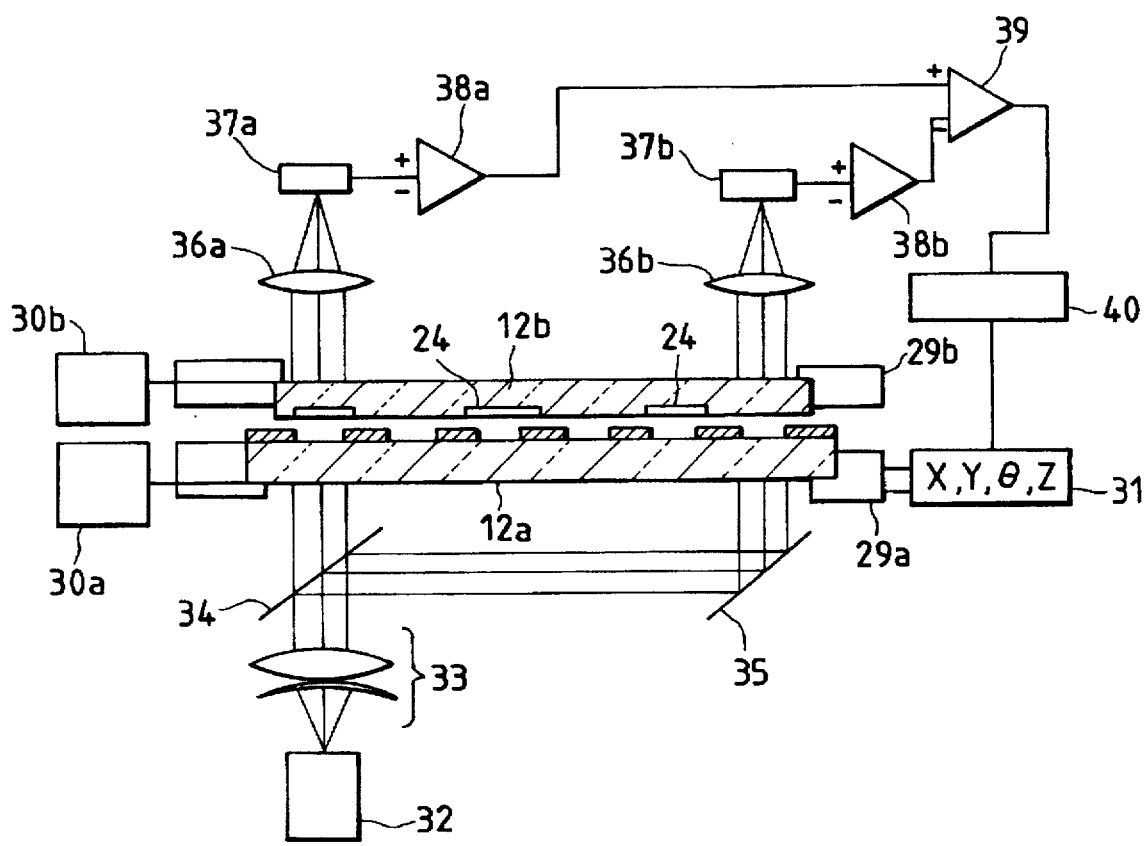
FIG. 26 is a schematic diagram showing the process of position alignment between the first and second component masks of the mask of FIG. 5.

FIG. 1 is a schematic diagram showing an aligner as one embodiment of this invention. FIG. 2 is a schematic diagram showing a reduction projection lens in the aligner of FIG. 1. FIG. 3 is a schematic diagram explaining the positional deviation of an image plane caused when another reduction projection lens with a different setting from that of FIG. 2 is used. FIG. 4 is a schematic diagram explaining the positional deviation of an image plane. FIG. 5 is an overall perspective view of the mask of the embodiment. FIGS. 6 and 7 are cross sections of a peripheral portion of the mask of FIG. 5. FIG. 8 is a cross section showing an essential portion of the mask of FIG. 5. FIG. 9 is a cross section showing an essential portion of the mask of FIG. 5. FIG. 10 is a plan view showing an essential portion of a first component mask. FIG. 11 is a plan view showing an essential portion of a second component mask. FIGS. 12 through 14 are cross sections showing an essential portion of the position alignment pattern for the first and second component masks. FIGS. 15 through 17 are schematic diagram showing the state of transmitted beams of light when the mask of FIG. 5 is used. FIG. 18 is a flow diagram showing the process of making the mask of FIG. 5. FIGS. 19 through 25 are cross sections showing an essential portion of the mask of FIG. 5 during the process of manufacture. FIG. 26 is a schematic diagram showing the process of position alignment between the first and second component masks of the mask of FIG. 5.

An aligner 1 of the first embodiment is a 5:1 reduction projection aligner using a lens type step-and-repeat system, which is based, for example, on the i-ray stepper NRS-1755i7A of Nikon (NA=0.5 and exposure area=17.5 mm square, for instance).

A light source 2 may, for example, use a high-pressure mercury lamp. Exposure light emitted from the light source 2 is collected by a light collecting mirror 3 and radiated against a first flat reflecting mirror 4.

The exposure light radiated onto the first flat reflecting mirror 4 is radiated against a second flat reflecting mirror 9 through a shutter 5, a fly eye lens 6, an aperture 7 and a shortcut filter 8.

The aperture 7 adjusts a coherence factor σ, which is set to σ=0.5 in the case of the first embodiment. The shortcut filter 8 cuts the far-ultraviolet side, i.e., shorter wavelength side, of the i beam (365 nm) used as the exposure light.

The exposure light thrown onto the second flat reflecting mirror 9 is radiated against a semiconductor wafer (specimen) 14 through a mask blind 10, a condenser lens 11, a mask 12 and a reduction projection lens (projection optical system) 13.

The mask blind 10 determines the range of a transfer area. The condenser lens 11 forms a Koehler illumination.

The mask 12 is a reticle formed with a semiconductor integrated circuit pattern five times as large as the real size and comprises a first component mask 12a and a second component mask 12b joined to the underside of the first component mask.

In the Embodiment 1, the first component mask 12a and the second component mask 12b are arranged on a light path from the light source 2 to the semiconductor wafer 14. The order of arrangement of the first component mask 12a and second component mask 12b may be reversed. That is, the pattern may be transferred by passing the beam of light shifted in phase by the second component mask 12b through the first component mask 12a.

As described later, the first component mask 12a on the upper side of the mask is formed with a pattern consisting of light-shielding areas and light-transmitting areas. The second component mask 12b on the lower side is formed with a phase shift pattern. The phase shift pattern shifts the phases of light beams passing through a pair of light-transmitting areas on both sides of a specified light-shielding area on the first component mask 12a so that they are opposite in phase.

In the aligner 1 of the Embodiment 1, the mask 12 made up of two stacked mask substrates is removably mounted on a mask mount 15. It is also possible to put on the mask mount 15 an ordinary mask with no phase shift pattern, and an ordinary phase shift mask made up of a single mask substrate.

In this case, the main surface (pattern forming surface) of the first component mask 12a is located at the mask plane position of the reduction projection optical system. The second component mask 12b on the lower side is formed slightly smaller than the first component mask 12a on the upper side to allow easy mounting of the mask 12 on the mask mount 15. The detail of the mask 12 is described later.

The reduction projection lens 13 is made up of a group of many lenses and is telecentric on both sides. When an exposure process is to be performed by using the above-mentioned stacked-layer mask 12, the reduction projection lens 13 is telecentric not only on the semiconductor wafer 14 side but on the mask 12 side as well. That is, as shown in FIG. 2, the beams of light passing through the mask 12 are perpendicular to the surface of the mask 12. In FIG. 2, α represents an angle between the exposure light and the optical axis and RW represents a spherical wave of light.

This arrangement is adopted because of the following problems experienced when the reduction projection lens 13 is not telecentric on the mask 12 side. That is, the inclination with respect to the optical axis of the exposure light beams that have passed through the mask 12 increases as the exposure light radiation position with respect to the mask 12 deviates from the center of the optical axis, as shown in FIG. 3. Another reason is that the position of the image plane on the semiconductor wafer 14 changes due to variations in the thickness of the mask substrate between the surface of the mask 12 and the reduction projection lens 13. If we let D stand for the thickness of the mask substrate and a for the angle between the exposure light and the optical axis, the positional change $\Delta$ of the image plane on the semiconductor wafer 14 is expressed as $\Delta = F(\alpha, D)$, which means its correction is difficult.

In this way, when the reduction projection lens 13 is not telecentric on the mask 12 side, an error is produced in the position of the image plane on the semiconductor wafer 14 due to variations in the position of the exposure pattern on the mask 12 and variations in the thickness of the mask substrate.

Hence, in the process of manufacturing a single semiconductor integrated circuit device, when the exposure process has mixed cases of using the phase shift mask and of not using it, stacking errors are produced between the layers making up the semiconductor integrated circuit, lowering the yield and reliability of the semiconductor integrated circuit device.

In the Embodiment 1, therefore, the reduction projection lens 13 is made telecentric not only on the semiconductor wafer 14 side but on the mask 12 side as well, as shown in FIG. 12.

The semiconductor wafer 14 is formed of a monocrystalline silicon (Si) about 5 to 8 inches in diameter and mounted on a wafer suction mount 16.

Below the wafer suction mount 16 is installed a Z-axis carrier 17, which is mechanically connected with a drive section 19a to move the semiconductor wafer 14 in the direction of its height.

An XY stage 18 is installed under the Z-axis carrier 17. The XY stage 18 consists of an X-axis carrier 18a and a Y-axis carrier 18b. The X-axis carrier 18a is a table for moving the semiconductor wafer 14 laterally horizontally in FIG. 1; and the Y-axis carrier 18b is a table for moving the semiconductor wafer 14 longitudinally horizontally in FIG. 1. The X-axis carrier 18a and the Y-axis carrier 18b are connected with drive sections 19b, 19c respectively for moving the semiconductor wafer 14.

The drive sections 19a–19c are electrically connected to a main control unit 20, which controls the operations of these drive sections. The main control unit 20 controls the overall operations of the aligner 1.

The examination by this inventor has found that when the stacked-layer mask 12 having the first component mask 12a and the second component mask 12b stacked together is used, the image plane position A1 is shifted Δ1 (simply referred to as a shift amount) upward, as shown in FIG. 4, from the position A2 of image plane obtained when an ordinary mask is used.

If we let M stand for a reduction ratio of the reduction projection lens 13, D for the thickness of the mask substrate 12b1 of the second component mask 12b and n for a refractivity of the mask substrate 12b1 of the second component mask 12b for the wavelength of exposure light, the shift amount can be expressed as $\Delta 1 = (1/M^2)D(1-1/n)$.

In the case of the Embodiment 1, assuming that the mask substrate 12b1 of the second component mask 12b is a quartz substrate 0.09 inch thick, the shift amount Δ1 is about 30 μm because the exposure light is i beam (365 nm) and the reduction ratio is 1/5.

When the mask 12 of the first component mask 12a and the second component mask 12b stacked together is used, the mask pattern surface position B1 is shifted Δ2 (simply referred to as a shift amount) downward from the position B2 of an ordinary mask pattern surface. Here, the shift amount can be expressed as $\Delta 2 = D(1-1/n)$.

The aligner 1 of the Embodiment 1 can correct the position of the image plane before the exposure process using the stacked-layer mask 12 is performed. This may be achieved by the following two methods.

The first method involves moving the semiconductor wafer 14 in the vertical direction of FIG. 1 to correct the position of the image plane. The second method moves the mask 12 in the vertical direction of FIG. 1 to correct it.

This embodiment adopts the first method in which the semiconductor wafer 14 is moved in the vertical direction of FIG. 1. In this case, the semiconductor wafer 14 needs to be moved upwardly in FIG. 1 by the shift amount Δ1 from the image plane position obtained when an ordinary mask is used. The shift amount Δ1 can be calculated by entering only the thickness D of the mask substrate 12b1 of the second component mask 12b because the reduction ratio M of the reduction projection lens 13 and the refractivity n of the mask substrate 12b1 of the second component mask 12b are already given. When the first component mask 12a is arranged on the lower side, the thickness of the first component mask 12a is entered.

That is, when the thickness D of the mask substrate 12b1 of the second component mask 12b is entered from an input device 21 by an operator, the main control unit 20 calculates the amount of displacement for correction according to the formula stored beforehand in a memory (not shown) of the main control unit 20 for deriving the shift amount Δ1. Based on the calculated amount, the main control unit 20 drives the drive section 19a to move the semiconductor wafer 14 in the vertical direction of FIG. 1, thus correcting the position of the image plane.

In the aligner 1 of this embodiment, the height of the semiconductor wafer 14 when an ordinary mask is used is stored in memory of the main control unit 20. When the exposure is to be performed using an ordinary mask, the height position of the semiconductor wafer 14 is returned, prior to the exposure process, to the position where an image is formed when an ordinary mask is used.

The position of the image plane can also be corrected by moving the mask 12 in the vertical direction of FIG. 1. This is achieved by storing in memory of the main control unit 20 the equation for deriving a shift amount Δ2 and, based on this shift amount, calculating the amount of mask displacement for correction and moving the mask mount 15 accordingly in the vertical direction of FIG. 1.

Although the Embodiment 1 concerns a case where an operator enters the thickness D of the mask substrate 12b1 of the second component mask 12b, other configuration may be possible. For example, the correction of the image plane position may be realized by optically and automatically measuring the thickness of the mask substrate 12b1 of the second component mask 12b on the semiconductor wafer 14 side when the mask 12 is placed on the mask mount 15.

Next, the method of manufacturing the semiconductor integrated circuit device by using the aligner 1 of the Embodiment 1 is explained in the following. The semiconductor integrated circuit device manufacturing process may include both a process that uses the stacked-layer mask 12 containing the phase shift pattern and a process that uses an ordinary mask not containing a phase shift pattern.

This embodiment therefore corrects the position of the image plane prior to the exposure process, according to whether the exposure process uses an ordinary mask or a stacked-layer mask 12 containing a phase shift pattern. The control sequence of the main control unit 20 is as follows.

First, the main control unit 20, prior to the exposure process, asks an operator through a monitor (not shown) if the mask that he or she is going to use is an ordinary mask or a stacked-layer mask 12.

If the stacked-layer mask 12 is used, the operator enters corresponding information through the input device 21. Based on this input, the main control unit 20 requests, through monitor, the operator to enter the thickness of the second component mask 12b (thickness of the mask substrate arranged on the semiconductor wafer 14 side).

Next, the main control unit 20 calculates the shift amount Δ1 from the thickness of the second component mask 12b entered and the amount of displacement of the semiconductor wafer 14 and then, based on the calculated displacement, drives the drive section 19a to move the semiconductor wafer 14 in the vertical direction of FIG. 1.

The main control unit 20 stores the following data in memory. First data to be stored is one that specifies whether the exposure process about to be performed uses an ordinary mask or a stacked-layer mask 12. If the stacked-layer mask 12 is used, data such as the thickness of the second component mask 12b is also stored. Second data is an actual height of the semiconductor wafer 14. Third data is a displacement of the semiconductor wafer 14.

These data are stored in memory to facilitate the correction of height of the semiconductor wafer 14 in the subsequent exposure processes. If, for example, the next exposure process uses the stacked-layer mask 12 as in the previous exposure process, the height of the semiconductor wafer 14 is left as is. If the stacked-layer mask 12 is used but with a different thickness of the second component mask 12b, the amount of displacement can be determined as long as the height of the semiconductor wafer 14 is known.

Then, the exposure process is performed on the semiconductor wafer 14 to transfer a specified pattern onto the semiconductor wafer 14 in good condition.

In the next exposure process, the main control unit 20 interrogates the operator through monitor (not shown) about whether the mask the operator is going to use is an ordinary mask or a stacked-layer mask 12.

When the stacked-layer mask 12 is used, the main control unit 20 displays on monitor the data on the thickness of the second component masks 12b of the stacked-layer masks 12 that were used in the past and asks which of the displayed stacked-layer masks 12 will be used.

If the data of the stacked-layer mask 12 the operator has entered agrees with the stacked-layer mask 12 used in the exposure process immediately before, the main control unit 20 performs the exposure process in the same way as before.

If the data of the stacked-layer mask 12 the operator has entered differs from the one used in the immediately preceding exposure process, the main control unit 20 calculates the shift amount $\Delta 1$ and also the displacement from the data of the present height of the semiconductor wafer 14, moves the semiconductor wafer 14 accordingly in the vertical direction to correct the actual height, and then exposes the semiconductor wafer 14. This process allows good transfer of a specified pattern onto the semiconductor wafer 14.

When, on the other hand, an ordinary mask is used in the subsequent exposure process, the main control unit 20 corrects the actual height of the semiconductor wafer 14 according to the data of height of the image plane for the ordinary mask stored in memory and then performs the exposure process on the semiconductor wafer 14. This allows a satisfactory transfer of a specified pattern onto the semiconductor wafer 14.

If, in the semiconductor integrated circuit device manufacture process, the thickness of the second component mask 12b of the stacked-layer mask 12 is constant, the main control unit 20 can be set accordingly. In this case, the main control unit 20 asks about the kind of mask used in the exposure process, i.e., whether it is a stacked-layer mask or an ordinary mask. In this case too, data on the kind of mask used for the exposure and data of height position of the semiconductor wafer 14 are stored in memory before the exposure process.

In the case where the thickness of the second component mask 12b of the mask 12 is automatically measured, the following steps are taken.

First, the main control unit 20 inquires the operator through monitor about whether the mask that will be used is an ordinary mask or a stacked-layer mask. If the stacked-layer mask is to be used, the main control unit 20 optically measures the thickness of the second component mask 12b.

The measurement is taken in the following manner. First, detection light emitted from a detection light source (not shown) is radiated against a specified position on the second component mask 12b from a specified angle. Then, the light reflected from the light-shielding pattern of the first component mask 12a is used to measure the thickness of the second component mask 12b.

Then, the shift amount is calculated from the measurement of thickness of the second component mask 12b and, based on the calculated shift amount, the displacement of the semiconductor wafer 14 is determined. The height position of the semiconductor wafer 14 is corrected according to the calculated displacement.

In the next exposure process, the main control unit 20, prior to performing the exposure process, asks the operator through monitor (not shown) whether the mask to be used is an ordinary mask or a stacked-layer mask 12.

If the mask to be used is identical with the stacked-layer mask 12 that was used in the immediately preceding exposure process, the main control unit 20 performs the exposure process in the same way. When a different mask is to be used, the thickness of the second component mask 12b is automatically measured, after which the height of the semiconductor wafer 14 is corrected and the exposure process is performed in the similar manner to the one mentioned above. When an ordinary mask is to be used, the main control unit 20 corrects the actual height of the semiconductor wafer 14 according to the data of height of the image plane for the ordinary mask stored in memory and then performs the exposure process on the semiconductor wafer 14.

Now, the mask 12 of the Embodiment 1 is explained by referring to FIGS. 1 through 17.

In the semiconductor integrated circuit device fabrication process, the stacked-layer mask 12 of the Embodiment 1 is a reticle formed with an original pattern five times as large as the real size to transfer a specified semiconductor integrated circuit pattern onto the semiconductor wafer 14. It is formed, for example, with a semiconductor integrated circuit pattern to transfer a repeating pattern of memory cell arrays.

The external view of the stacked-layer mask 12 is shown in FIG. 5. The second component mask 12b is formed slightly smaller than the first component mask 12a so that, as mentioned earlier, the protruding outer periphery of the first component mask 12a is mounted on the mask mount 15 (see FIG. 1) for easy holding of the mask 12.

The mask 12, as shown in FIGS. 5 and 6, comprises a first component mask 12a and a second component mask 12b, with their main surfaces facing each other and stacked together. In this embodiment, in particular, the first component mask 12a and the second component mask 12b are held together with good adhesion by vacuum suction, as described later. This prevents deformation of the mask 12 due to temperature difference between the first and second component masks 12a, 12b during the exposure process, thereby minimizing misalignment between the first and second component masks 12a, 12b when stacked together.

Although the first and second component masks 12a and 12b are joined together by vacuum suction, they may get separated when applied impacts. Hence, as shown in FIGS. 6 and 7, the outer periphery of the second component mask 12b is provided with a bonding portion 22a, 22b to firmly fix together the first component mask 12a and the second component mask 12b.

The bonding portion 22a, 22b is preferably formed of a material that has high viscosity and does not produce foreign matters upon application of ultraviolet radiation after hardening. The bonding portion 22a of FIG. 6 may be formed of, for instance, glass epoxy-based resin. The bonding portion 22b of FIG. 7 is formed of a double-sided adhesive tape, which comprises an intermediate spacer 22b1 having bonding layers 22b2 on the upper and lower surfaces. The intermediate spacer 22b1 may be formed of a tape material such as polyethyleneterephthalate and the bonding layers 22b2 formed of acrylic emulsion-based bonding agent.

Because of the bonding portion 22a, 22b, this embodiment can prevent foreign matters from entering between the facing surfaces of the first component mask 12a and the second component mask 12b.

By making the thickness of the mask substrates 12a1, 12b1 of the first component mask 12a and the second component mask 12b more than 2 mm, it is possible to prevent foreign matters, if any, at the back of the first component mask 12a and second component mask 12b from being transferred onto the semiconductor wafer 14. In other words, the first component mask 12a and the second component mask 12b have a function of foreign matter adhesion prevention film, i.e., a mask with pellicle. Hence, a separate pellicle is not needed.

If foreign matters exist on the back of the first component mask 12a and the second component mask 12b, they can easily be removed as by washing because the back surfaces of these masks are flat.

With these features, the stacked-layer mask 12 of the Embodiment 1 can prevent a faulty transfer due to foreign matters.

The first component mask 12a is similar to an ordinary mask with its main surface formed with a pattern of light-shielding areas 23a and light-transmitting areas 23b, as shown in FIGS. 8 to 10.

The pattern of the light-transmitting areas 23b on the first component mask 12a consists of a relatively large rectangular area and relatively small rectangular areas extending along the sides of the large area and is made to repeat cyclically at least in one direction.

The pattern of the light-shielding areas 23a on the first component mask 12a is formed of a metal film such as chromium (Cr) deposited over the mask substrate. This mask substrate is formed of a synthetic quartz glass with refractivity of, say, 1.47.

The second component mask 12b is a mask to produce a phase difference in the transmitted light and its main surface is formed with a grooved phase shift pattern 24 of a rectangular shape, as shown in FIGS. 8, 9 and 11.

The phase shift pattern 24, as shown in FIGS. 8 and 9, is cyclically repeated at least in one direction so that they correspond to either odd-numbered or even-numbered light-transmitting areas 23b that are repetitively arranged on the first component mask 12a. By the action of the phase shift pattern 24 described later, the phase of the exposure light is reversed cyclically, allowing a clear image to be formed on the semiconductor wafer 14.

The phase shift pattern 24 is formed slightly larger on the whole than the pattern of the corresponding light-transmitting areas 23b for the following reasons. The first reason is to secure a sufficient intensity of the transmitted light. The second is to secure a margin for position alignment. This mask substrate is formed of a synthetic quartz glass with refractivity of, say, 1.47 and is about 2.3 mm (0.09 inches) thick.

The exposure process using such a stacked-layer mask 12 exposes a negative type photoresist, which is deposited over the semiconductor wafer 14, in a way described above to transfer a strip pattern onto the photoresist in good condition.

The critical issue with such a mask 12 is the stacking alignment between the first component mask 12a and the second component mask 12b. This can be dealt with by providing them with alignment markings.

FIG. 12 shows one example of alignment markings 25a on the first component mask 12a, which are square light-transmitting areas formed in the light-shielding area 23a. FIG. 13 shows one example of alignment markings 25b on the second component mask 12b, which consist of two square phase shift patterns arranged in the light-transmitting areas and put in contact with each other at one corner.

The first component mask 12a and the second component mask 12b are aligned by using the alignment markings 25a, 25b of FIGS. 12 and 13 and detecting a cross pattern 26, as shown in FIG. 14, which is produced as a diffracted projection image by combining the alignment markings 25a, 25b of the first and second component masks 12a, 12b.

That is, such alignment markings are provided at two or more locations on the circumferences of the mask substrates. As shown in FIG. 14, alignment errors are measured from differences (X1–X2, Y1–Y2) between the cross pattern 26 and the frame. Adjustment is made in such a way as to eliminate the errors to align the two mask substrates.

Next, how the transmitted light is phase-shifted during the exposure process using such a mask 12 is explained by referring to FIGS. 15 to 17.

FIG. 15 shows the state of beams of light L1–L4 passing through the stacked-layer mask 12. FIG. 16 shows the amplitude of light that has passed through the stacked-layer mask 12 and the reduction projection lens and which has reached the semiconductor wafer 14 (see FIG. 1). FIG. 17 represents the intensity of these light beams.

The light beams L1, L4 that have passed through wide light-transmitting areas 23b are in opposite phase with each other, while the beams L2, L4 that have passed through narrow light-transmitting areas 23b by the side of the wide light-transmitting areas 23b are in opposite phase with each other. As shown in FIG. 16, the transmitted beams L1 and L4 as well as the transmitted beams L2 and L3 are made to interfere with each other to improve the contrast of the transfer pattern significantly, as indicated in FIG. 17, thereby allowing a clear repetitive pattern to be transferred onto the semiconductor wafer 14. Next, the method of manufacturing the mask of the Embodiment 1 is explained by referring to the mask making flow of FIG. 18 and also to FIGS. 19 through 26. In the Embodiment 1, the first component mask 12a and the second component mask 12b are fabricated separately by forming patterns on separate mask substrates. These component masks, after having been completed, are combined together to form the mask 12.

This method can reduce the rate of failures when compared with the conventional method whereby the light-shielding areas, the light-transmitting areas and the phase shift pattern are formed on a single mask substrate, thus eliminating the problem of extended manufacturing period due to occurrence of flaws and improving the yield.

Figure 19:
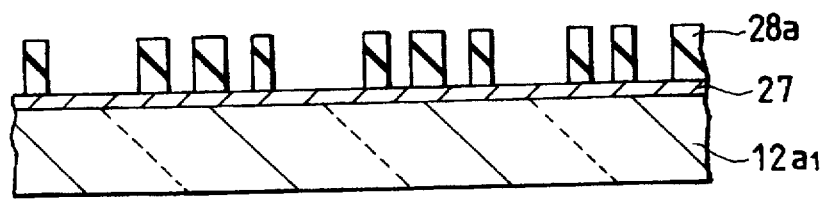
FIG. 19 is a cross-sectional view showing an essential portion of the mask of FIG. 5 during the process of manufacture.

The method of manufacturing the first component mask 12a is described below. First, as shown in FIG. 19, the surface of the mask substrate 12a1 formed of a synthetic quartz glass is polished and cleaned, after which the entire main surface of the mask substrate 12a1 is sputtered with a light-shielding film 27 of Cr to a thickness of, say, 0.05–0.3 µm (process 1001a).

Next, the whole surface of the light-shielding film 27 is deposited with an electron beam resist to a thickness of about 0.1–0.8 µm (process 1002a), which is then written with a desired integrated circuit pattern by an electron beam exposure technology (process 1003a).

This electron beam exposure technology radiates electron beams against specified positions and specified geometries on the mask substrate 12a1 according to the pattern data, such as position coordinates and geometries of the semiconductor integrated circuit patterns, stored in memory of an electron beam lithography system to form a desired pattern.

Figure 20:
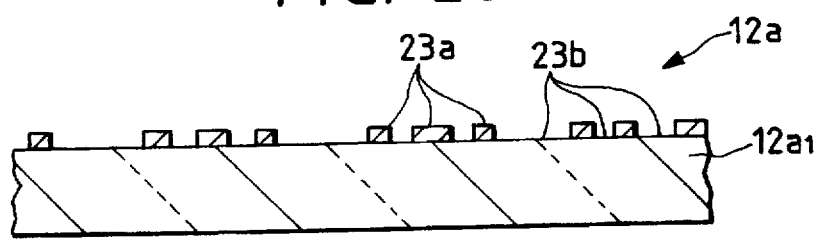
FIG. 20 is a cross-sectional view showing an essential portion of the mask of FIG. 5 during the process of manufacture.

Then, when the electron beam resist is of a positive type, the exposed part of the resist is removed by a specified development liquid to form a resist pattern 28a. The part of the light-shielding film 27 exposed from the resist pattern 28a is removed by wet etching to form a pattern of the predetermined geometry of light-shielding areas 23a, as shown in FIG. 20 (process 1004a, 1005a).

When the electron beam resist is of a negative type, the unexposed part is removed by a specified development liquid to form a resist pattern 28a. The part of the light-shielding film exposed from the resist pattern 28a is removed by wet etching to form a pattern of the predetermined geometry of light-shielding areas 23a, as shown in FIG. 20 (1004a, 1005a).

After this, the resist pattern 28a is removed by a resist stripper and washed (1006a, 1007a). As a result, first component mask 12a having a predetermined geometry of light-shielding areas 23a and light-transmitting areas 23b is obtained.

When the electron beam exposure technology is used, a charge prevention layer of, say, conductive polymer is coated over the surface of the resist by spin coating. Next, the electron beam is manipulated to describe a pattern according to the phase shifter processing pattern data that corresponds to the semiconductor integrated circuit pattern. At this time, because the pattern data of the first component mask 12a and the pattern data of the second component mask 12b are in a mirror-symmetric relationship, the pattern writing can be done by reversing the coordinate system of the electron beam lithography system. The writing of the mirror-symmetric pattern is provided as a standard function in the electron beam lithography system currently available on the market and therefore can be performed easily.

The first component mask 12a allows pattern flaws produced during the mask making process to be corrected by laser beams or focused ion beams. That is, when there is a light-shielding film residue in the light-transmitting area 23b on the first component mask 12a, a spot laser beam is irradiated against the location in question. When there is a partial opening in the light-shielding area 23a, a focused ion beam may be irradiated while supplying an organic gas such as pyrene to deposit a carbon film over the flaw.

Figure 21:
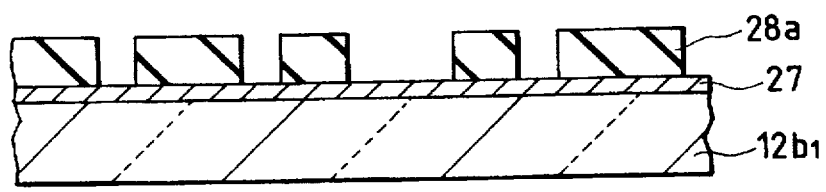
FIG. 21 is a cross-sectional view showing an essential portion of the mask of FIG. 5 during the process of manufacture.
Figure 22:
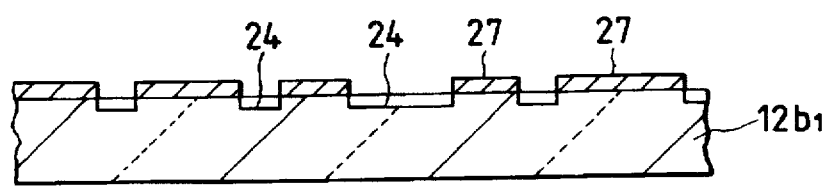
FIG. 22 is a cross-sectional view showing an essential portion of the mask of FIG. 5 during the process of manufacture.

Now, the method of fabricating the second component mask 12b is explained. The processes 1001b–1006b are identical with the processes 1001a–1006a of making the first component mask 12a, as shown in FIGS. 21 and 22.

In the process of fabricating the second component mask 12b, the part of the mask substrate 12b1 exposed from the pattern of the light-shielding film 27—which is used as an etching mask—is formed with grooves (process 1007b). As a result, a phase shift pattern 24 that produces a phase difference in the transmitted light is formed.

The etching used in this process may be plasma dry etching using $CF_4$ and $CHF_3$ and wet etching using HF. The groove is formed so as to satisfy the relation $d=\lambda/2(n-1)$ where d represents the depth of this groove, $\lambda$ represents the wavelength of the transmitted light and n represents the refractivity of the grooved member.

In this groove forming process, the following steps are performed to make the width of the groove slightly larger than the corresponding pattern of the light-transmitting areas. First, when forming the groove by wet etching, undercuts are produced. Second, after the groove is formed by dry etching, the mask is further subjected to wet etching to form undercuts. Third, when dry etching is simply used, the width of the exposed area is made slightly larger than the light-transmitting area.

Figure 23:
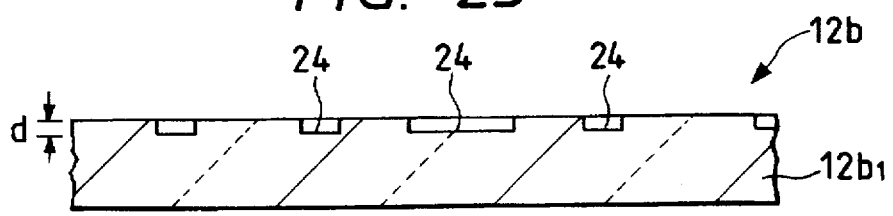
FIG. 23 is a cross-sectional view showing an essential portion of the mask of FIG. 5 during the process of manufacture.

Next, with the light-shielding film 27 as an etching mask removed, the substrate is cleaned (1008b, 1009b). At this time, because the light-shielding film is not formed on the second component mask 12b, the unwanted phenomenon can be eliminated in which the light-shielding film 27 is peeled off when cleaning the second component mask 12b or foreign matters are trapped between the light-shielding film 27 and the groove. This leads to a reduced fabrication time and an improved yield of mask. In this way, the second component mask 12b having a specified geometry of the phase shift pattern 24 is manufactured, as shown in FIG. 23.

After this, the first component mask 12a and the second component mask 12b are cleaned to remove foreign matters from their main surfaces. The main surfaces are then set to face each other, as shown in FIG. 24.

The first component mask 12a and the second component mask 12b are set in their correct positional relationship by the alignment markings 25a, 25b (FIGS. 12 and 13). In the Embodiment 1, the first component mask 12a and the second component mask 12b are stacked together with their main surfaces in contact, as shown in FIG. 25, and then are firmly joined together by vacuum suction by evacuating the mask stacking process chamber below $10^{-4}$ torr (process 1001c, 1002c).

This method can limit the distortions due to temperature differences between the first and second component masks 12a, 12b and therefore prevent positional shift after stacking the first component mask 12a and the second component mask 12b.

With this vacuum suction alone, however, the combined component masks may become separated upon application of impacts. Hence, prior to the stacking process, a bonding agent is applied to the circumference of the second component mask 12b for firm bonding between the first component mask 12a and the second component mask 12b.

FIG. 26 shows an example method of aligning the first component mask 12a and the second component mask 12b. A first mask stage 29a is a holder to hold the first component mask 12a and has a vacuum chuck. A second mask stage 29b is a holder to hold the second component mask 12b and has a vacuum chuck.

Vacuum chuck controllers 30a, 30b are control units to control the vacuum chucks of the first mask stage 29a and the second mask stage 29b. A stage drive unit 31 drives the first mask stage 29a and the second mask stage 29b. X represents a parallel horizontal motion parallel to the plane of the drawing; Y represents a parallel horizontal motion perpendicular to the plane of the drawing; and θ represents a rotation about the vertical axis passing through almost the center of the mask.

A monocolor light source 32 emits light of the same wavelength as the actual exposure light. The light emitted from the monocolor light source 32 is radiated through a condenser lens 33 against a half mirror 34, from which one half of the light is radiated to a reflecting mirror 35 and the other half is sent through a first projection lens 36a to a first image sensor 37a. The light thrown onto the reflecting mirror 35 is radiated through a second projection lens 36b against a second image sensor 37b.

Detection signals picked up by the first image sensor 37a and the second image sensor 37b are supplied through a first amplifier 38a and a second amplifier 38b, respectively, to a comparator 39. The output of the comparator 39 is electrically connected to a stage control unit 40.

The stage control unit 40 controls the amount of drive for the stage drive unit 31 according to the output signal from the comparator 39. Further, the Embodiment 1 has a vacuum suction mechanism that joins together the first component mask 12a and the second component mask 12b with their main surfaces facing each other.

Position alignment between the first component mask 12a and the second component mask 12b is done as follows. First, the first component mask 12a and the second component mask 12b are placed on the first mask stage 29a and the second mask stage 29b so that their main surfaces oppose each other, after which the first mask stage 29a and the second mask stage 29b are driven to bring the main surfaces of the component masks close to each other.

Then, from the back of the first component mask 12a, detection light of the same wavelength as the exposure light is radiated against the alignment markings on the first component mask 12a. Measurement is taken of relative positional shifts and rotational shifts by using the alignment markings 25a, 25b (see FIGS. 12 and 13) on the first component mask 12a and the second component mask 12b. The measurement data is fed back to the first mask stage 29a.

To describe in more detail, the cross pattern 26 and the frame in the alignment markings shown in FIG. 14 are detected by the image sensors and, based on the detected signals, the comparator 39 determines the positional difference (X1–X2, Y1–Y2) between the cross pattern and the frame. According to the positional difference from the comparator 39, the amount of drive for the stage drive unit 31 is calculated and the first mask stage 29a is driven accordingly.

After the positional alignment errors are measured, the X and Y (plane) position deviations are corrected at one point on the first component mask 12a and then the similar correction is made at another point to correct the θ (rotation) error.

With the position alignment between the first and second component masks 12a, 12b completed, the first mask stage 29a is moved in the Z (height) direction to bring the main surfaces of the first and second component masks 12a and 12b into contact. In this state, the first component mask 12a and the second component mask 12b are joined together by vacuum suction and at the same time firmly bonded together with a bonding agent applied to the outer circumference of the second component mask 12b.

The Embodiment 1 offers the following advantages.

(1) In the exposure process using the stacked-layer mask 12 made up of the first and second component masks 12a, 12b stacked together, a phase difference is produced in the exposure light by one of the stacked component masks. This makes it possible to improve the contrast of a projected image as in the case of an ordinary phase shift mask.

(2) Prior to the exposure process that uses the stacked-layer mask 12 made up of the first and second component masks 12a, 12b, the position of the image plane is corrected. This prevents the focus position and magnifying power from changing during the exposure process that uses the stacked-layer mask 12.

(3) Because of (1) and (2) mentioned above, the precision of mask pattern transfer is improved.

(4) Because of (2), the exposure process in the semiconductor integrated circuit device fabrication can be performed without degrading the transfer precision either in the case of using the stacked-layer mask 12 with a phase shift pattern or in the case of using an ordinary mask formed of a single mask substrate with no phase shift pattern.

(5) One mask is divided into the first component mask 12a formed with an ordinary pattern of light-shielding areas 23a and light-transmitting areas 23b and the second component mask 12b formed with a phase shift pattern 24. These component masks are prepared separately and then combined together to form the stacked-layer mask 12. This method reduces the failure rate when compared with the case of forming the light-shielding areas, the light-transmitting areas and the phase shift pattern on a single mask substrate.

(6) One mask is divided into the first component mask 12a formed with an ordinary pattern of light-shielding areas 23a and light-transmitting areas 23b and the second component mask 12b formed with a phase shift pattern 24. These component masks are prepared separately and then combined together to form the stacked-layer mask 12. This method prevents troubles—experienced with a method in which the light-shielding areas, the light-transmitting areas and the phase shift pattern are all formed on a single mask—such as the trapping of foreign matters between the light-shielding areas and the grooves of the phase shift pattern and the peeling of the light-shielding areas caused during the cleaning process.

(7) Because of (5) and (6), it is possible to prevent the mask making time from being extended by the occurrence of faults and therefore improve the yield of the mask.

(8) Because the first component mask 12a and the second component mask 12b are joined together by vacuum suction, their adhesion is improved.

(9) Because of (8), deformations of the stacked-layer mask 12 due to temperature differences between the first and second component masks 12a, 12b during the exposure process can be prevented. This in turn prevents stacking misalignment between the first and second component masks 12a, 12b.

(10) Provision of the bonding portion 22a, 22b at the outer circumference of the second component mask 12b ensures firm bonding between the first and second component masks 12a, 12b. This in turn increases the mask resistance against impacts and prevents foreign matters from entering between the facing surfaces of the first and second component masks 12a, 12b.

(11) The thicknesses of the mask substrates 12a1, 12b1 of the first and second component masks 12a, 12b are made greater than, for instance, 2 mm. This prevents foreign matters, which may exist on the back of the first and second component masks 12a, 12b, from being transferred onto the semiconductor wafer 14.

(12) Removal by cleaning of foreign matters that may exist on the back of the first and second component masks 12a, 12b can be made easy because of the fact that their back surfaces are flat.

(13) Because of (9) to (12), the influences of the presence of foreign matters on the stacked-layer mask 12 can be reduced, which in turn prevents faulty transfer caused by foreign matters.

(14) Because of (11), the first component mask 12a and the second component mask 12b have the function of pellicle, which in turn eliminates the need for pellicles.

(15) Because the reduction projection lens 13 of the aligner 1 is made telecentric on both the semiconductor wafer 14 side and the stacked-layer mask 12 side, it is possible to eliminate the positional errors of the image plane on the semiconductor wafer 14 caused by variations in the position of the exposure pattern on the stacked-layer mask 12 and in the thickness of the mask substrate over its main surface.

(16) Because of (15), in the process of manufacturing a single semiconductor integrated circuit device, if the exposure process has mixed cases of using the phase shift mask and of not using it, it is possible to stack the component layers of the semiconductor integrated circuit device in good condition, thereby improving the yield and reliability of the device.

(Embodiment 2)

Figure 27:
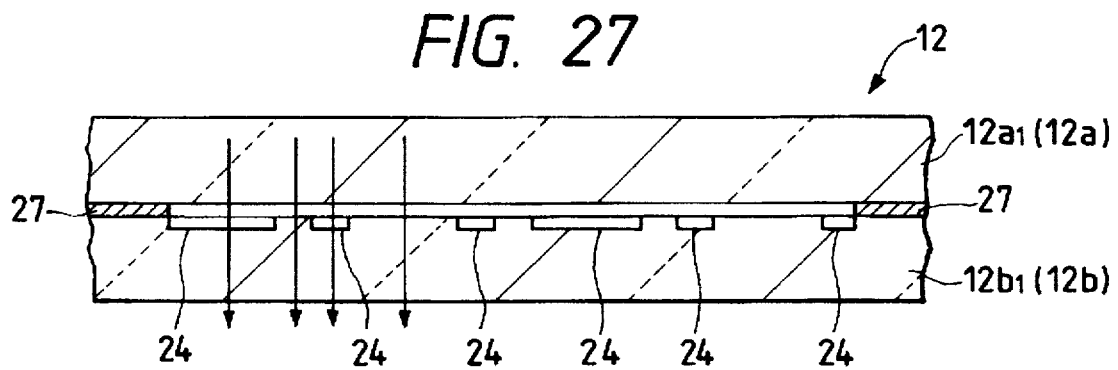
FIG. 27 is a cross-sectional view showing an essential portion of a further embodiment of the mask according to this invention.
Figure 28:
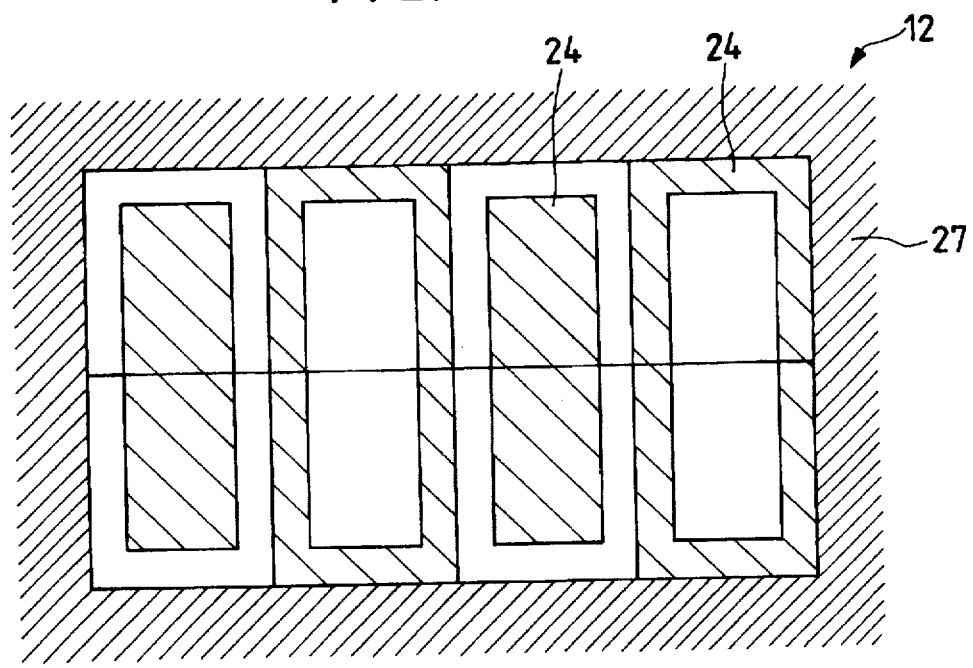
FIG. 28 is a plan view of the mask of FIG. 27.

FIG. 27 is a cross section showing an essential portion of another embodiment of the mask according to this invention. FIG. 28 is a plan view of the mask of FIG. 27.

The mask of the Embodiment 2 shown in FIGS. 27 and 28 represents the case in which the cyclically repeating pattern of the Embodiment 1 becomes denser, in which no light-shielding areas are interposed between adjacent light-transmitting areas and in which the light-shielding areas on the semiconductor wafer 14 (see FIG. 1) are formed by the phase difference of light beams produced by the phase shift pattern 24.

Hence, the first component mask 12a is a flat transparent glass substrate having a light-shielding film on its main surface that forms light-shielding areas used for pattern transfer. On the outer periphery of the stacked-layer mask 12 there is provided a light-shielding film 27 that forms the light-shielding areas. The peripheral part of the light-shielding areas is formed with mask blind light-shielding areas and positional alignment markings.

The second component mask 12b is formed with a phase shift pattern 24. The transfer pattern is repetitively formed along one direction of the mask substrate 12b1, and at the periphery of each of the transfer pattern is formed a pattern that defines the light-shielding areas on the semiconductor wafer 14. In FIG. 28, the phase shift pattern 24 is shown shaded with inclined lines for easy reading of the drawing.

It is noted, however, that the inclination of the shifter edge of the pattern of the second component mask 12b needs to be erect and the pattern stacking precision of the first and second component masks 12a, 12b should be 0.1 µm or less.

With this Embodiment 2, the similar effects as those of the Embodiment 1 can be obtained.

(Embodiment 3)

Figure 29:
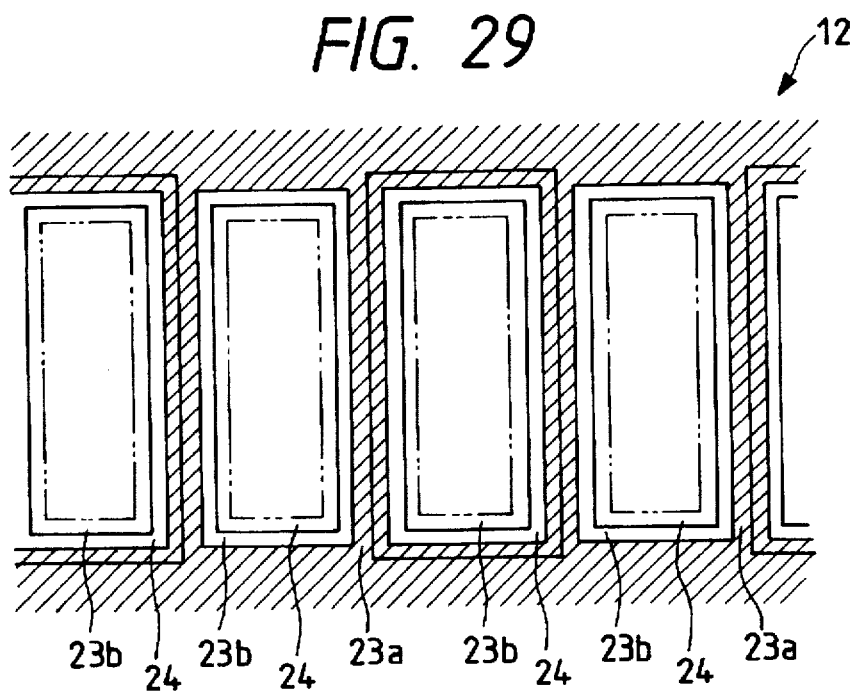
FIG. 29 is a plan view showing an essential portion of a further embodiment of the mask according to this invention.
Figure 30:
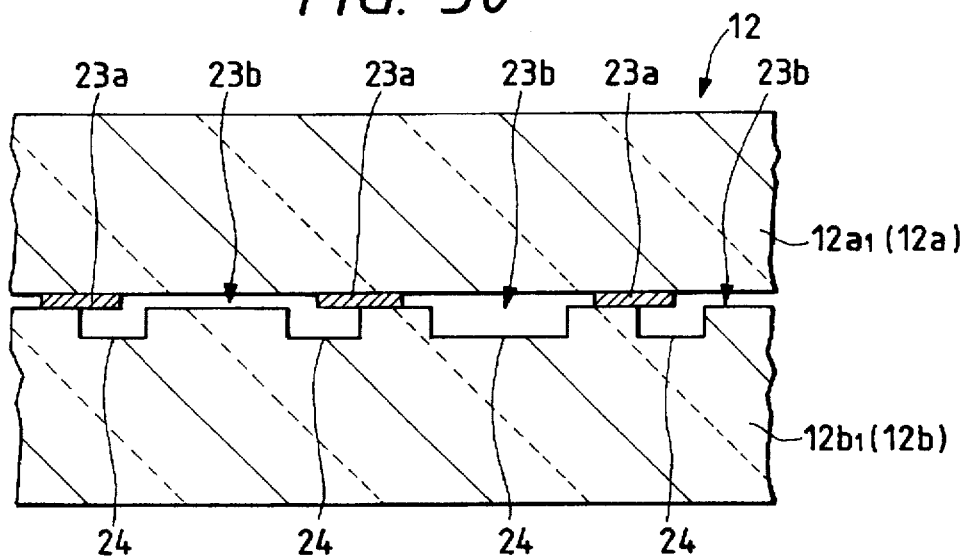
FIG. 30 is a cross section of the mask of FIG. 29.
Figure 31:
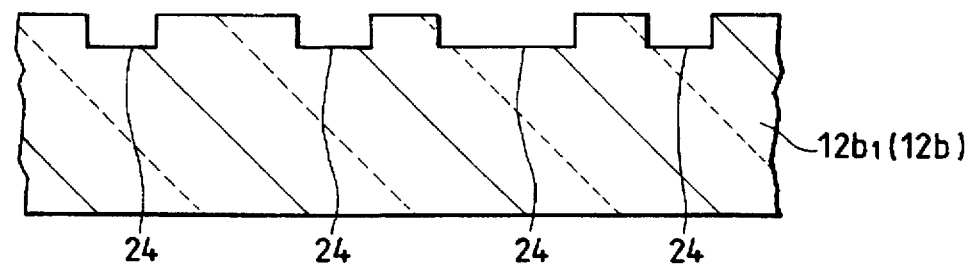
FIG. 31 is a cross section of the second component mask.

FIG. 29 is a plan view showing an essential portion of the mask as still another embodiment of this invention. FIG. 30 is a cross section of the mask of FIG. 29. FIG. 31 is a cross section of the second component mask.

The stacked-layer mask 12 of the Embodiment 3 shown in FIGS. 29 and 30 represents a case where, in a stacked-layer mask 12 having a cyclically repeating pattern of the Embodiment 2, the light-shielding areas 23a are provided between adjacent light-transmitting areas 23b.

The light-shielding film for forming the light-shielding areas 23a is formed on the main surface of the first component mask 12a. The second component mask 12b, as shown in FIGS. 30 and 31, is formed with the phase shift pattern 24 similar to the one used in the previous Embodiment 2.

The Embodiment 3 can achieve the similar effects to those of the Embodiment 1.

(Embodiment 4)

Figure 32:
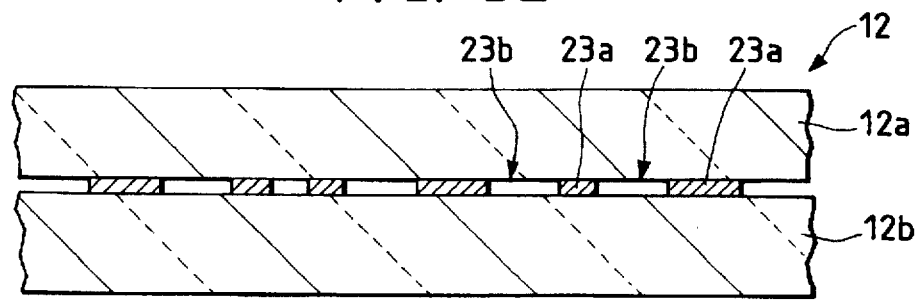
FIG. 32 is a cross section showing an essential portion of a further embodiment of the mask according to this invention.
Figure 33:
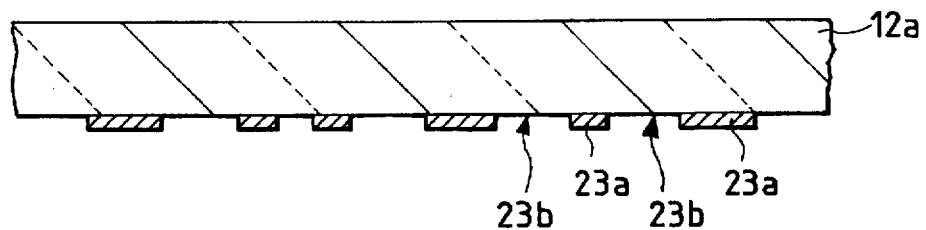
FIG. 33 is a cross section of the first component mask of FIG. 32.

FIG. 32 is a cross section showing an essential portion of the mask as a further embodiment of this invention. FIG. 33 is a cross section of the first component mask of FIG. 32.

The mask of the Embodiment 4 has a structure in which a flat transparent Glass substrate is in contact with and joined to the main surface of an ordinary mask which has no phase shift pattern. That is, in the Embodiment 4, as shown in FIGS. 32 and 33, the first component mask 12a is formed with ordinary light-shielding areas and light-transmitting areas that together form a semiconductor integrated circuit pattern. The second component mask 12b is a flat glass substrate with no phase shift pattern on its main surface.

Making the thickness of the second component mask 12b equal to the thickness of the second component mask 12b of the stacked-layer mask 12 of the previous Embodiment 1 obviates the need for correcting the position of the image plane, as required by the Embodiment 1, prior to the exposure process in the semiconductor integrated circuit device making. This is because when thickness of the second component mask 12b of the stacked-layer mask 12 with a phase shift pattern and the thickness of the second component mask 12b of the ordinary mask with no phase shift pattern are made equal, the positions of their image planes in the exposure process become equal.

In addition to the effects obtained with the Embodiment 1, this Embodiment 4 offers the following effects.

By putting the second component mask 12b made of a flat transparent glass substrate into contact with the main surface of the ordinary first component mask 12a with no phase shift pattern and joining them together, and by making the thickness of the second component mask 12b equal to the thickness of the second component mask 12b of the stacked-layer mask 12 of the Embodiment 1, the exposure process in the semiconductor integrated circuit device making no longer requires the correction of position of the image plane as is required with the Embodiment 1. This fourth embodiment therefore can reduce the exposure process time.

(Embodiment 5)

Figure 34:
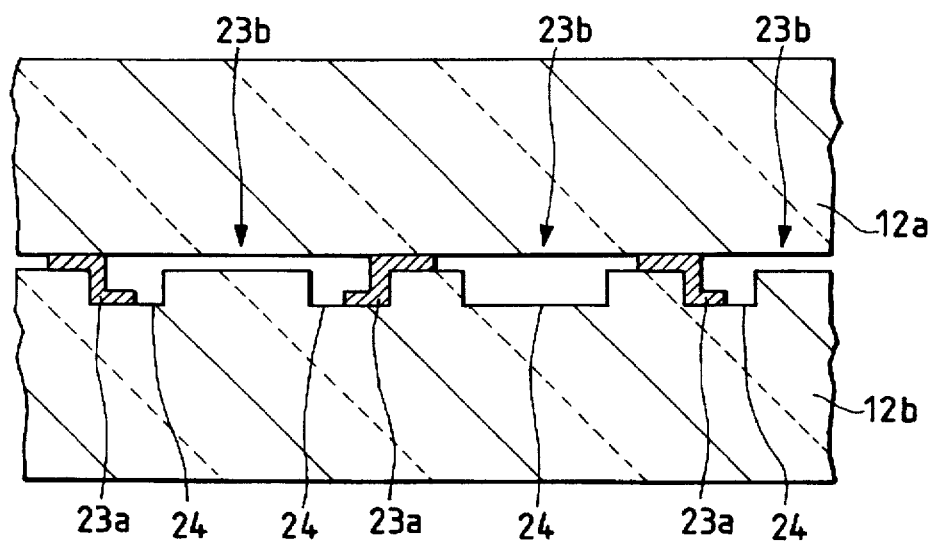
FIG. 34 is a cross section showing an essential portion of a further embodiment of the mask according to this invention.
Figure 35:
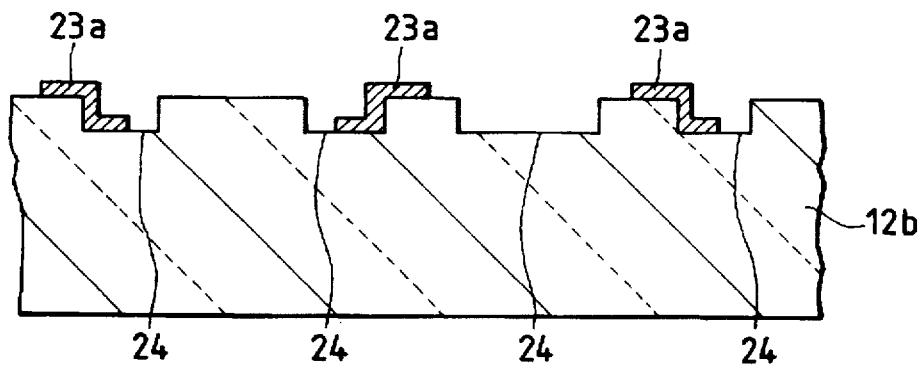
FIG. 35 is a cross section of the second component mask of FIG. 34.

FIG. 34 is a cross section showing an essential portion of the mask as a further embodiment of this invention. FIG. 35 is a cross section of the second component mask of FIG. 34.

The mask of the Embodiment 5 has a structure in which a glass substrate is placed in contact with and joined to the main surface of the phase shift mask. That is, as shown in FIGS. 34 and 35, the first component mask 12a is a flat transparent glass substrate whose main surface is not coated with a light-shielding film for forming light-shielding areas 23a. The second component mask 12b is formed with ordinary light-shielding areas 23a and light-transmitting areas 23b that together form a semiconductor integrated circuit pattern. The second component mask 12b is also formed with the phase shift pattern 24 that produces a phase difference in the transmitted light.

The Embodiment 5 can produce the similar effects to the (1) to (4) and (8) to (14) obtained with the Embodiment 1.

(Embodiment 6)

Figure 36:
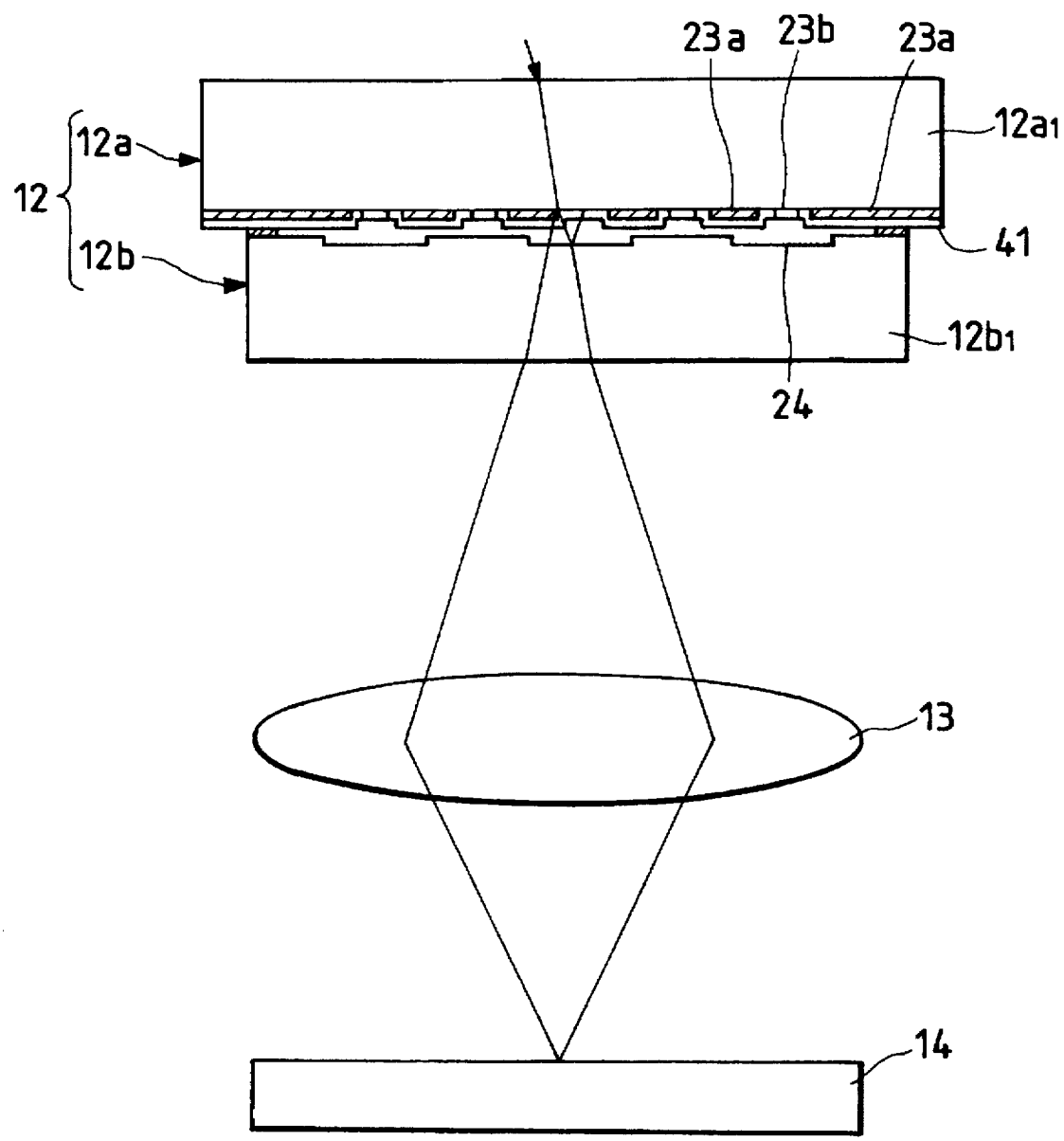
FIG. 36 is a schematic diagram showing a further embodiment of the mask according to this invention.

FIG. 36 is a schematic diagram showing a further embodiment of this invention. The technology employed in this Embodiment 6 can be applied to the masks of Embodiment 1 to 5 and also to those of Embodiment 7 to 11 described later.

In the Embodiment 6, as shown in FIG. 36, an anti-reflective film 41 is provided at least to one of the pattern forming surfaces of the first and second component masks 12a, 12b. In other respects, this embodiment is similar to the preceding Embodiment 1 to 5.

When both or one of the first and second component masks 12a, 12b fail to secure a sufficient flatness for the exposure light wavelength when these component masks are stacked together, there are variations in distance between the component masks, resulting in the transmitted beams of light being reflected between the opposing surfaces, causing interference between the reflected beams. The anti-reflective film 41 is provided to reduce this interference.

Because the provision of the anti-reflective film 41 can suppress the interference of transmitted beams at the facing surfaces of the first and second component masks 12a, 12b, the Embodiment 6 can reduce luminance variations on the semiconductor wafer 14 caused by the interference phenomenon.

The anti-reflective film 41 may be a water-soluble film made mainly of, for instance, polyvinyl alcohol. The thickness d of the anti-reflective film 41 is set to a value effectively close to $d=\lambda/(4n)$ where $\lambda$ represents the wavelength of the exposure light and n represents a refractivity of the film.

Such an anti-reflective film 41 is fabricated according to the mask fabrication method explained in the Embodiment 1, by forming a light-shielding area pattern on the mask substrate and then spin-coating the mask substrate with a water-soluble liquid whose main component is polyvinyl alcohol.

The fabrication process except for the coating of the anti-reflective film 41 is similar to that of Embodiment 1. That is, the relative positions of the first and second component masks 12a, 12b are aligned by the alignment markings 25a, 25b (see FIGS. 12 and 13), after which, as shown in FIG. 25, the component masks are stacked together with their main surfaces in contact.

The Embodiment 6 offers the following advantages.

(1) Because the anti-reflective film 41 provided between the contacting surfaces of the first and second component masks 12a, 12b can suppress the interference of the transmitted beams that would otherwise be caused by the opposing surfaces of the component masks, it is possible to reduce luminance variations on the semiconductor wafer 14 caused by the interference phenomenon.

(2) Because of (1), good pattern transfer is realized. This in turn improves yield and reliability of semiconductor integrated circuit devices.

(Embodiment 7)

Embodiments 7 to 11 of this invention are described in the following. As to the dimensions of individual members of these embodiments, members identical with those of the preceding Embodiment 1 to 6 have the same dimensions as shown in the Embodiment 1 to 6.

Figure 37:
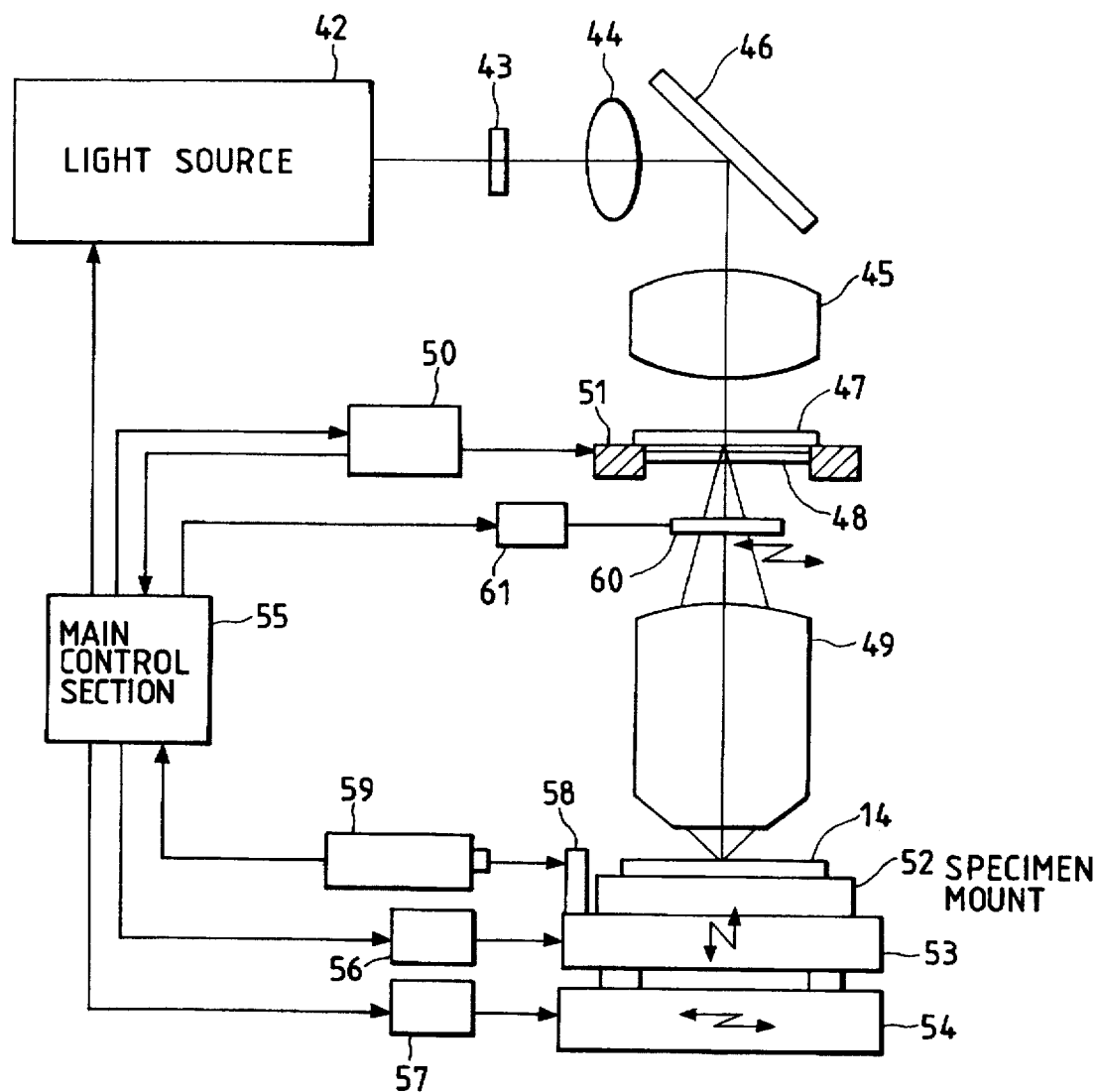
FIG. 37 is a schematic diagram showing the configuration of a further embodiment of a projection aligner according to this invention.

The configuration of the projection aligner that implements the pattern transfer method of the Embodiment 7 is described by referring to FIG. 37. Light emitted from a light source 42 is radiated against the mask through a fly eye lens 43, a group of condenser lenses 44, 45 and a mirror 46. The mask comprises a first component mask 47 and a second component mask 48. Patterns written on the component masks 47, 48 are projected onto the semiconductor wafer 14, a specimen substrate, through a projection lens 49. The component masks 47, 48 are placed on a mask stage 51 controlled by a mask position control means 50, with their centers and the optical axis of the projection lens 49 correctly aligned. The semiconductor wafer 14 is held on a specimen mount 52 by vacuum suction. The specimen mount 52 is placed on a Z stage 53 that can be moved in the optical axis direction of the projection lens 49 (i.e., in the Z direction) and is further mounted on an XY stage 54 that can be moved in the XY direction.

The Z stage 53 and the XY stage 54 are driven by their drive means 56, 57 in response to control commands from a main control unit 55 and hence can be moved to any desired exposure position. This position is precisely monitored by a laser measuring device 59 as the position of a mirror 58 fixed to the Z stage 53. The surface position of the semiconductor wafer 14 is measured by a focus position detection means used by an ordinary aligner. By driving the Z stage 53 according to the result of measurement, the surface of the semiconductor wafer 14 can be aligned with the image plane of the projection lens 49.

A transparent parallel flat plate 60 is inserted into or retracted from the exposure light path by a drive means 61. That is, the parallel flat plate 60 is removed from the exposure light path when the two component masks 47, 48 are mounted, and is inserted into the aligner when a conventional mask made up of a single component mask is mounted. This manipulation can correct changes in spherical aberration that are caused by the presence or absence of the second component mask, thereby keeping the surface of the semiconductor wafer 14 aligned with the specified image plane of the projection lens 49 at all times.

Figure 38:
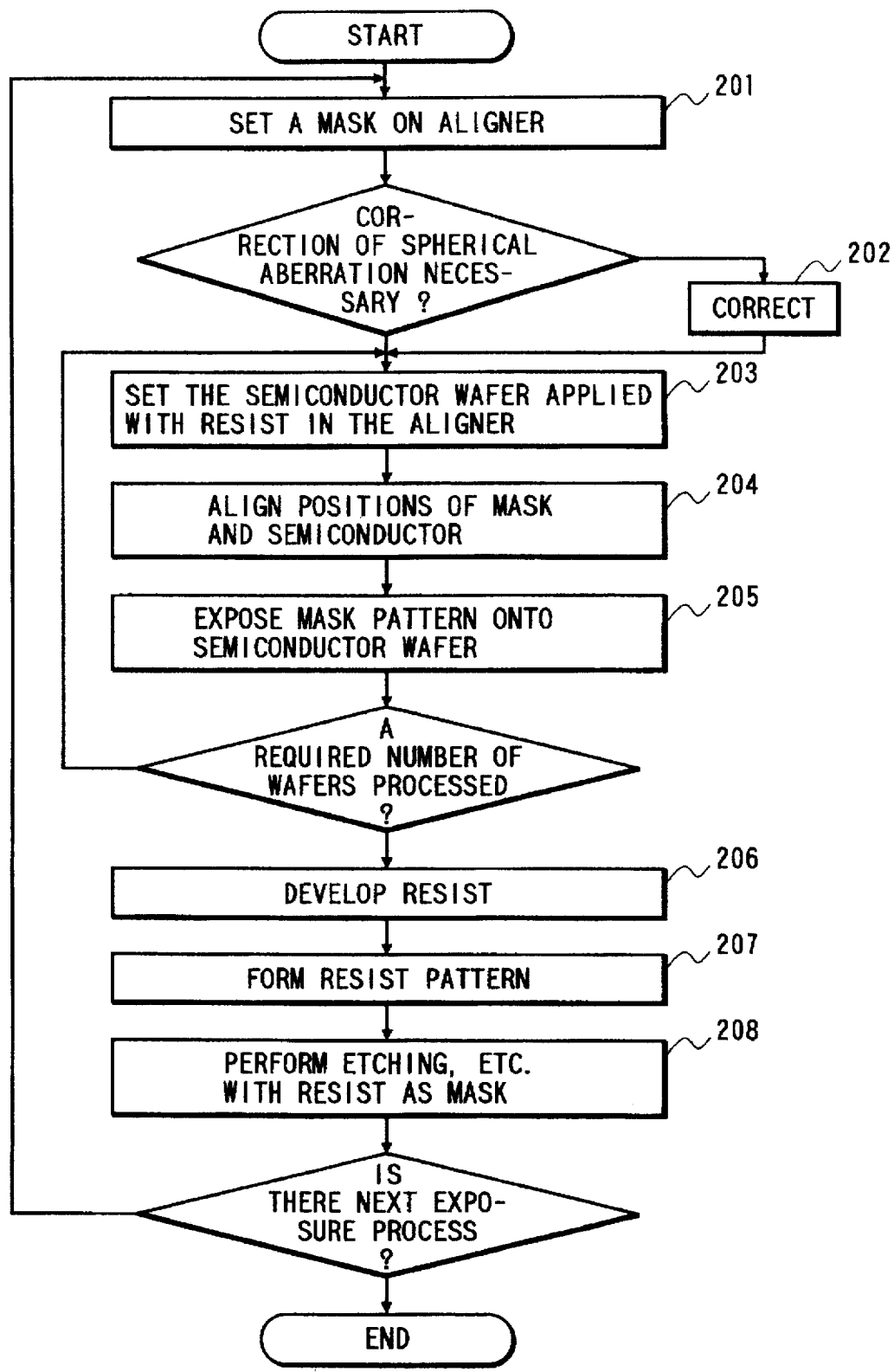
FIG. 38 is a flow diagram showing the process of manufacturing the semiconductor integrated circuit devices according to this invention.

The flow of semiconductor integrated circuit device manufacturing using the above-mentioned projection aligner is shown in FIG. 38. Step 201 is a mask loading process which sends to the main control unit 55 information on whether the mask to be used is a phase shift mask or a conventional mask. When the mask used is a phase shift mask of this invention, the correction of aberration of the optical system is not necessary. When the aberration correction is necessary, as when a conventional transmissive type mask or a conventional phase shift mask is used, the correction is done by step 202. Selection of this correction step allows the use of both the two-layer phase shift mask of this invention and the conventional single-layer mask.

Step 203 loads the semiconductor wafer 14 applied with a resist into the projection aligner. Step 204 aligns the positions of the mask and the semiconductor wafer 14 according to an ordinary alignment method. Step 205 exposes the mask pattern onto the semiconductor wafer 14. The steps 203, 204 and 205 are repetitively performed on a specified number of prepared semiconductor wafers. Step 206 is a development process to remove unwanted resist. Step 207 is a resist pattern forming process to perform baking and other processing after development. Step 208 performs etching on the surface of the semiconductor wafer substrate with the resist pattern used as a mask.

The above processes are repeated a required number of times by replacing the mask, and a desired semiconductor integrated circuit device was manufactured on the semiconductor wafer 14.

Figure 39A:
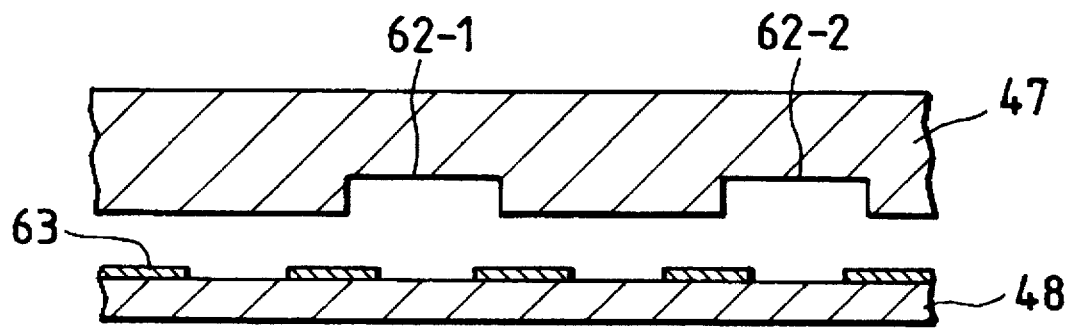
FIGS. 39(a,b) is a cross section showing the structure of a phase shift mask of the embodiment.
Figure 39B:
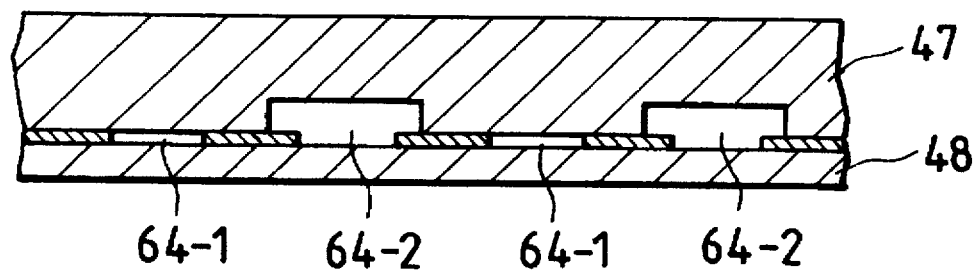

Next, the mask used in the Embodiment 7 is explained by referring to FIGS. 39(a) and 39(b).

The mask used in this embodiment, as shown in FIGS. 39(a) and 39(b), comprises a first component mask 47 having depressed patterns 62-1, 62-2 on its surface to give a phase difference of about 180 degrees to transmitted light beams and a second component mask 48 formed with a pattern of light-shielding areas 63 and light-transmitting areas 64-1, 64-2.

In the Embodiment 7, these first and second component masks 47, 48 are bonded together, with their pattern forming surfaces facing each other, so that exposure light passes the first component mask 47 first and then the second component mask 48. As shown in FIG. 37, the second component mask 48 is smaller than the first component mask 47 and the peripheral portion of the second component mask 48 is secured to the first component mask 47. Because the mask stage 51 supports the periphery of the first component mask 47, the pattern forming plane of the first component mask 47 is fixed at the same position in the optical axis direction as the surface of the mask stage 51.

The underside of the first component mask 47 is formed with depressed portions 62-1, 62-2 so that light beams passing through this component mask are given a phase difference of 180 degrees by the depressed and raised portions. The second component mask 48 is provided with a light-shielding film 63 and openings formed by partly removing the light-shielding film. The light-shielding film and the openings together form a pattern to be transferred. The stepped portions between the depressed and raised portions on the first component mask 47 are arranged to oppose the light-shielding areas of the second component mask 48.

Figure 56A:
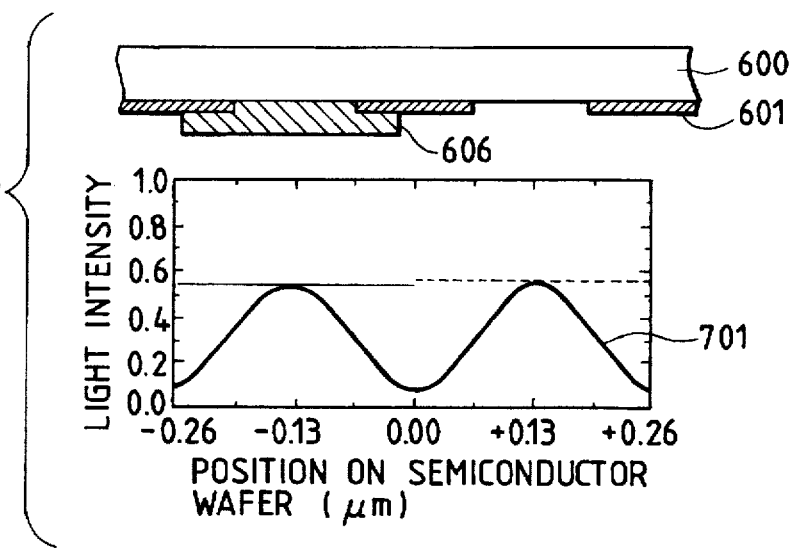
FIG. 56(a to c) are diagrams showing the structures of various phase shift masks and distributions of projection image light intensities obtained with these structures.
Figure 56B:
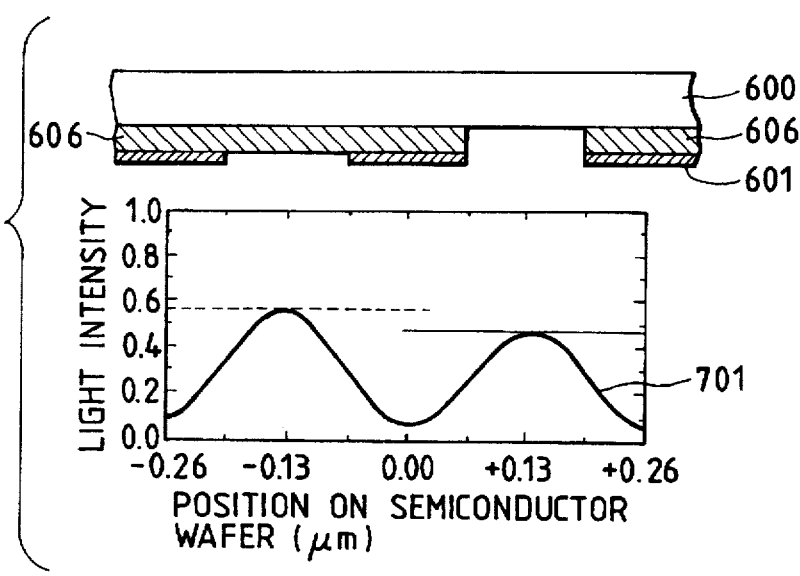
Figure 56C:
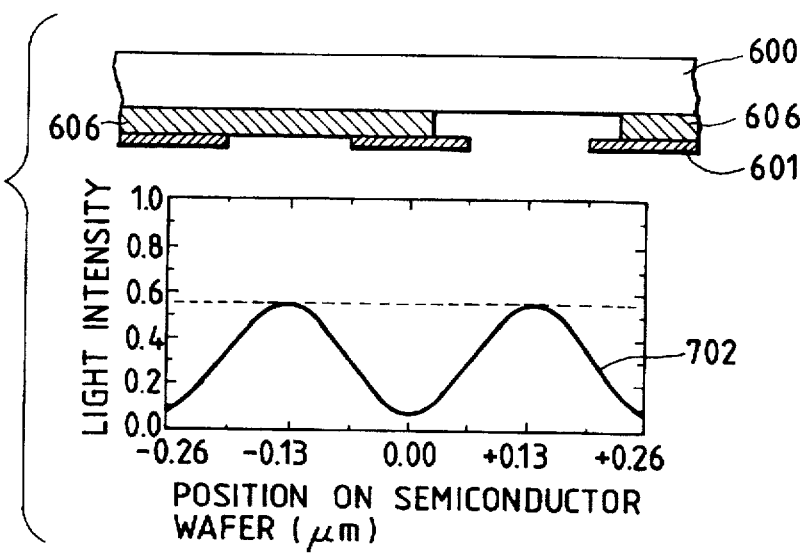
Figure 57A:
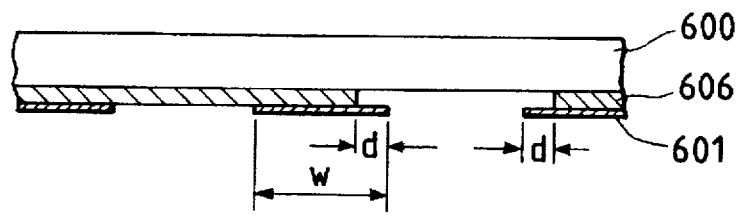
FIG. 57(a) is a diagram showing the structure of one phase shift mask of FIG. 56.
Figure 57B:
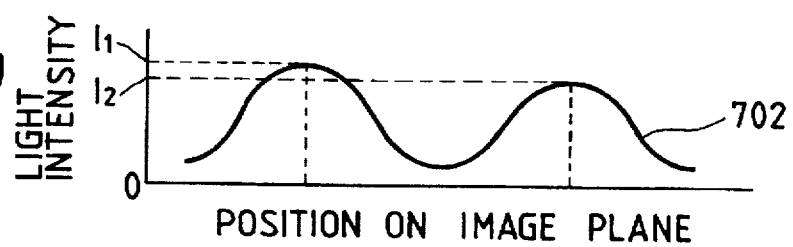
FIG. 57(b) is a light intensity distribution when the phase shift mask is used.
Figure 57C:
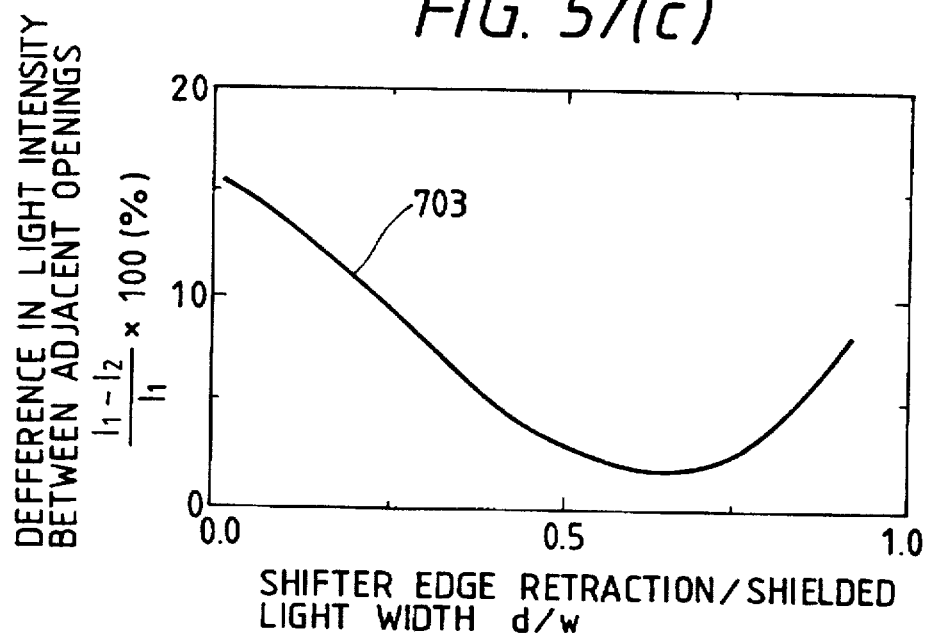
FIG. 57(c) is a graph showing the relation between a shifter edge retraction/shielded light width and a light intensity difference between adjacent openings.

As a result, the cross section of the mask pattern becomes identical with the structure shown in FIG. 56(c), improving the performance of pattern transfer. Further, the provision of the second component mask 48 solves the problem, experienced with the structure of FIG. 56(c), that the edge portion of the light-shielding film is not supported in stable condition. At the same time, because the pattern forming surface is sandwiched by mask substrates, foreign matters and dust, if they adhere to the mask, are out of focus and thus unlikely to be transferred.

Figure 40:
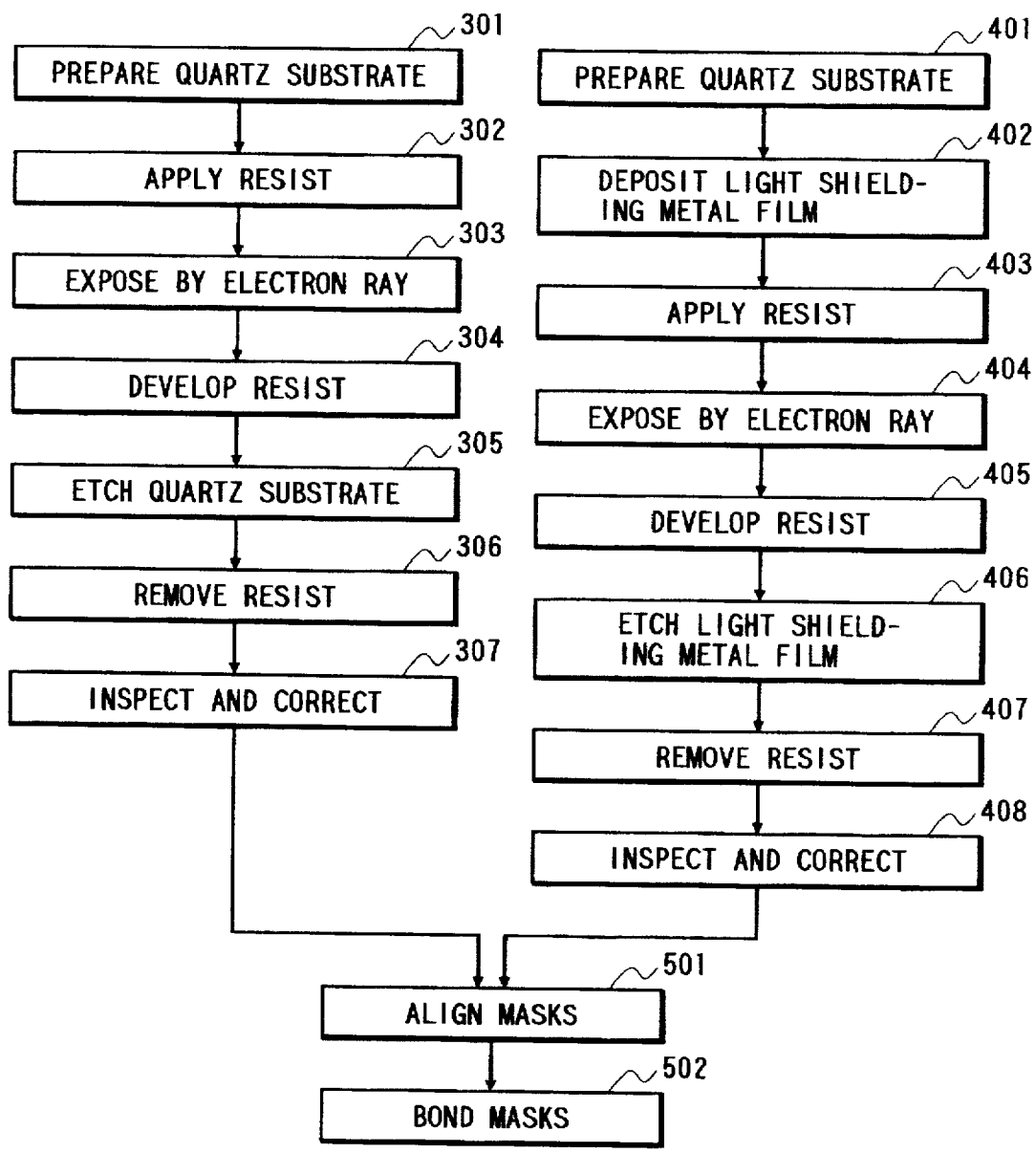
FIG. 40 is a flow diagram showing the process of manufacturing the phase shift mask of the embodiment.

FIG. 40 shows the process of making the above-mentioned mask. As shown, the first component mask 47 and the second component mask 48 are prepared separately as independent masks.

In FIG. 40 and FIGS. 41(a) to 41(e), step 301 is a process of making a synthetic quartz substrate as a first component mask substrate 65; step 302 is a resist coating process whereby the synthetic quartz substrate is coated with a resist 66 and a charge prevention thin conductive film 67 by spin coating; step 303 is an electron beam exposure process whereby the coated resist film is exposed; step 304 is a resist development process whereby, after the conductive film 67 has been removed, unwanted parts of the resist 68-1, 68-2 are removed to form a pattern; step 305 is a quartz substrate etching process whereby the areas 69-1, 69-2 on the first component mask substrate is etched with the resist pattern used as a mask; step 306 is a resist removing process whereby the resist is removed from the entire surface; and step 307 is an inspection and correction process to check and correct flaws of the first component mask that have undergone these processes.

Figure 41A:
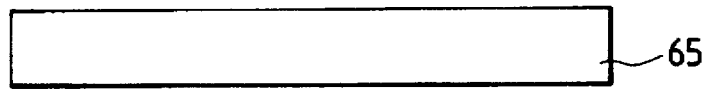
FIGS. 41(a to e) is a manufacture process diagram for the first component mask making up the phase shift mask of the embodiment.
Figure 41B:
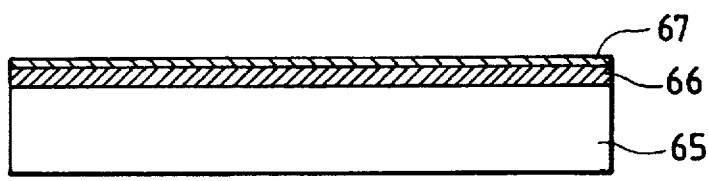
Figure 41C:
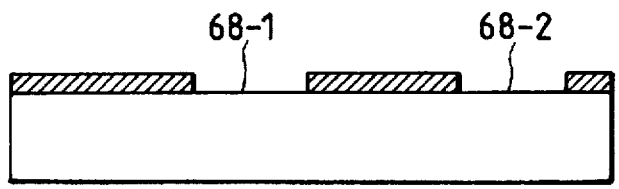
Figure 41D:
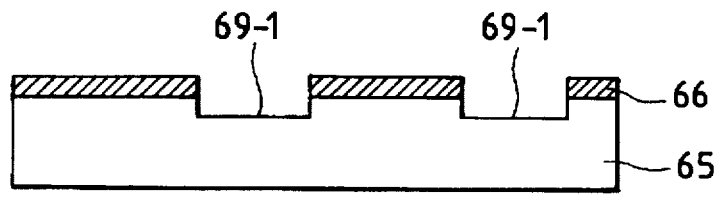
Figure 41E:

With these processes completed, the first component mask 47 shown in FIG. 41(e) is obtained.

Likewise, in FIG. 40 and FIGS. 42(a) to 42(f), step 401 is a process of making a synthetic quartz substrate as a second component mask substrate 70; step 402 is a metal light-shielding film deposition process whereby a chromium (Cr) film 71 as a light-shielding film is deposited over almost the entire surface of the synthetic quartz substrate; step 403 is a resist coating process whereby a resist 72 is spin-coated over the Cr film; step 404 is an electron beam exposure process whereby the coated resist film is exposed; step 405 is a resist development process whereby unwanted parts of the resist 73-1, 73-2, 73-3, 73-4 are removed to form a pattern; step 406 is a metal light-shielding film etching process whereby the areas 74-1, 74-2, 74-3, 74-4 in the Cr film are etched with the resist pattern used as a mask; step 407 is a resist removing process to remove the resist from the whole surface; and step 408 is an inspection and correction process to check and correct flaws of the second component mask that has undergone these processes.

Figure 42A:
FIGS. 42(a to f) is a manufacture process diagram for the second component mask making up the phase shift mask of the embodiment.
Figure 42B:
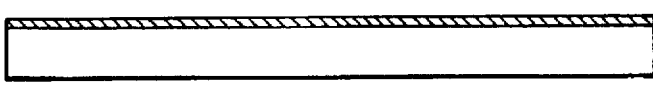
Figure 42C:
Figure 42D:
Figure 42E:
Figure 42F:

With the above processes, the second component mask 48 shown in FIG. 42(f) is produced.

Next, the first and second component masks fabricated independently as described above are stacked and aligned by a mask alignment process 501 and then bonded together by a mask bonding process 502 to complete the two-layer mask.

The depth d to which the areas 69-1, 69-2 of the first mask substrate are etched is expressed as $d=\lambda/2(n-1)$ where $\lambda$ represents the wavelength of light used to transfer the mask pattern onto the semiconductor wafer and n represents a refractivity of the first component mask substrate. This depth produces a phase difference of 180 degrees.

Considering the exposure of i beam, the etch depth is set to $d=0.38$ μm. While this embodiment formed the depressed and raised portions for giving a phase difference by etching the substrate, these uneven portions may be formed by partly adding to the substrate a transparent thin film having a refractivity similar to that of the substrate, or by depositing the transparent substrate over the entire surface of the substrate and partly removing it. These methods of course produce the same effects as long as the condition $d=\lambda/2(n-1)$ is satisfied.

In FIG. 39 showing one example of a completed mask, the beams that have passed through the openings 64-1 and 64-2 have a phase difference of 180 degrees produced by the first component mask 47. As shown in the figure, because the stepped portions at the boundary between the depressed and raised portions of the first component mask 47 are arranged to come within the light-shielding areas of the Cr film on the second component mask 48, the beams of light scattered by the stepped portions are blocked by the Cr film, allowing only those light components of high contrast to be exposed onto the semiconductor wafer.

Figure 43A:
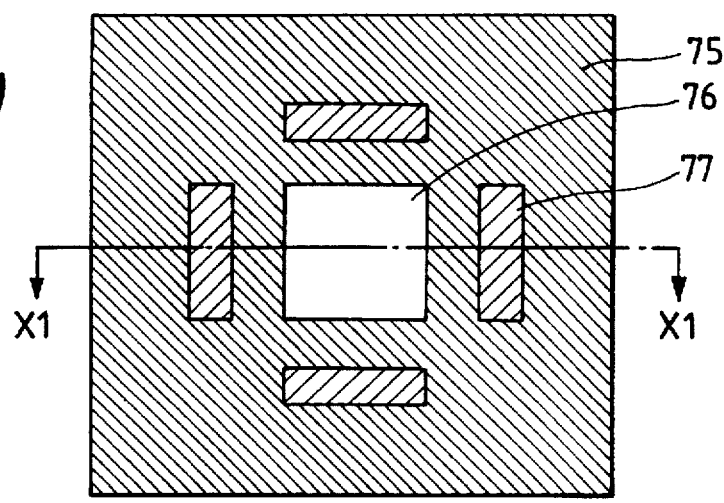
FIGS. 43(a,b) is a schematic diagram showing a case in which the phase shift mask of this embodiment is applied to the transfer of an isolated pattern.
Figure 43B:
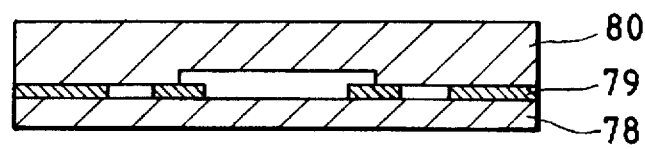

FIG. 43(a) is a plan view of the mask pattern for forming isolated contact holes. FIG. 43(b) is a cross section of the mask taken along the line X1—X1 of FIG. 43(a). In both figures, a light-shielding area 75, a main opening 76 and auxiliary openings 77 are defined by presence or absence of a chromium film 79 on the second component mask 78. The stepped portions between the depressed and raised portions on the surface of the first component mask 80 is located intermediate between the main opening 76 and the auxiliary openings 77 when they ere stacked. The width of the auxiliary openings 77 is such that the auxiliary openings alone cannot form a resist pattern on the semiconductor wafer. Because the auxiliary opening has a phase difference of 180 degrees with respect to the main opening 76, it emphasizes the projected image of the main opening 76, improving the hole pattern forming performance.

Figure 44:
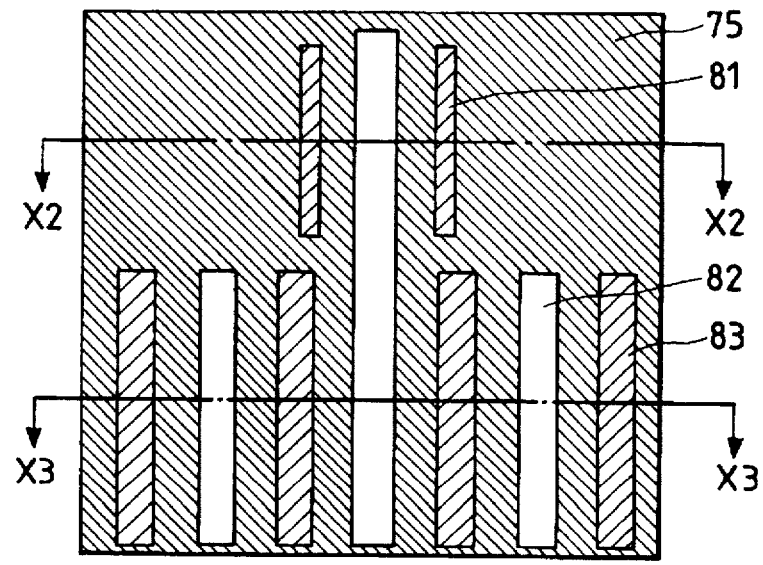
FIG. 44 is a schematic diagram showing another case in which the phase shift mask of this embodiment is applied.

FIG. 44 represents an example pattern consisting of a cyclic pattern and an isolated pattern. Denoted 81 is an auxiliary pattern, whose cross section taken along the line X2—X2 is similar to FIG. 43(b). Opening patterns 82 and 83, when the first and second component masks are stacked together, produce a phase difference of 180 degrees. The mask cross section taken along the line X3—X3 has the structure shown in FIG. 39(b).

The stacking of the first and second component masks in the above exposure process is done as follows. Both of these component masks are provided with alignment markings and the diffracted image of the combined alignment markings is detected to align the positions of the component masks. The markings used are shaped in accordance with Japan Patent Laid-Open No. 361521/1992. The shape of the alignment marking is not limited to this. The first component mask may use as an alignment marking a depressed/raised pattern such as a groove and the second component mask a variety of shapes of opening formed in a light-shielding film.

Figure 45:
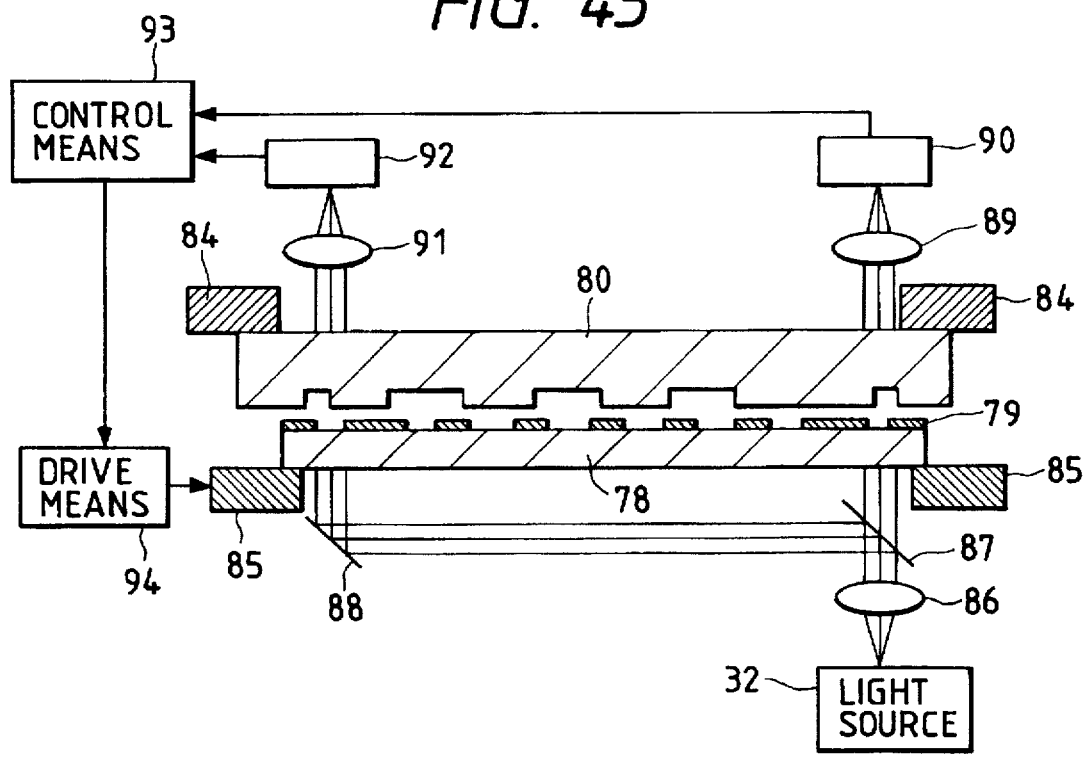
FIG. 45 is a schematic diagram showing a means to stack the first and second component masks in fabricating the phase shift mask of this invention.

In FIG. 45, designated 80 is a first component mask, 78 a second component mask having a Cr film 79, 84 a holder to hold the first component mask by vacuum suction, and 85 a holder to hold the second component mask by vacuum suction. Detection light emitted from a light source is transformed into parallel beams by an illuminating optical system 86 such as a condenser lens, after which the parallel beams are split by a beam splitter 87.

One half of the split beams is thrown directly onto one alignment marking and the other half is deflected by a mirror 88 and radiated against the other alignment marking. One detection beam that has passed through the mask forms a detection image on an image sensor 90 through the focusing lens 89. The other detection beam forms a detection image on an image sensor 92 through a focused lens 91. A control means 93 checks the detected images and, according to the check result, drives the holder 85 by a holder drive means 94 in three-axis directions to stack and align the first and second component masks. The second component mask 78 is made smaller than the first component mask 80 to bond the peripheral portion of the second component mask 78 to the surface of the first component mask 80.

Figure 46:
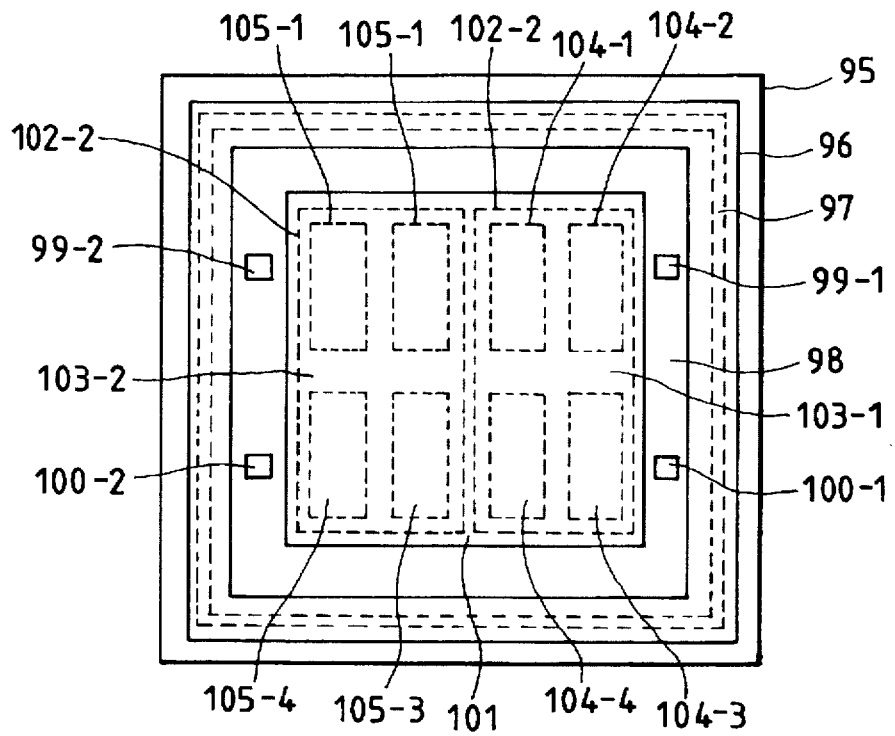
FIG. 46 is a schematic diagram showing an example layout of the mask used for transfer of a pattern of semiconductor integrated circuit devices.

The plan view layout of the mask having a memory integrated circuit pattern which was fabricated by the above method is shown in FIG. 46.

In FIG. 46, reference numeral 95 represents a frame of the first component mask, 96 a frame of a second component mask, and 97 a bonding portion between the first and second component masks. Denoted 98 is a chromium light-shielding strip; 99-1 and 99-2 markings for position alignment between the mask and the semiconductor wafer to which the mask pattern is to be transferred; 100-1 and 100-2 markings for position alignment between the first component mask and the second component mask; 101 a part that corresponds to a scribe line on the semiconductor wafer; 102-1 and 102-2 parts that correspond to unit chip areas on the semiconductor wafer; 103-1 and 103-2 parts that correspond to peripheral circuit areas of memory circuit devices; and 104-1 to 104-4 and 105-1 to 105-4 parts that correspond to memory mats of the memory circuit devices.

The mask thus manufactured was mounted in the reduction projection aligner of FIG. 1 to expose the mask pattern onto the semiconductor wafer 14 coated with a photoresist. The exposure process shown in FIG. 38 and the subsequent processes of resist development and other processes were repeated a required number of times to produce a desired pattern. As a result, a microfine pattern was formed by using interference of beams of light passing through the mask, and highly integrated memory circuit devices were fabricated.

Figure 47A:
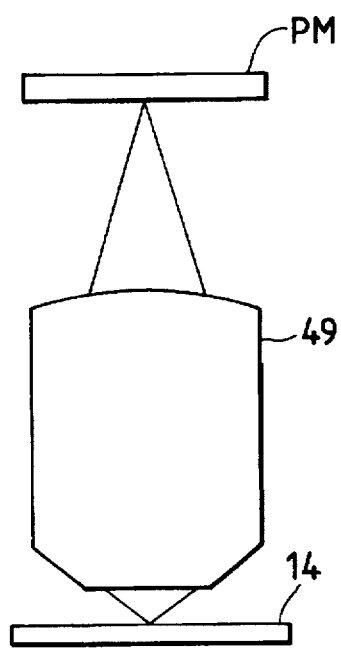
FIGS. 47(a,b) is a schematic diagram explaining a phenomenon in which a spherical aberration occurs in the projection aligner optical system.
Figure 47B:
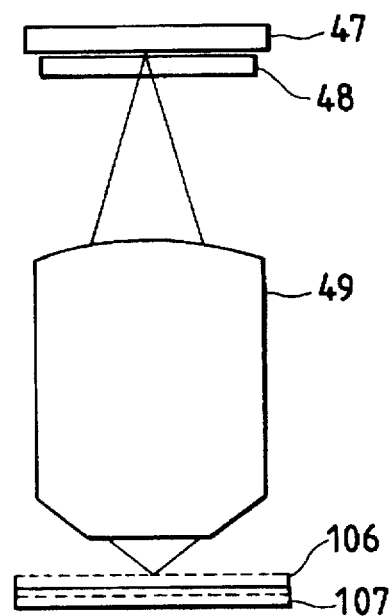

Examination of the image forming relationship between the mask pattern surface and the specimen substrate surface has found that the difference between a case where a phase shift mask consisting of the first component mask 47 and the second component mask 48 is used as shown in FIG. 47(b) and a case where a conventional mask PM is used as shown in FIG. 47(a) is whether there is the second component mask substrate between the pattern surface and the specimen substrate surface.

When, for example, a transparent parallel flat plate with a thickness t is inserted as the second component mask into the image forming optical system, the optical focus position moves from 106 to 107 in FIG. 47(b). The focus displacement is approximated as (1−n/n')t where n and n' are refractivities of air and the parallel flat plate. In more strict terms, a spherical aberration occurs which is proportional to the square of an angle between the beam and the exposure light axis. Explanation of this phenomenon is found, for example, in "Kogaku (Optics)" by Hiroshi Kubota (published by Iwanami Shoten), page 128–130.

In the projection aligner of this invention, on the other hand, the projection lens 49 is designed optimumly assuming the use of the phase shift mask consisting of the first component mask 47 and the second component mask 48, and the pattern transfer is performed by utilizing light interference.

Figure 48:
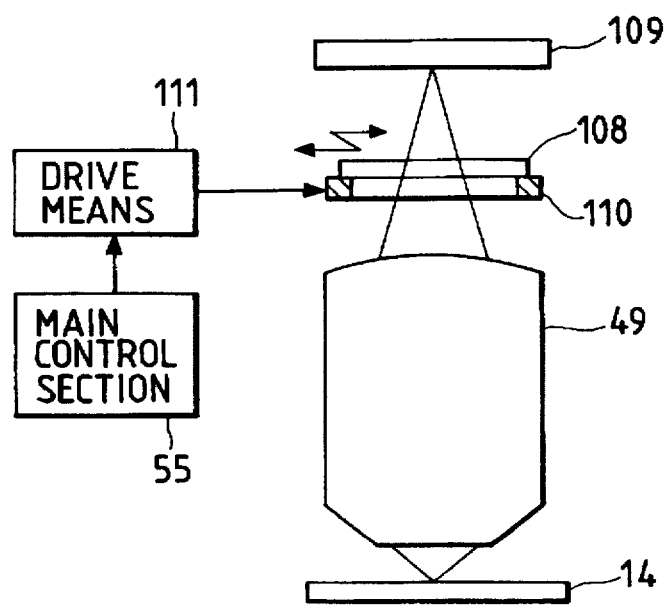
FIG. 48 is a schematic diagram showing a first means to correct the spherical aberration of FIG. 47.

When a conventional mask is used, a transparent parallel flat plate 108 is inserted between the mask 109 and the projection lens 8 as a means to correct spherical aberration caused by the lack of the second component mask 48, as shown in FIG. 48. The parallel flat plate 108 is mounted on the holder 110, which is driven by a drive means 111 to insert the parallel flat plate and thereby prevent a shift in the focus position.

This manipulation is performed by the main control unit 55 so that the position of the specimen substrate surface in the optical axis direction can be kept at the same position whether the mask uses the phase shift mask made up of the first and second component masks or the conventional mask.

This makes it possible to use the phase shift mask comprising the first and second component masks for the transfer of microfine patterns and the conventional mask for the transfer of not so fine patterns, thereby forming a desired pattern on the semiconductor wafer 14 and fabricating optimal semiconductor integrated circuits.

(Embodiment 8)

Figure 49:
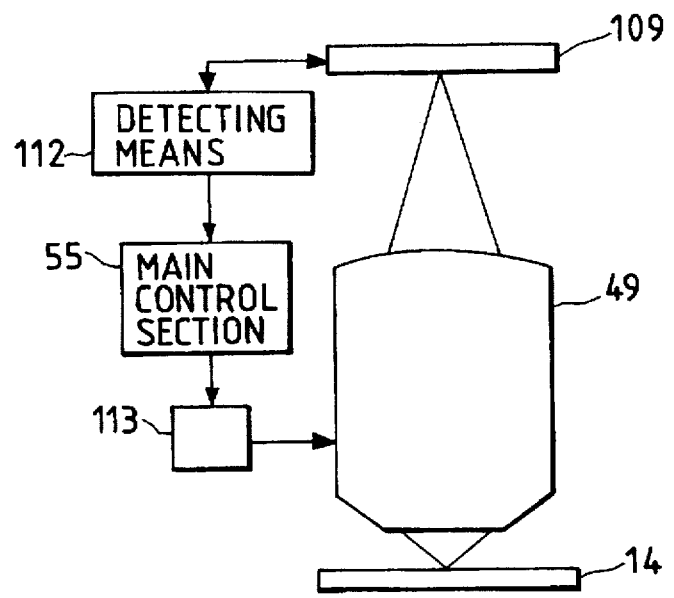
FIG. 49 is a schematic diagram showing a second means to correct the spherical aberration of FIG. 47.

FIG. 49 shows the configuration of another projection aligner that realizes the pattern transfer method of this invention. This figure omits the parts identical with those of FIG. 37 and shows only the optical system and the spherical aberration correction means installed between the mask 109 and the semiconductor wafer 14.

The mask used, the process of mounting the mask and the process of preparing the semiconductor wafer are identical with those of the Embodiment 7. In the Embodiment 8, a sensing means 112 checks whether the mask 109 mounted is a phase shift mask of this invention or a conventional mask and sends to the main control unit 55 information on whether the correction of spherical aberration of the projection lens 49 is necessary or not. When the spherical aberration correction is found necessary, at least one of lens elements making up the projection lens 49 is moved in the direction of optical axis by a projection lens aberration correcting means 113 to correct the aberration.

Actual correction procedure varies according to the configuration of the lens. A variety of correction methods are possible. Among them are a method that automatically replaces the lens element and the one that changes the pressure in particular regions. These correction methods allow the pattern transfer without inserting or withdrawing the transparent parallel flat plate 108 of FIG. 48 used in the Embodiment 7. By using the aligner and the phase shift mask of this invention, a desired semiconductor integrated circuit device was able to be manufactured on the semiconductor wafer 14.

(Embodiment 9)

An example of manufacturing the semiconductor integrated circuit device is described as a further embodiment of this invention. FIGS. 50(a) to 50(e) are cross sections showing a part of the process of making a phase shift mask and a semiconductor integrated circuit device.

Figure 50A:
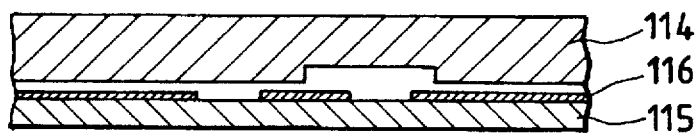
FIGS. 50(a to e) is a process diagram showing the process of manufacturing semiconductor integrated circuit devices by using the mask of this invention.
Figure 50B:
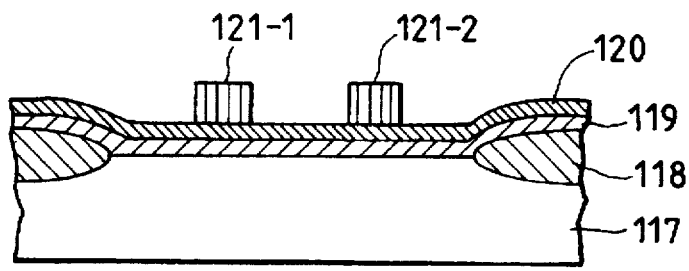

As shown in FIG. 50(a), a first component mask 114 has depressions and bulges for producing a phase shift of 180 degrees. A light-shielding film 116 of a second component mask 115 is provided with two openings. A p-type substrate 117 is deposited with a field oxide film 118 by an ordinary method and further formed with an oxide film 119 and a polysilicon film 120. After this, the wafer is coated with a photoresist and then subjected to an exposure and development process using the mask of FIG. 50(a) to form resist patterns 121-1, 121-2 as shown in FIG. 50(b).

Figure 50C:
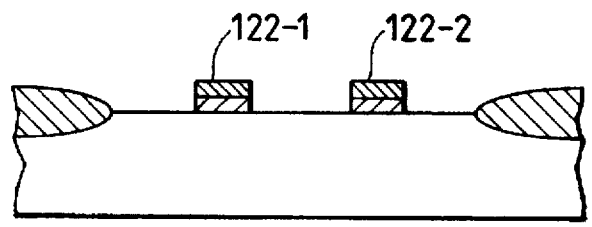

Then, with the resist patterns 121-1, 121-2 as a mask, the oxide film 119 and the polysilicon film 120 are dry-etched, and the resist is removed to form poly Si/SiO$_2$ gates 122-1, 122-2, as shown in FIG. 50(c).

Figure 50D:
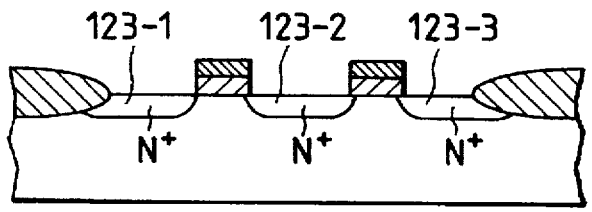
Figure 50E:
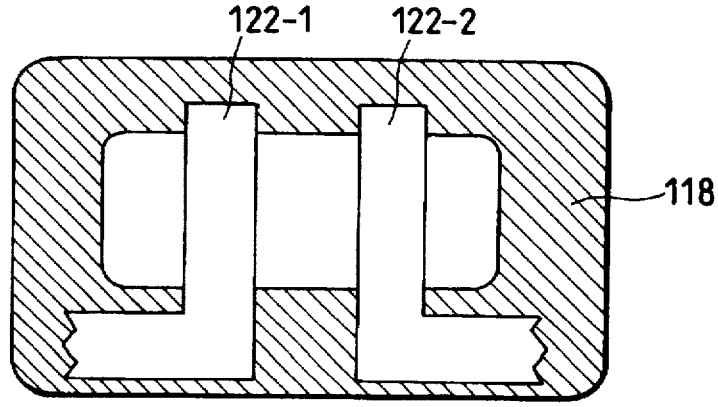

After this, the wafer is ion-implanted to form highly concentrated N$^+$ layers 123-1, 123-2, 123-3 as shown in FIG. 50(d). FIG. 50(e) is a plan view of the gates thus formed. The difference in width between the two gates 122-1 and 122-2 needs to be made as small as possible. The use of the mask of this invention makes equal the light intensities of projection images of the two openings, which allows these gates to be formed with high precision.

(Embodiment 10)

Figure 51A:
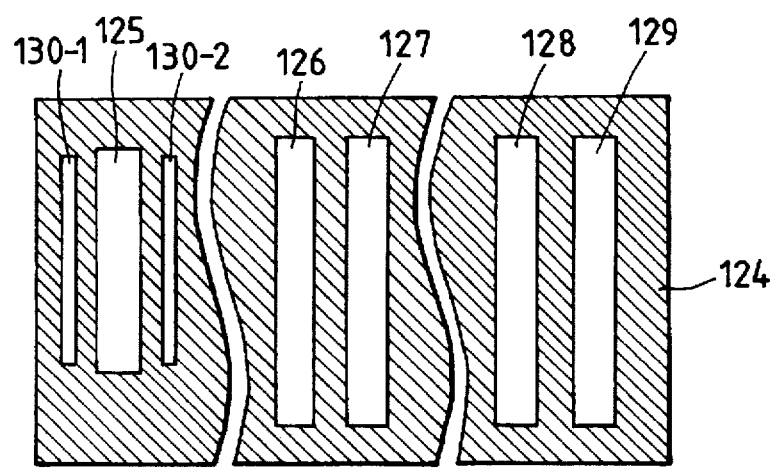
FIGS. 51(a,b) is a schematic diagram showing how a pattern is transferred onto a stepped substrate by using masks with different phase differences.
Figure 51B:
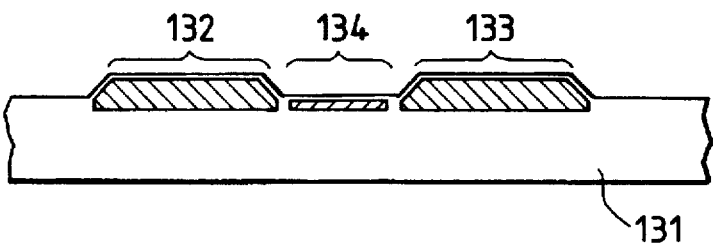

FIGS. 51(a) and 51(b) show a phase shift mask and a specimen substrate as a further embodiment of this invention. The pattern transfer uses the above-mentioned projection aligner, which is not shown here.

FIG. 51(a) shows a part of the layout of the mask pattern, and FIG. 51(b) shows a schematic cross section of the specimen substrate, such as semiconductor wafer, having depressed and raised portions on its surface. In these figures, designated 124 is a light-shielding area provided over the second component mask; 125-129 light-transmitting areas corresponding to parallelly arranged interconnects; and 130-1 and 130-2 auxiliary patterns.

Areas 132, 133 on the specimen substrate 131 are memory mats formed of 3-dimensional capacitors. An area 134 represents a peripheral circuit. Normally, they have an average vertical difference of 0.5–1 µm.

The first component mask is provided with depressions and bulges to give a phase shift. In this embodiment, different phase shifts are produced according to the depressed and raised portions on the surface of the specimen substrate. That is, the auxiliary patterns 130-1, 130-2 corresponding to the light-transmitting portion 125 are given a phase shift of 180 degrees, a light-transmitting portion 127 is given a phase shift of 200 degrees, greater than 180 degrees, and a light-transmitting portion 129 is given a phase shift of 180 degrees. As a result, an optimal image forming plane moves according to the phase shifts, allowing a latent image of mask patterns to be formed on the surface of the specimen substrate 131. The phase shift may be set either greater or smaller than 180 degrees according to the depression and bulges of the surface of the specimen substrate.

The use of the phase shift mask of this invention allowed easy and precise control of different phase shifts even when stepped portions due to depressions and bulges are formed on the specimen substrate, such as semiconductor wafer, during the semiconductor integrated circuit making process. This in turn enabled a clear pattern to be formed on the stepped surfaces of the substrate according to the vertical differences of the stepped portions, thereby fabricating a desired semiconductor integrated circuit device.

(Embodiment 11)

Figure 52:
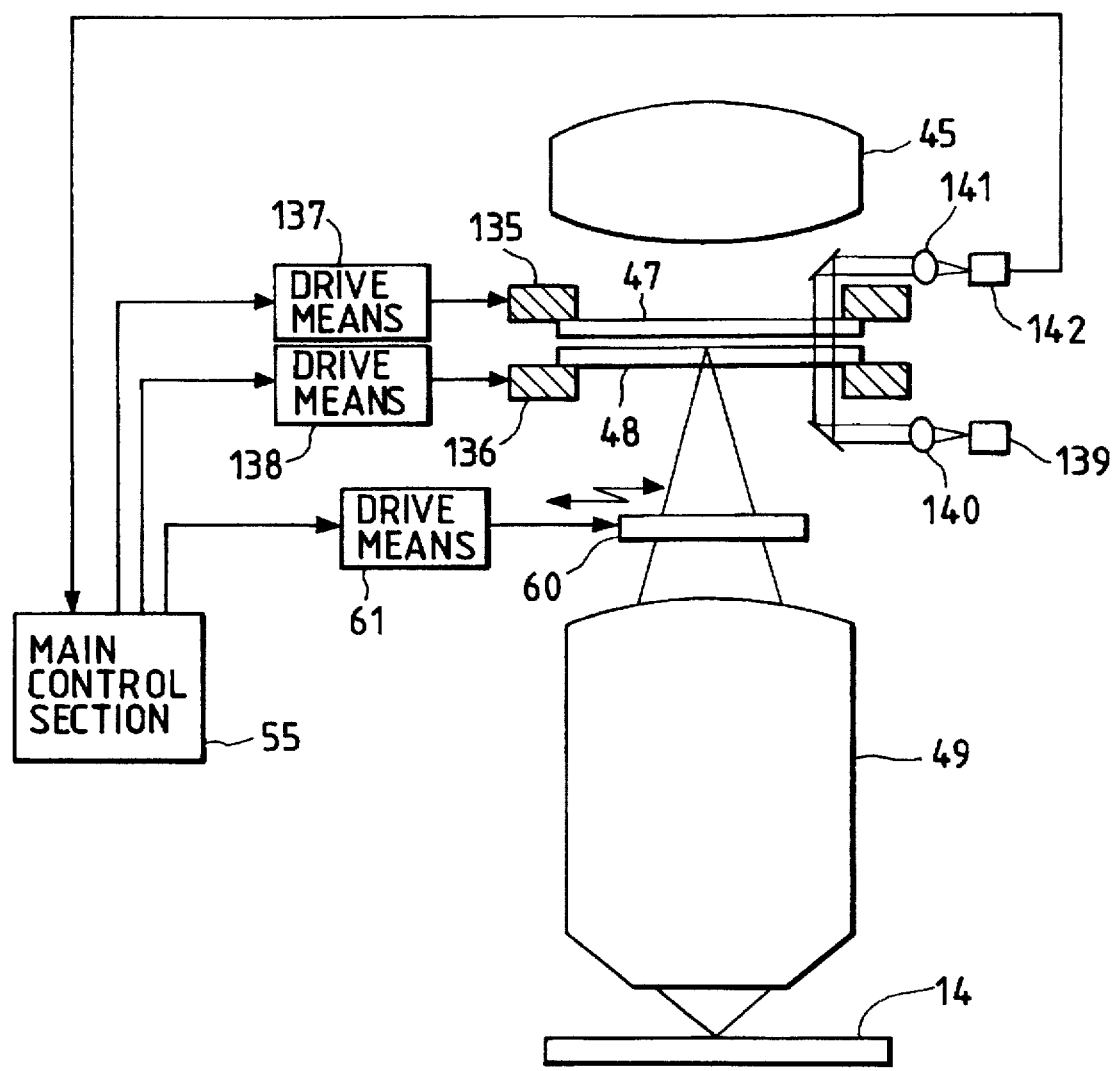
FIG. 52 is a schematic diagram showing an example configuration of the projection aligner with a means to make position alignment between the first and second component masks.

FIG. 52 shows the configuration of another projection aligner that implements the pattern transfer method of this invention. The figure omits parts identical with those of FIG. 37 as much as possible and illustrates the positional relation among a condenser lens 45, an optical system installed between component masks 47, 48, and a spherical aberration correction means. The mask used comprises a first component mask 47 and a second component mask 48 combined, as described above.

What differs from the preceding embodiments is that the projection aligner of this embodiment can align the two component masks on the mask stage of the aligner.

The first component mask 47 is fixed to the stage 135 and the second component mask 48 to the stage 136. By making fine adjustment of the stages 135, 136 by drive means 137, 138, the mask positions are aligned. The alignment is done by detecting the positions of alignment markings provided to the component masks and adjusting the stages 135, 136 according to the detection result.

That is, the detection light emitted from a light source 139 is radiated against the alignment markings on the two component masks through a lens 140. The detection beam that has passed through the masks forms a detection image on an image sensor 142 through a lens 141. Mask position information obtained from this image is fed to a control unit 55, which, according to the information given, drives the drive means 137, 138. Then, after having been aligned, the first and second component masks 47, 48 are fixed immovable and the pattern on the mask is transferred onto the semiconductor wafer 14 through the projection lens 49.

When a conventional single-layer mask with no second component mask 48 is used, a transparent parallel flat plate 60 is inserted on the exposure light axis to correct the spherical aberration as in the case of the first embodiment. The same resolution performance was obtained when a dummy transparent parallel plate was mounted as the second component mask on the mask stage 136. In this case, the transparent parallel flat plate 60 and its drive means 61 need not necessarily be used.

By using the projection aligner of the above construction and by using the phase shift mask made up of the first and second component masks and the conventional mask in combination, a desired semiconductor integrated circuit device was able to be fabricated with high precision and high throughput on the semiconductor wafer 14, without requiring a process of aligning the two component masks.

The present invention has been described in detail in conjunction with embodiments. It is noted that the invention is not limited to the foregoing Embodiment 1 through 11 and that various modifications may be made without departing from the spirit of the invention.

For example, although in the Embodiment 1 to 3 and 5 the phase shift pattern is formed as a groove, it may be formed by using a transparent film. In that case, the transparent film may be formed of an SOG (spin on glass) film.

Figure 53:
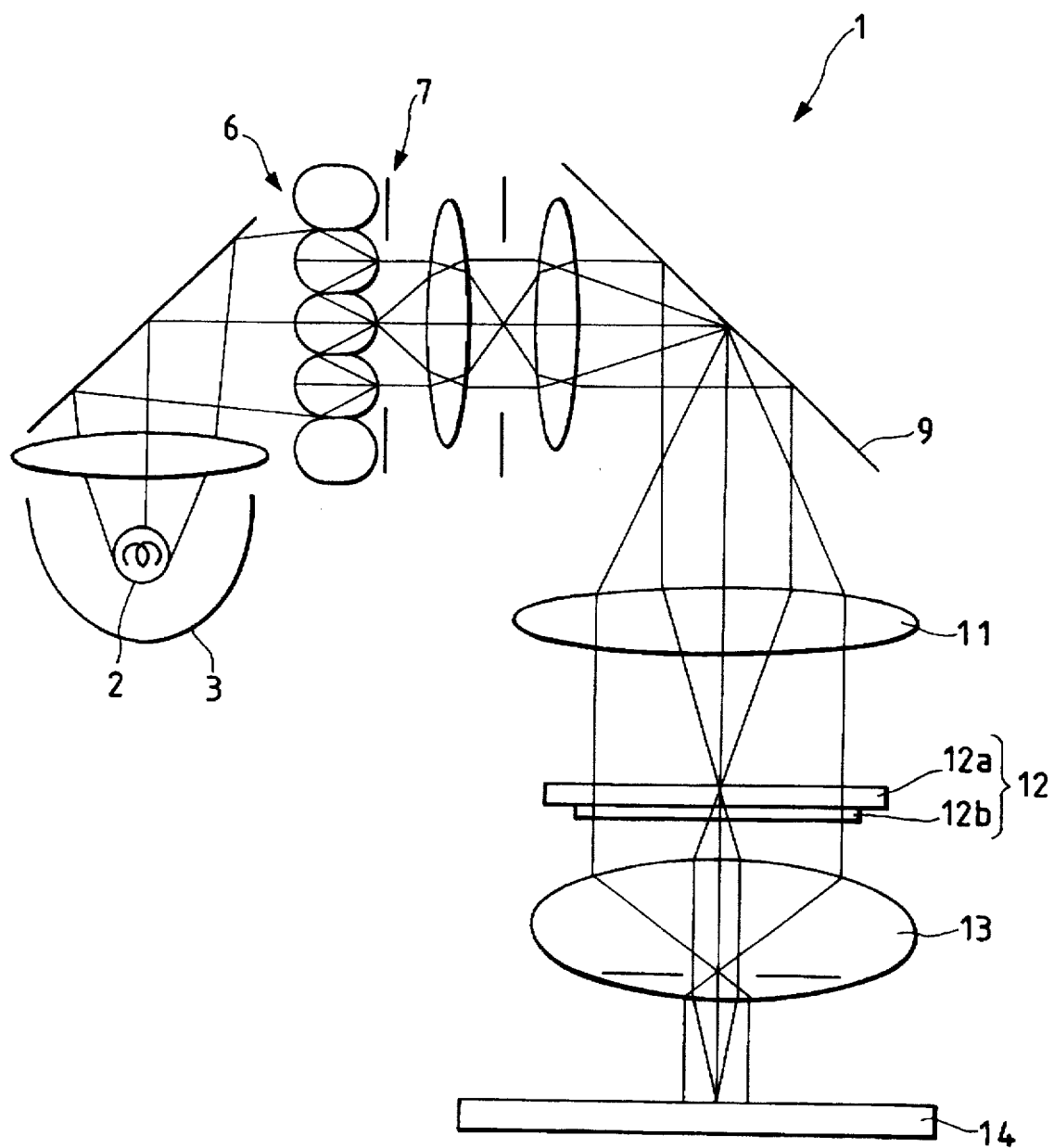
FIG. 53 is a schematic diagram showing a further embodiment of the aligner according to this invention.
Figure 54A:
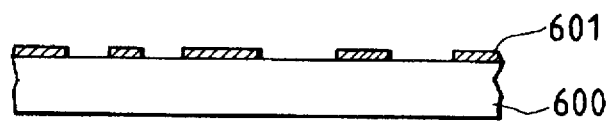
FIGS. 54(a to e) are process diagrams showing the process of manufacturing a conventional phase shift mask.
Figure 54B:
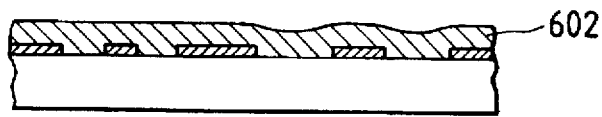
Figure 54C:
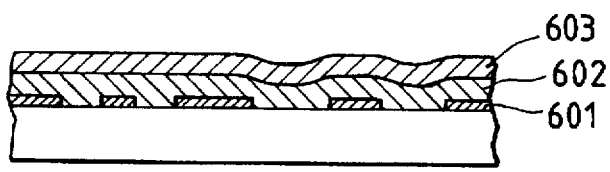
Figure 54D:
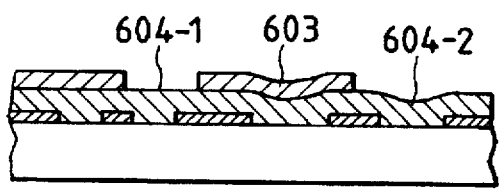
Figure 54E:
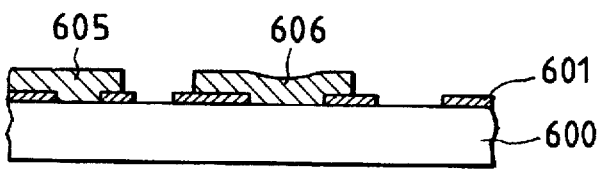
Figure 55A:
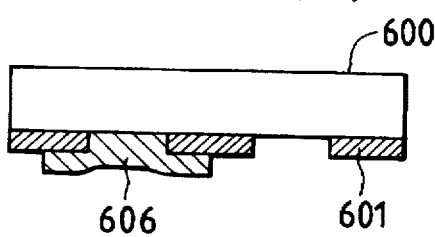
FIGS. 55(a) and 55(b) are diagrams comparing the structures of conventional phase shift masks.
Figure 55B:
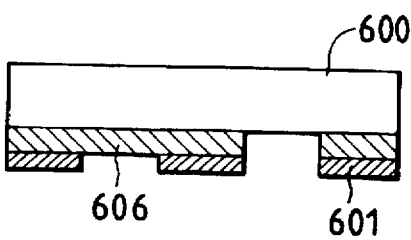

The aligner 1 is not limited to the configuration of the Embodiment 1 and may have a construction of FIG. 53. The aligner 1 of FIG. 53 differs from the Embodiment 1 in the arrangement of the exposure light source 2 and the lens system and, in other respects, is almost similar to that of the Embodiment 1.

The Embodiment 1 to 5 explained about the mask used for transferring a cyclically repeating pattern onto the semiconductor wafer. The invention is not limited to this application and may be applied to a mask used to transfer via hole patterns and general patterns having complex geometries onto the semiconductor wafer.

The preceding embodiments described the aligner of a so-called sequential motion type, which reduces and transfers the mask pattern onto a semiconductor wafer and then moves the semiconductor wafer a distance corresponding to the exposure field before stopping it and transferring the pattern. This invention is also applicable to an aligner which performs pattern transfer by synchronously scanning the mask and the semiconductor wafer according to the magnifying factor of the projection optical system. Although the foregoing description concerns a case where the present invention has been applied to the method of exposure and the aligner in the semiconductor integrated circuit device making—the field of application in which the invention originated—it is noted that the invention is not limited to that application and may be applied to other exposure methods and aligners used for forming patterns on liquid crystal substrates.

Representative advantages of this invention may be briefly summarized as follows.

(1) The method of exposure of this invention allows the height position of the specimen or mask to be moved, prior to the transfer of a specified pattern, in the optical axis direction according to the mask substrate thickness of the first component mask or second component mask, whichever is closer to the specimen, to correct a positional shift of the image forming plane to which the mask image is transferred. This can improve the pattern transfer precision.

(2) The method of making semiconductor integrated circuit devices according to this invention allows the image forming plane to be set at an optimal position according to whether a stacked-layer mask or an ordinary mask is used. This makes it possible to use both the stacked-layer mask and the ordinary mask in the exposure process in the semiconductor integrated circuit device making.

(3) The semiconductor integrated circuit device manufacturing method of this invention uses a projection lens system for exposure which is telecentric both on the mask surface side and on the semiconductor wafer—which is a specimen substrate—side. This prevents positional errors of the image forming plane from being produced by the in-plane variations of the mask pattern position and the mask substrate thickness, ensuring a good pattern transfer by using the stacked-layer mask.

(4) In the semiconductor integrated circuit device manufacturing method of this invention, the exposure process uses a stacked-layer mask that has a transmitted light reflection prevention film formed on at least one of the first and second component masks. This suppresses the interference of beams reflected by the first and second component masks, thereby reducing variations of luminance over the semiconductor wafer surface caused by the interference.

(5) This invention, which uses a phase shift mask made up of two easily manufactured masks, can realize a highly reliable exposure method. Conforming to the requirements of microfine pattern exposure in deep submicron areas, the invention offers a notable advantage of being able to realize a phase shift mask with little degradation of a projected image and an aligner that can mount the above-mentioned phase shift mask. To describe in more detail, by forming a two-layer phase shift mask by stacking a first component mask to give a phase shift to exposure light and a second component mask formed with a pattern of light-shielding areas and light-transmitting areas, it is possible to realize a mask structure that has so far been difficult to form, i.e., a structure in which a phase shift portion is held between the mask substrate and the light-shielding film and in which the edge of the phase shift portion is retracted from the opening of the light-shielding film. As a result, the phase errors not only in the pattern openings but also in the entire mask surface can be reduced, allowing the microfine patterns of the semiconductor integrated circuit devices to be formed with high precision.

(6) Because a spherical aberration correction means is provided to the aligner of this invention, it is possible to mount in one and the same aligner the phase shift mask made up of first and second component masks combined and the conventional single-layer mask and also to perform pattern transfer almost without changing the position of the semiconductor wafer in the optical axis direction. That is, this invention allows a combined use of the phase shift mask of this invention and the conventional single-layer mask in making the semiconductor integrated circuit device.

What is claimed is:

1. A method of making semiconductor devices, comprising the steps of:

(1) irradiating an ultraviolet exposure light beam, having a substantially constant wavelength and being at least partially coherent, onto a phase shifting mask where enlarged circuit patterns are formed, and (2) reducing and projecting a real image of the enlarged circuit patterns With the exposure light beam passing through the mask, by an optical reduction projection system having a predetermined numerical aperture, so that the real image can be formed onto a photosensitive resist film overlying a major surface of a wafer, whereby reduced circuit patterns corresponding to the enlarged circuit patterns of the mask are transferred onto the wafer, said mask comprising:

(a) a first transparent mask substrate having a light shielding region overlying a major surface thereof and first and second opening regions corresponding to the enlarged circuit patterns; and (b) a second transparent mask substrate having a major surface, superposed to the first transparent mask substrate such that the major surfaces of the first and second transparent mask substrates are in close proximity or in contact with each other, said second transparent mask substrate having a phase shifting groove region, which phase shifting groove region is opposed to the second opening region and extends widthwise over the periphery of the second opening region, for inverting a phase of an exposure light beam transmitted through the second opening region as compared with a phase of exposure light beam transmitted through the first opening region where the phase shifting groove region does not exist, and thereby clearly forming the real image of the enlarged circuit patterns onto the photosensitive resist film overlying the major surface of the wafer owing to interference between transmitted exposure light beams transmitted through the phase shifting mask.

2. A method of making semiconductor devices as recited in claim 1, wherein the phase shifting groove region is disposed so as to be opposed to substantially the whole of the second opening region.

3. A method of making semiconductor devices as recited in claim 1, wherein the first and second opening regions are disposed in the light shielding region.

4. A method of making semiconductor devices, comprising the steps of:

(1) irradiating an ultraviolet exposure light beam, having a substantially constant wavelength and being at least partially coherent, onto a phase shifting mask where enlarged circuit patterns are formed, and (2) reducing and projecting a real image of the enlarged circuit patterns with the exposure light beam passing through the mask, by an optical reduction projection system having a predetermined numerical aperture, so that the real image can be formed onto a photosensitive resist film overlying a major surface of a wafer, whereby reduced circuit patterns corresponding to the enlarged circuit patterns of the mask are transferred onto the wafer, said mask comprising:
- (a) a first transparent mask substrate having a light shielding region overlying a major surface thereof and a principal opening region corresponding to the enlarged circuit patterns, having a comparable dimension on the wafer with the wavelength of the exposure light, and at least one auxiliary opening region adjacent to the principal opening region and having a smaller dimension than that of the principal opening region; and
- (b) a second transparent mask substrate having a major surface, superposed to the first transparent mask substrate such that the major surfaces of the first and second transparent mask substrates are in close proximity or in contact with each other, said second transparent mask substrate having a phase shifting recess region, which phase shifting recess region is opposed to the principal opening region and extends over substantially the entire periphery of the principal opening region, for inverting a phase of an exposure light beam transmitted through the principal opening region as compared with a phase of the exposure light beam transmitted through the at least one auxiliary opening region, and thereby clearly forming the real image of the enlarged circuit patterns onto the photosensitive resist film overlying the major surface of the wafer owing to interference between transmitted exposure light beam transmitted through the phase shifting mask.

5. A method of making semiconductor devices as recited in claim 4, wherein the principal opening region and at least one auxiliary opening region are disposed in the light shielding region.

6. A method of making semiconductor devices as recited in claim 4, wherein said phase shifting recess region is a concave region.

7. A method of making semiconductor devices, comprising the steps of:
- (1) irradiating an ultraviolet exposure light beam, having a substantially constant wavelength and being at least partially coherent, onto a double substrate phase shifting mask where enlarged circuit patterns are formed, and
- (2) reducing and projecting a real image of the enlarged circuit patterns with the exposure light beam passing through the mask, by an optical reduction projection system having a predetermined numerical aperture, so that the real image can be formed onto a photosensitive resist film overlying a major surface of a wafer, whereby reduced circuit patterns corresponding to the enlarged circuit patterns of the mask are transferred onto the wafer, said double substrate phase shifting mask comprising:
- (a) a first transparent mask substrate having a light shielding region overlying a major surface thereof and first and second opening regions; and
- (b) a second transparent mask substrate having a major surface, superposed to the first transparent mask substrate such that the major surfaces of the first and second transparent mask substrates are in close proximity or in contact with each other, said second transparent mask substrate having a phase shifting recess region, which phase shifting recess region is opposed to the second opening region and extends widthwise over the periphery of the second opening region, for inverting a phase of an exposure light beam transmitted through the second opening region as compared with a phase of the exposure light beam transmitted through the first opening region where the phase shifting recess region does not exist, and thereby clearly forming the real image of the enlarged circuit patterns onto the photosensitive resist film overlying the major surface of the wafer owing to interference between transmitted exposure light beams transmitted through the phase shifting mask.

8. A method of making semiconductor devices as recited in claim 7, wherein the first and second opening regions are disposed in the light shielding region.

9. A method of making semiconductor devices as recited in claim 7, wherein at least one of the major surfaces of the first and second mask substrates is coated with an antireflection film.

10. A method of making semiconductor devices, comprising exposing steps of:
- (a) transferring a first circuit pattern of a double substrate mask, having first and second transparent substrates, onto a first photoresist film over a semiconductor wafer by optical reduction projection exposure; and
- (b) prior to or after step (a), transferring a second circuit pattern of a single substrate mask, having a third transparent substrate, onto a second photoresist film over the semiconductor wafer by optical reduction projection exposure, wherein a spherical aberration compensator is introduced into an optical path of an optical reduction projection system when the optical reduction projection exposure with the single substrate mask is performed.

11. A method of making semiconductor devices as recited in claim 10, wherein the spherical aberration compensator is a transparent plate.

12. A method of making semiconductor devices as recited in claim 11, wherein the double substrate mask is a phase shifting mask.

13. A method of making semiconductor devices as recited in claim 12, wherein the single substrate mask is a non-phase shifting mask.

14. A method of making semiconductor devices, comprising exposing steps of:
- (a) transferring a first circuit pattern of a first double substrate mask, having first and second transparent substrates, onto a first photoresist film over a semiconductor wafer by optical reduction projection exposure; and
- (b) prior to or after step (a), transferring a second circuit pattern of a second double substrate non-phase shifting mask, having third and fourth transparent substrates, onto a second photoresist film over the semiconductor wafer by optical reduction projection exposure.

15. A method of making semiconductor devices as recited in claim 14, wherein the third transparent substrate has a light shielding pattern and the fourth transparent substrate has neither light shielding patterns nor phase shifting patterns.

* * * * *